US012571887B2

(12) United States Patent
Tsukuda et al.

(10) Patent No.: US 12,571,887 B2
(45) Date of Patent: Mar. 10, 2026

(54) LIGHT DETECTION DEVICE, AND DISTANCE MEASURING SYSTEM

(71) Applicant: SONY SEMICONDUCTOR SOLUTIONS CORPORATION, Kanagawa (JP)

(72) Inventors: Yasunori Tsukuda, Kanagawa (JP); Yuki Morikawa, Kanagawa (JP); Kazutoshi Tomita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 325 days.

(21) Appl. No.: 18/262,917

(22) PCT Filed: Aug. 31, 2021

(86) PCT No.: PCT/JP2021/031825

§ 371 (c)(1),
(2) Date: Jul. 25, 2023

(87) PCT Pub. No.: WO2022/168356

PCT Pub. Date: Aug. 11, 2022

(65) Prior Publication Data

US 2024/0410991 A1 Dec. 12, 2024

(30) Foreign Application Priority Data

Feb. 2, 2021 (JP) ................................. 2021-014691

(51) Int. Cl.
G01S 7/4861 (2020.01)
G01S 7/4865 (2020.01)
(Continued)

(52) U.S. Cl.
CPC .......... G01S 7/4861 (2013.01); G01S 7/4865 (2013.01); H04N 25/773 (2023.01); H10F 30/225 (2025.01); H10F 77/959 (2025.01)

(58) Field of Classification Search
None
See application file for complete search history.

(56) References Cited

U.S. PATENT DOCUMENTS

2019/0302242 A1* 10/2019 Fenigstein ............ H10F 30/225
2022/0102404 A1* 3/2022 Lee ..................... H10F 39/8033

FOREIGN PATENT DOCUMENTS

JP 2018-179732 A 11/2018
JP 2019-075394 A 5/2019
(Continued)

OTHER PUBLICATIONS

International Search Report and Written Opinion of PCT Application No. PCT/JP2021/031825, issued on Nov. 22, 2021, 08 pages of ISRWO.

*Primary Examiner* — Benjamin P Sandvik
(74) *Attorney, Agent, or Firm* — CHIP LAW GROUP

(57) ABSTRACT

In a light detection device and a distance measuring system that obtain a distance from a round-trip time of light, a distance measurement error is reduced while a dead time is shortened. A logic gate outputs an output signal on the basis of a result of comparison between an input voltage depending on a voltage of one terminal of the cathode or the anode of an avalanche photodiode and a predetermined threshold voltage. A voltage limiting transistor limits the input voltage. A rapid charging transistor, in which a film thickness of a gate oxide film is less than that of the voltage limiting transistor, supplies a charging current to the avalanche photodiode in accordance with a predetermined pulse signal. A pulse generation unit generates the pulse signal on the (Continued)

basis of the output signal and supplies the pulse signal to the rapid charging transistor.

20 Claims, 38 Drawing Sheets

(51) Int. Cl.
*H04N 25/773* (2023.01)
*H10F 30/225* (2025.01)
*H10F 77/00* (2025.01)

(56) References Cited

FOREIGN PATENT DOCUMENTS

| JP | 2020-034521 A | 3/2020 |
| JP | 2020-148537 A | 9/2020 |
| JP | 2021-056016 A | 4/2021 |

* cited by examiner a b a b

*FIG. 37*

LIGHT DETECTION DEVICE, AND DISTANCE MEASURING SYSTEM

CROSS REFERENCE TO RELATED APPLICATIONS

This application is a U.S. National Phase of International Patent Application No. PCT/JP2021/031825 filed on Aug. 31, 2021, which claims priority benefit of Japanese Patent Application No. JP 2021-014691 filed in the Japan Patent Office on Feb. 2, 2021. Each of the above-referenced applications is hereby incorporated herein by reference in its entirety.

TECHNICAL FIELD

The present technology relates to a light detection device. Specifically, the present technology relates to a light detection device and a distance measuring system that use a light receiving element that performs avalanche multiplication.

BACKGROUND ART

In a light detection device, a distance measuring method called a time of flight (ToF) method is conventionally known. The ToF method is a method of measuring a distance by irradiating an object with irradiation light from an electronic device and obtaining a round-trip time until the irradiation light is reflected and returned to the electronic device. A single-photon avalanche diode (SPAD) is often used to detect reflected light with respect to irradiation light. For example, there has been proposed a distance measuring system in which a SPAD, two transistors connected together in series between the SPAD and a power supply voltage VDD, and an inverter that inverts a voltage of a connection node between the transistors are arranged for each pixel (See, for example, Patent Document 1.). A transistor on a power supply side supplies a charging current, and a transistor on a ground side limits the voltage of the connection node to a certain value or higher.

CITATION LIST

Patent Document

Patent Document 1: Japanese Patent Application Laid-Open No. 2020-34521

SUMMARY OF THE INVENTION

Problems to be Solved by the Invention

In the conventional technology described above, a voltage higher than the power supply voltage VDD is unnecessary due to arrangement of the transistor on the ground side that limits the voltage to the certain value or higher. However, in the distance measuring system described above, if the charging current is increased to shorten a dead time in which reaction to incidence of a photon cannot be performed, there is a possibility that a distance measurement error increases. This is because, as the charging current increases, an amount of increase in the voltage of the connection node depending on an on-resistance of the transistor on the ground side increases, and output of the inverter may fall before completion of charging. If the charging current is reduced, the distance measurement error can be reduced, but the dead time is lengthened. As described above, in the distance measuring system described above, it is difficult to achieve both shortening of the dead time and reduction of the distance measurement error.

The present technology has been made in view of such a situation, and an object of the present technology is to reduce a distance measurement error while shortening a dead time in a light detection device and a distance measuring system that obtain a distance from a round-trip time of light.

Solutions to Problems

The present technology has been made to solve the above-described problems, and a first aspect thereof is a light detection device including: an avalanche photodiode; a logic gate that outputs an output signal on the basis of a result of comparison between an input voltage depending on a voltage of one terminal of a cathode or an anode of the avalanche photodiode and a predetermined threshold voltage; a voltage limiting transistor that limits the input voltage; a rapid charging transistor in which a film thickness of a gate oxide film is less than that of the voltage limiting transistor and that supplies a charging current to the avalanche photodiode in accordance with a predetermined pulse signal; and a pulse generation unit that generates the pulse signal on the basis of the output signal and supplies the pulse signal to the rapid charging transistor. As a result, there is an effect that a dead time is shortened and a distance measurement error is reduced.

Furthermore, in the first aspect, the logic gate may include a pMOS transistor and an nMOS transistor connected together in series. As a result, there is an effect that the input voltage is inverted.

Furthermore, in the first aspect, in the rapid charging transistor, the film thickness of the gate oxide film may be less than those of the pMOS transistor and the nMOS transistor. As a result, there is an effect that a withstand voltage of the transistor in the logic gate is increased.

Furthermore, in the first aspect, in the rapid charging transistor and the pMOS transistor, the film thickness of the gate oxide film may be less than that of the nMOS transistor, the rapid charging transistor and the voltage limiting transistor may be connected together in series between a predetermined power supply voltage and an input terminal of the logic gate, a gate of the pMOS transistor may be connected to a connection node between the rapid charging transistor and the voltage limiting transistor, and a gate of the nMOS transistor may be connected to a node of the input voltage. As a result, there is an effect that a gate capacitance is reduced.

Furthermore, in the first aspect, a forced quenching transistor that stops avalanche multiplication in the avalanche photodiode in accordance with a predetermined control signal may be further included. As a result, there is an effect that avalanche multiplication of unnecessary light is avoided.

Furthermore, in the first aspect, a constant current source may be further included, in which the rapid charging transistor and the voltage limiting transistor may be connected together in series between a predetermined power supply voltage and an input terminal of the logic gate, and the constant current source may be connected in parallel with the rapid charging transistor between the power supply voltage and the voltage limiting transistor. As a result, there is an effect that erroneous detection is prevented.

Furthermore, in the first aspect, a resistance inserted between the one terminal and an input terminal of the logic gate may be further included. As a result, there is an effect that the dead time is shortened.

Furthermore, in the first aspect, the one terminal may be a cathode, and polarities of both the rapid charging transistor and the voltage limiting transistor may be P-type. As a result, there is an effect that the output signal is generated depending on variation of a cathode voltage.

Furthermore, in the first aspect, the one terminal may be an anode, and polarities of both the rapid charging transistor and the voltage limiting transistor may be N-type. As a result, there is an effect that the output signal is generated depending on variation of an anode voltage.

Furthermore, in the first aspect, the avalanche photodiode, the logic gate, the voltage limiting transistor, the rapid charging transistor, and the pulse generation unit may be arranged in each of a plurality of pixels arranged in a two-dimensional lattice. As a result, there is an effect that the output signal is generated for each pixel.

Furthermore, in the first aspect, the avalanche photodiode may be arranged on a predetermined light receiving substrate, and the logic gate, the voltage limiting transistor, the rapid charging transistor, and the pulse generation unit may be arranged on a predetermined logic substrate. As a result, there is an effect that sensitivity of the pixel is improved.

Furthermore, in the first aspect, the avalanche photodiode may be arranged on a predetermined light receiving substrate, a transistor may be arranged on a predetermined high withstand voltage substrate, the transistor having the gate oxide film thicker than that of the rapid charging transistor of a reading circuit in which the logic gate, the voltage limiting transistor, the rapid charging transistor, and the pulse generation unit are arranged, and the rest of the reading circuit may be arranged on a predetermined logic substrate. As a result, there is an effect that miniaturization of the pixel is facilitated.

Furthermore, in the first aspect, a constant current source, and a clamp voltage generation circuit that supplies a clamp voltage depending on a predetermined voltage to a gate of the voltage limiting transistor may be further included, in which the rapid charging transistor and the voltage limiting transistor may be connected together in series between the predetermined voltage and an input terminal of the logic gate, and the constant current source may be connected in parallel with the rapid charging transistor between the predetermined voltage and the voltage limiting transistor. As a result, there is an effect that an amplitude becomes constant.

Furthermore, in the first aspect, the clamp voltage generation circuit may include: an operational amplifier that outputs, as the clamp voltage, a voltage depending on a difference between a predetermined reference voltage and a fixed value of a voltage of a connection node between the constant current source and the voltage limiting transistor; and a feedback unit that generates the fixed value from the output clamp voltage and feeds back the fixed value to the operational amplifier. As a result, there is an effect that the clamp voltage is generated by a negative feedback circuit.

Furthermore, in the first aspect, the clamp voltage generation circuit may further include: a current source transistor; and a resistance element inserted between the current source transistor and the predetermined voltage, and a voltage of a connection node between the resistance element and the current source transistor may be input to the operational amplifier as the reference voltage. As a result, there is an effect that the reference voltage depending on a resistance value is generated.

Furthermore, in the first aspect, the clamp voltage generation circuit may further include: a pair of resistance elements; and a reference voltage generation unit that generates, as the reference voltage, a voltage depending on a ratio between resistivities of the respective pair of resistance elements. As a result, there is an effect that influence of a temperature characteristic of a resistance value R is canceled.

Furthermore, in the first aspect, the clamp voltage generation circuit may further include: an operational amplifier that outputs an output voltage depending on a difference between a predetermined reference voltage and a fixed value of a voltage of a connection node between the constant current source and the voltage limiting transistor; a feedback unit that generates the fixed value from the output voltage and feeds back the fixed value to the operational amplifier; and a first voltage buffer inserted between an output terminal of the operational amplifier and the gate of the voltage limiting transistor. As a result, there is an effect that deterioration of frequency characteristics of a loop is suppressed.

Furthermore, in the first aspect, the clamp voltage generation circuit may further include a second buffer inserted between the output terminal of the operational amplifier and the feedback unit. As a result, there is an effect that a gain error is corrected.

Furthermore, a second aspect of the present technology is a distance measuring system including: an avalanche photodiode; a logic gate that outputs an output signal on the basis of a result of comparison between an input voltage depending on a voltage of one terminal of a cathode or an anode of the avalanche photodiode and a predetermined threshold voltage; a voltage limiting transistor that limits the input voltage; a rapid charging transistor in which a film thickness of a gate oxide film is less than that of the voltage limiting transistor and that supplies a charging current to the avalanche photodiode in accordance with a predetermined pulse signal; a pulse generation unit that generates the pulse signal on the basis of the output signal and supplies the pulse signal to the rapid charging transistor; and a signal processing unit that processes the output signal. As a result, there is an effect that the dead time is shortened and the distance measurement error is reduced, in the distance measuring system.

Furthermore, a second aspect of the present technology is a light detection device including: an avalanche photodiode; a logic gate that is connected to a first terminal that is one terminal of a cathode or an anode of the avalanche photodiode and outputs an output signal; a pulse generation unit that generates a predetermined pulse signal on the basis of the output signal; a first transistor connected to the first terminal; and a second transistor in which a film thickness of a gate oxide film is less than that of the first transistor and a gate receives the pulse signal, in which the first transistor and the second transistor are connected together in series between the first terminal and a predetermined fixed potential. As a result, there is an effect that a dead time is shortened and a distance measurement error is reduced.

BRIEF DESCRIPTION OF DRAWINGS

FIG. 37 is a block diagram illustrating a schematic configuration example of a vehicle control system.

MODE FOR CARRYING OUT THE INVENTION

The following is a description of a mode for carrying out the present technology (the mode will be hereinafter referred to as the embodiment). The description will be made in the following order.

1. First embodiment (example in which thin film rapid charging transistor is arranged)
2. Second embodiment (example in which forced quenching transistor and thin film rapid charging transistor are arranged)
3. Third embodiment (example in which thin film rapid charging transistor is arranged and constant current source is connected in parallel)
4. Fourth embodiment (example in which thin film rapid charging transistor is arranged and resistance is inserted)
5. Fifth embodiment (example in which thin film rapid charging transistor is arranged and charging is ended after certain time from start of charging)

6. Sixth embodiment (example in which thin film rapid charging transistor is arranged and thin film and thick film transistors are arranged in inverter)

7. Seventh embodiment (example in which thin film rapid charging transistor is arranged and anode of SPAD is connected to inverter)

8. Eighth embodiment (example in which thin film rapid charging transistor is arranged on any of two substrates)

9. Ninth embodiment (example in which thin film rapid charging transistor is arranged on any of three substrates)

10. Tenth embodiment (example in which thin film rapid charging transistor is arranged and clamp voltage depending on power supply voltage is generated)

11. Application example to mobile body

1. First Embodiment

[Configuration Example of Distance Measuring System]

Figure 1:
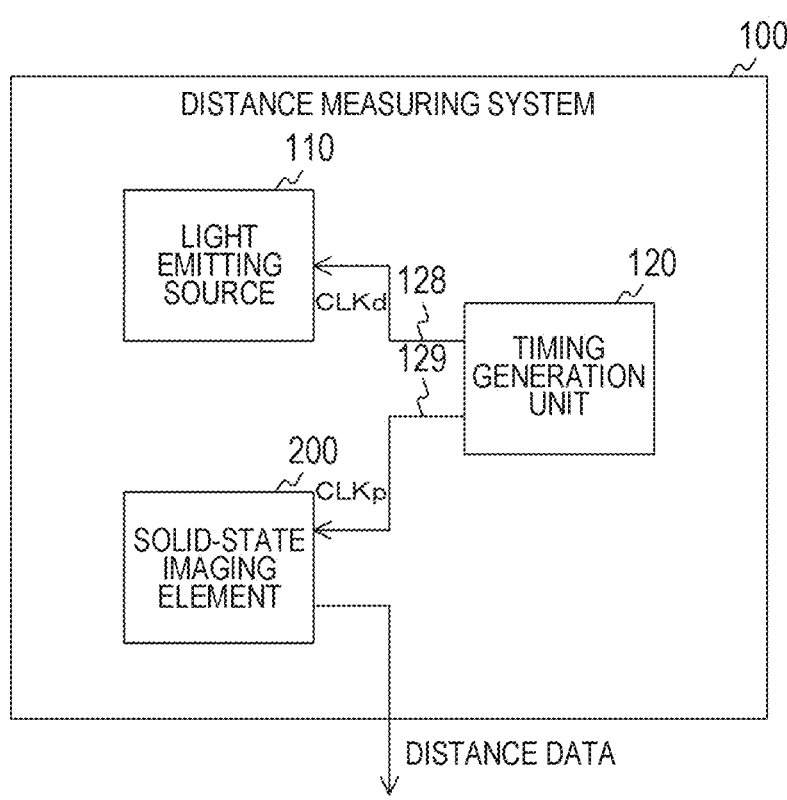
FIG. 1 is a block diagram illustrating a configuration example of a distance measuring system in a first embodiment of the present technology.

FIG. 1 is a block diagram illustrating a configuration example of a distance measuring system 100 in a first embodiment of the present technology. The distance measuring system 100 measures a distance to an object, and includes a light emitting source 110, a timing generation unit 120, and a solid-state imaging element 200. The distance measuring system 100 is mounted on a smartphone, a personal computer, an in-vehicle device, or the like, and is used to measure a distance.

The timing generation unit 120 generates a timing signal for causing the light emitting source 110 and the solid-state imaging element 200 to operate in synchronization. The timing generation unit 120 generates a clock signal CLKp having a predetermined frequency (100 megahertz to 10 gigahertz or the like) as a timing signal, and supplies the clock signal CLKp to the solid-state imaging element 200 via a signal line 129. Furthermore, the timing generation unit 120 supplies a clock signal CLKd generated in synchronization with the clock signal CLKp to the light emitting source 110 via a signal line 128. The frequency of the clock signal CLKd is 1/N (N is an integer) of the clock signal CLKp.

The light emitting source 110 supplies intermittent light as irradiation light in synchronization with the clock signal CLKd from the timing generation unit 120. For example, near-infrared light or the like is used as the irradiation light.

The solid-state imaging element 200 receives reflected light with respect to the irradiation light, and measures a round-trip time from a light emission timing indicated by the clock signal CLKd to a timing at which the reflected light is received. The solid-state imaging element 200 calculates the distance to the object from the round-trip time, and generates and outputs distance data indicating the distance. Note that the solid-state imaging element 200 is an example of a light detection device described in the claims.

[Configuration Example of Solid-State Imaging Element]

Figure 2:
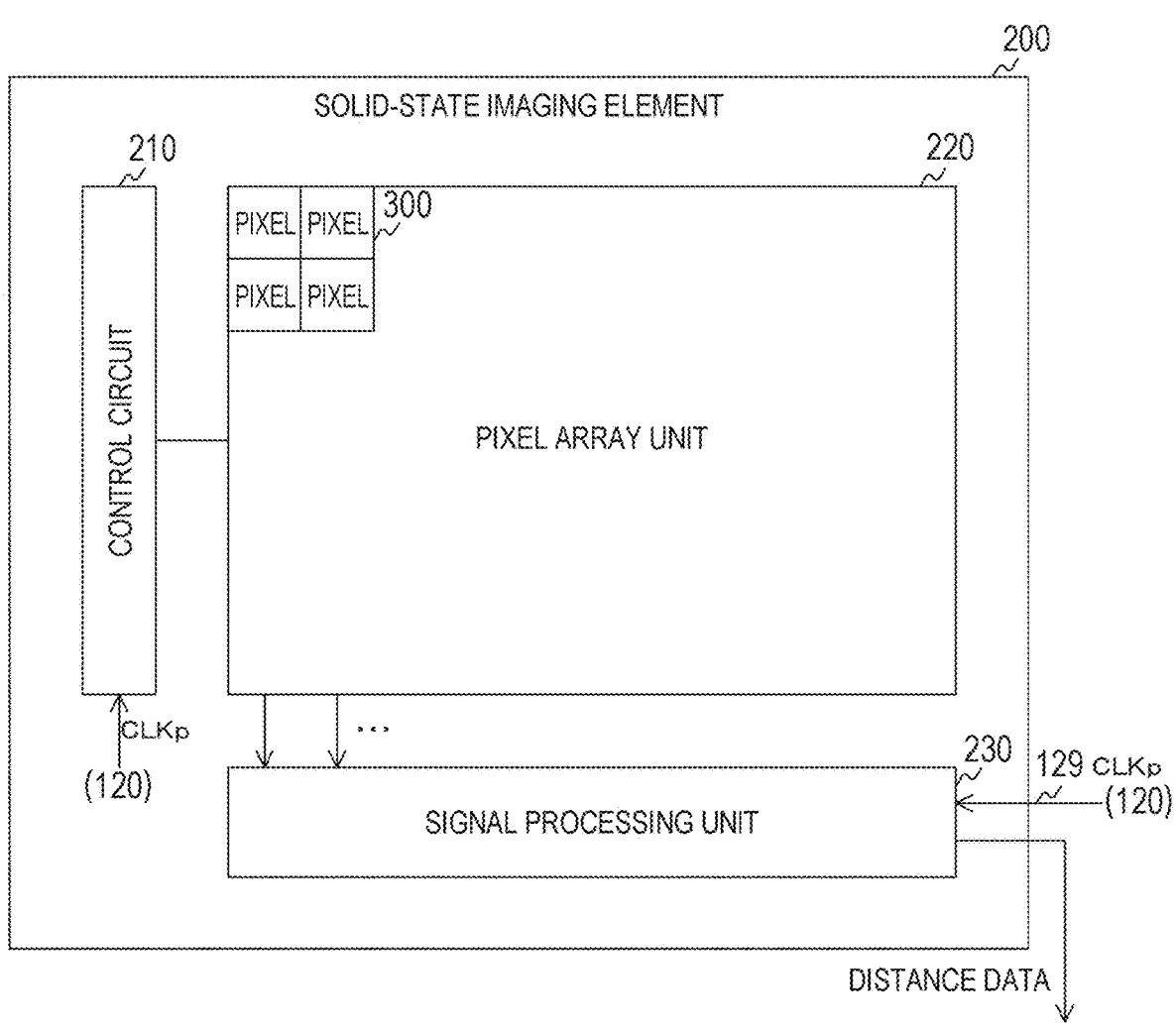
FIG. 2 is a block diagram illustrating a configuration example of a solid-state imaging element in the first embodiment of the present technology.

FIG. 2 is a block diagram illustrating a configuration example of the solid-state imaging element 200 in the first embodiment of the present technology. The solid-state imaging element 200 includes a control circuit 210, a pixel array unit 220, and a signal processing unit 230. A plurality of pixels 300 is arranged in a two-dimensional lattice in the pixel array unit 220. Furthermore, circuits and elements in the solid-state imaging element 200 are arranged on, for example, a single semiconductor substrate.

The control circuit 210 controls each of the pixels 300 in the pixel array unit 220 on the basis of the clock signal CLKp from the timing generation unit 120.

The signal processing unit 230 measures the round-trip time for each pixel 300 on the basis of a signal from the pixel 300 and the clock signal CLKp, and calculates the distance. The signal processing unit 230 generates distance data indicating the distance for each of pixel groups corresponding to a distance measurement point and outputs the distance data to the outside. Note that the signal processing unit 230 may be arranged inside the pixel array unit 220 or may be arranged outside the pixel array unit 220.

[Configuration Example of Pixel]

Figure 3:
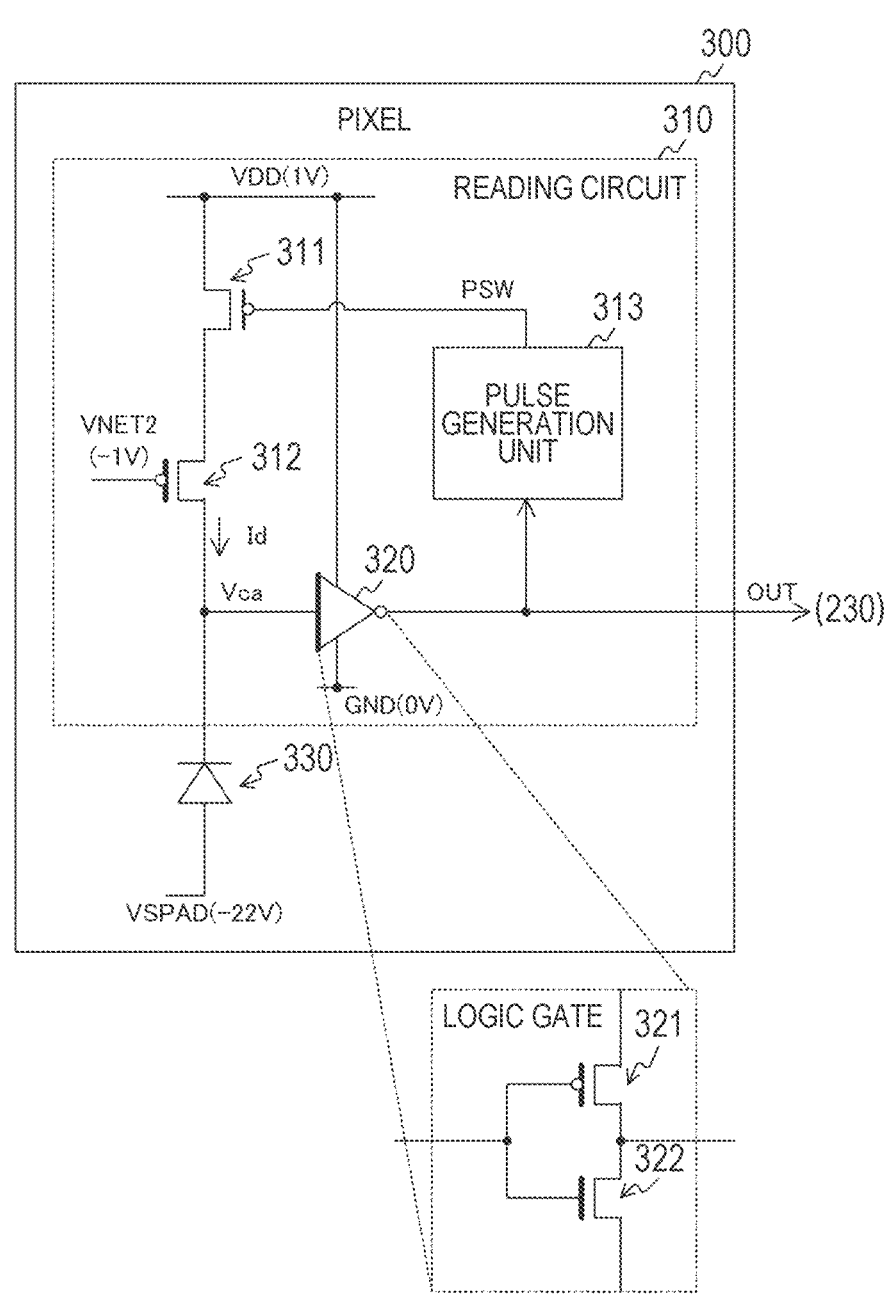
FIG. 3 is a circuit diagram illustrating a configuration example of a pixel in the first embodiment of the present technology.

FIG. 3 is a circuit diagram illustrating a configuration example of the pixel 300 in the first embodiment of the present technology. The pixel 300 includes a reading circuit 310 and a SPAD 330. Furthermore, the reading circuit 310 includes a rapid charging transistor 311, a voltage limiting transistor 312, an inverter 320, and a pulse generation unit 313. As the rapid charging transistor 311 and the voltage limiting transistor 312, for example, p-channel metal oxide semiconductor (pMOS) transistors are used.

The SPAD 330 generates charges (electrons and the like) by photoelectric conversion with respect to incident light, performs avalanche multiplication, and then outputs the charges from the cathode. A reverse bias having an absolute value larger than a breakdown voltage at the time of avalanche breakdown is applied between the anode and the cathode of the SPAD 330. A difference between the reverse bias and the breakdown voltage is called an excess bias. In a case where the voltage limiting transistor 312 is not arranged, when a photon is incident, a cathode voltage Vca of the SPAD 330 drops by the excess bias. Note that the SPAD 330 is an example of an avalanche photodiode described in the claims.

The rapid charging transistor 311 and the voltage limiting transistor 312 are connected together in series between the power supply voltage VDD and the cathode of the SPAD 330 with the rapid charging transistor 311 as a power supply side. Furthermore, a reverse bias voltage VSPAD is applied to the anode of the SPAD 330. A connection node between the voltage limiting transistor 312 and the SPAD 330 is connected to the input terminal of the inverter 320. Note that the rapid charging transistor 311 is an example of a second transistor described in the claims. The voltage limiting transistor 312 is an example of a first transistor described in the claims.

The rapid charging transistor 311 supplies a charging current Id to the SPAD 330 in accordance with a pulse signal PSW from the pulse generation unit 313. Furthermore, a film thickness of a gate oxide film of the rapid charging transistor 311 is less than those of the voltage limiting transistor 312 and transistors in the inverter 320. In the figure, a thick line means that the gate oxide film is relatively thick.

The voltage limiting transistor 312 limits an input voltage (in other words, the cathode voltage Vca) of the inverter 320 to a predetermined lower limit value or higher. A predetermined bias voltage VNET2 is supplied to the gate of the voltage limiting transistor 312. For example, a value satisfying the following formula is set for the bias voltage VNET2.

$$VDD-(VNET2-V_{thp}) < (\text{Thin film withstand voltage})$$

In the above formula, $V_{thp}$ is a threshold voltage of the voltage limiting transistor 312. Furthermore, the thin film withstand voltage indicates a withstand voltage between the source and the drain of the rapid charging transistor 311. Here, the withstand voltage is a voltage when a punch-through phenomenon occurs.

For example, 1 volt (V) is set for the power supply voltage VDD, and −1 volt (V) is set for the bias voltage VNET2. Furthermore, −22 volt (V) is set for the reverse bias voltage VSPAD, and 0 volt (V) is set for a ground voltage GND.

When the cathode voltage Vca decreases depending on incidence of a photon, a voltage of the source of the voltage limiting transistor 312 also decreases depending on the cathode voltage Vca. Then, when a voltage between the gate and the source is less than or equal to the threshold voltage $V_{thp}$, the voltage limiting transistor 312 transitions to an off state. For this reason, the cathode voltage Vca does not decrease to a value less than a value when the voltage limiting transistor 312 is turned off. When the value is the lower limit value, the cathode voltage Vca is limited to the lower limit value or higher by the voltage limiting transistor 312.

The inverter 320 outputs an output signal OUT to the pulse generation unit 313 and the signal processing unit 230 on the basis of a result of comparison between the input voltage (cathode voltage Vca) and a predetermined threshold voltage. In a case where the cathode voltage Vca is less than or equal to the threshold voltage, the output signal OUT at a high level is output, and in a case where the cathode voltage Vca is higher than the threshold voltage, the output signal OUT at a low level is output. Note that an amplifier can also be provided instead of the inverter 320. The inverter 320 is an example of a logic gate described in the claims.

Furthermore, the inverter 320 includes a pMOS transistor 321 and an n-channel MOS (nMOS) transistor 322 connected together in series between the power supply voltage VDD and the ground voltage GND. The gates of the pMOS transistor 321 and the nMOS transistor 322 correspond to the input terminal of the inverter 320, and a connection node between the transistors corresponds to the output terminal of the inverter 320. Furthermore, gate oxide films of the pMOS transistor 321 and the nMOS transistor 322 are thicker than that of the rapid charging transistor 311.

The pulse generation unit 313 generates the pulse signal PSW on the basis of the output signal OUT and supplies the pulse signal PSW to the gate of the rapid charging transistor. The pulse generation unit 313 changes the pulse signal PSW from the high level to the low level when the cathode voltage Vca reaches the lower limit value. For example, in a case where the cathode voltage Vca decreases to the lower limit value when a delay time dt1 elapses after the output signal OUT rises, the pulse generation unit 313 sets the pulse signal PSW to the low level at that time. As a result, charging by the rapid charging transistor 311 is started.

After a start of charging, when the cathode voltage Vca reaches a voltage at the time of completion of charging, the pulse generation unit 313 changes the pulse signal PSW from the low level to the high level. For example, in a case where charging is completed when a delay time dt2 elapses after the output signal OUT falls, the pulse generation unit 313 sets the pulse signal PSW to the high level at that time.

With a circuit configuration illustrated in the figure, when a photon is incident on the pixel 300, the SPAD 330 performs avalanche multiplication on charges obtained by photoelectrically converting the photon, and generates a photocurrent. The cathode voltage Vca of the SPAD 330 drops depending on the photocurrent. Then, when the cathode voltage Vca is less than or equal to the threshold voltage, the output signal OUT of the inverter 320 is inverted. As a result, the incidence of the photon is detected.

Furthermore, the voltage limiting transistor 312 limits the input voltage (cathode voltage Vca) of the inverter 320 to the predetermined lower limit value or higher. When the cathode voltage Vca decreases to the lower limit value, the pulse generation unit 313 sets the pulse signal PSW to the low level and causes the rapid charging transistor 311 to start charging. Then, when the charging is completed, the pulse generation unit 313 sets the pulse signal PSW to the high level and causes the charging to be ended.

Figure 4:
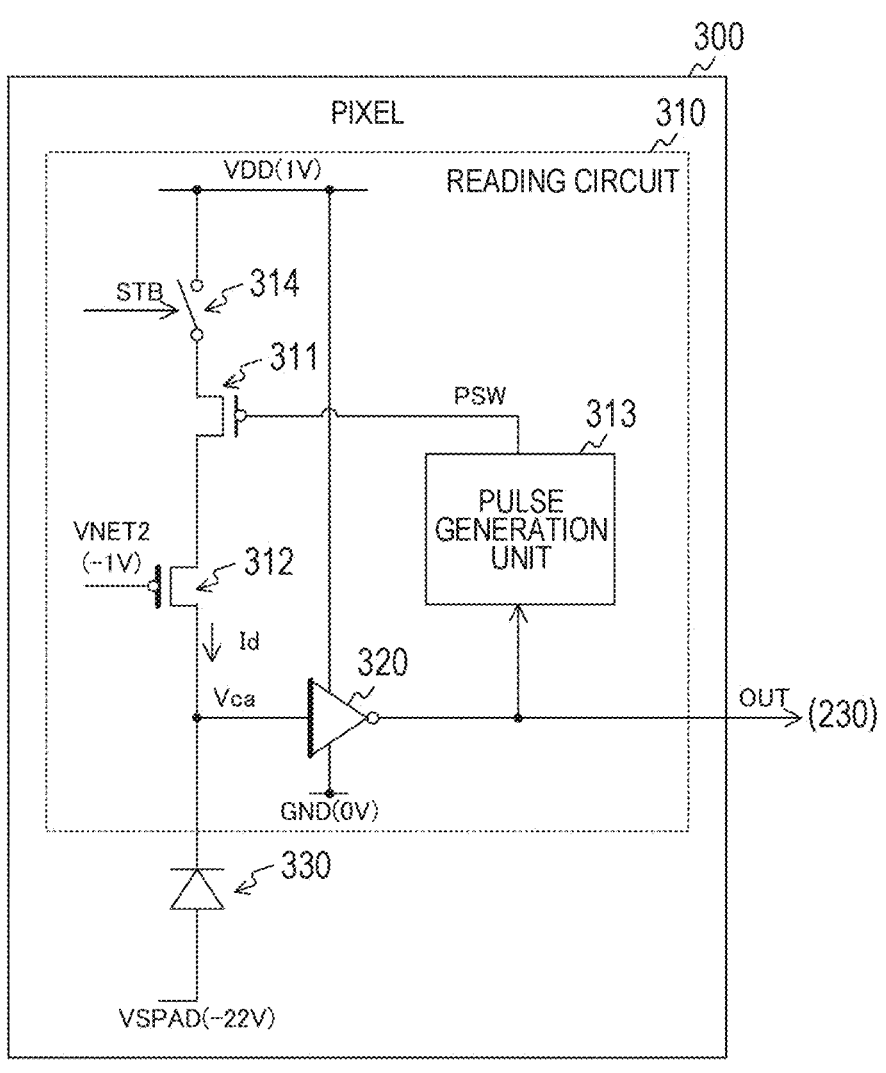
FIG. 4 is a circuit diagram illustrating a configuration example of a pixel to which a standby switch is added in the first embodiment of the present technology.

Note that, as illustrated in FIG. 4, a standby switch 314 that stops a function of the pixel 300 can also be added between the source of the rapid charging transistor 311 and the power supply voltage VDD. The standby switch 314 can also be inserted between the drain of the rapid charging transistor 311 and the voltage limiting transistor 312. The standby switch 314 is opened and closed in accordance with a control signal STB from the control circuit 210. In a test before shipment or the like, the standby switches 314 of all the pixels can be opened to stop all the pixels as necessary.

Figure 5:
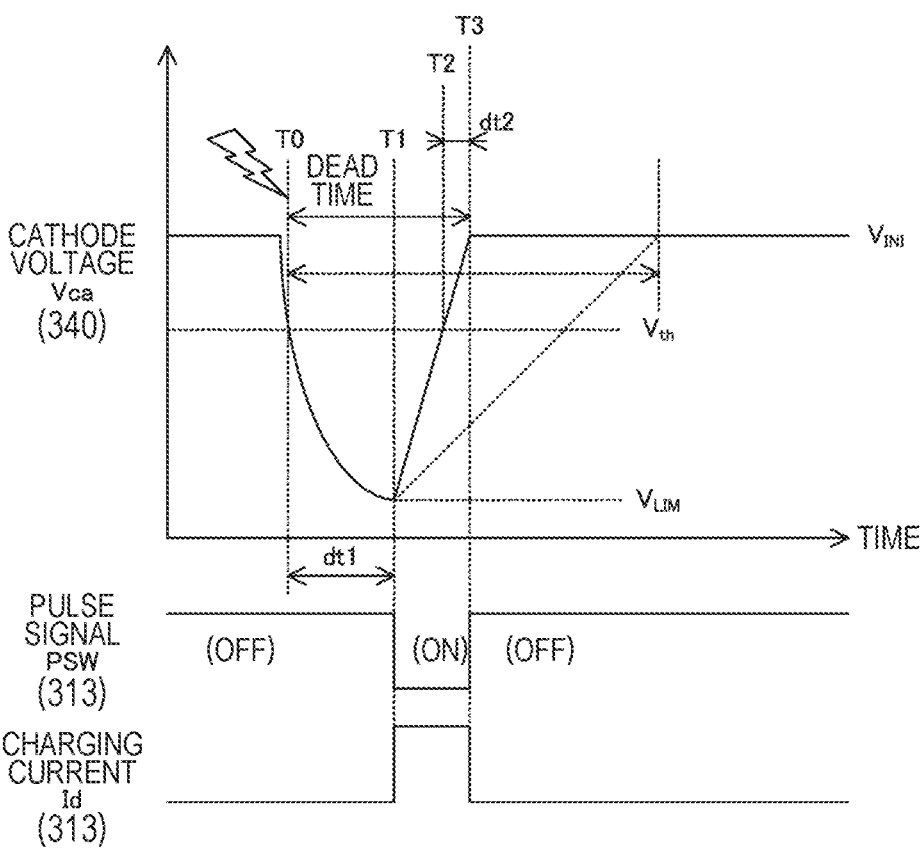
FIG. 5 is a timing chart illustrating an example of operation of the pixel in the first embodiment of the present technology.

FIG. 5 is a timing chart illustrating an example of operation of the pixel 300 in the first embodiment of the present technology. When a photon is incident immediately before timing T0, the cathode voltage Vca starts to drop from a voltage $V_{INI}$ in an initial state and becomes less than or equal to a threshold voltage Vth of the inverter 320 at timing T0. At this time, the output signal OUT is inverted from the low level to the high level.

The pulse generation unit 313 changes the pulse signal PSW from the high level to the low level at timing T1 when the delay time dt1 elapses from timing T0 when the output signal OUT rises. The delay time dt1 is set to a value at which the cathode voltage Vca reaches a lower limit value $V_{LIM}$ when the time elapses. Due to the fall of the pulse signal PSW, the rapid charging transistor 311 transitions from an off state to an on state, and starts supplying the charging current Id.

The cathode voltage Vca increases due to charging, and becomes higher than the threshold voltage Vth of the inverter 320 at timing T2. At this time, the output signal OUT is inverted from the high level to the low level.

The pulse generation unit 313 changes the pulse signal PSW from the low level to the high level at timing T3 at which the delay time dt2 elapses from timing T2 at which the output signal OUT falls. The delay time dt2 is set to a value at which charging is completed (in other words, the cathode voltage Vca is $V_{INI}$) when the time elapses. A period from timing T0 to T3 is a period in which the pixel 300 cannot react to incidence of a photon, and the period is referred to as a dead time.

Here, a configuration in which the film thickness of the gate oxide film of the rapid charging transistor 311 is made equivalent to that of the voltage limiting transistor 312 is assumed as a first comparative example. In the first comparative example, a source voltage of the voltage limiting transistor 312 decreases due to an increase in an on-resistance of the rapid charging transistor 311, and current driving force decreases. As a result, a charging speed is decreased, and the dead time is lengthened. A dotted oblique line in the figure indicates a locus of the cathode voltage Vca of the comparative example.

On the other hand, in FIG. 3, since the gate oxide film of the rapid charging transistor 311 is thinned, the on-resistance of the rapid charging transistor 311 can be reduced as compared with the first comparative example, and the source voltage of the voltage limiting transistor 312 can be increased to about the same level as the power supply voltage VDD. As a result, the current driving force is improved as compared with the first comparative example, the charging speed is increased, and the dead time can be shortened. Furthermore, a mounting area of the reading circuit 310 can be made smaller than that of the first comparative example by thinning of the rapid charging transistor 311.

Next, as described in Patent Document 1, a second comparative example is assumed of a configuration in which a charging transistor and a voltage limiting transistor are connected together in series between the power supply voltage VDD and the SPAD 330, and a connection node between these transistors is connected to the input terminal of the inverter 320. In the second comparative example (Patent Document 1), the pulse generation unit 313 is not provided, and a constant voltage is applied to the gate of the charging transistor.

In the second comparative example, when a charging current is increased for shortening the dead time, there is a possibility that a distance measurement error increases. This is because, as the charging current increases, an amount of increase in the voltage of the connection node (the input voltage of the inverter 320) depending on an on-resistance of the voltage limiting transistor increases, and the output of the inverter 320 may fall before completion of charging.

On the other hand, in FIG. 3, since the input terminal of the inverter 320 is connected to the cathode of the SPAD 330, the input voltage (cathode voltage Vca) of the inverter 320 does not increase due to an on-resistance of the voltage limiting transistor 312 even if the charging current is increased. For this reason, it is possible to prevent erroneous detection due to an increase in the input voltage.

Furthermore, the pulse generation unit 313 starts rapid charging after the delay time dt1 elapses from the fall of the pulse signal PSW, and ends the rapid charging after completion of charging. As a result, a rate of drop of the cathode voltage Vca can be increased and an amount of drop of the cathode voltage Vca can be increased as compared with the second comparative example in which the charging current always flows. By increasing the rate of drop of the cathode voltage Vca, the dead time can be shortened, and by increasing the amount of drop of the cathode voltage Vca, erroneous detection of incidence of a photon can be prevented. As a result, both the shortening of the dead time and the reduction of the distance measurement error can be achieved.

[Configuration Example of Signal Processing Unit]

Figure 6:
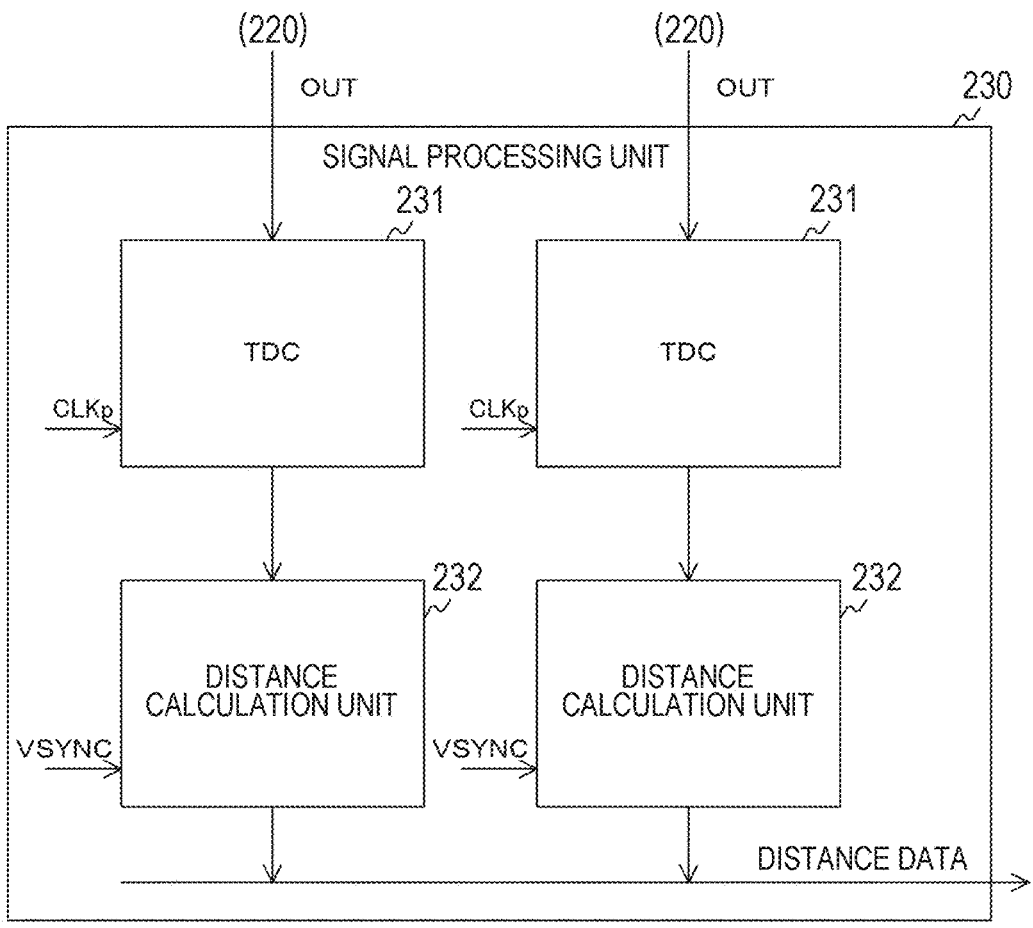
FIG. 6 is a block diagram illustrating a configuration example of a signal processing unit in the first embodiment of the present technology.

FIG. 6 is a block diagram illustrating a configuration example of the signal processing unit 230 in the first embodiment of the present technology. The signal processing unit 230 includes a time-to-digital converter (TDC) 231 and a distance calculation unit 232 for each column or for each predetermined number of pixels.

The TDC 231 measures a time from a light emission timing indicated by the clock signal CLKp to the rise of the output signal OUT from the corresponding column (that is, a light reception timing). The TDC 231 supplies a digital signal indicating a measured time to the distance calculation unit 232.

The distance calculation unit 232 accumulates a histogram for each of TDC results. The distance calculation unit 232 outputs a histogram measured by the TDC 231 within each of cycles of a frequency lower than the clock signal CLKp. Note that the distance calculation unit 232 may calculate a distance D by using the following formula and output distance data indicating the distance D.

$$D = (c \times dt0)/2$$

In the above formula, c is a speed of light, and the unit is meter per second (m/s). Furthermore, the unit of the distance D is, for example, meter (m), and the unit of a round-trip time dt0 is, for example, second(s).

Note that the signal processing unit 230 can also be arranged in the pixel array unit 220. In this case, the TDC 231 is arranged below each of the predetermined number (for example, four) of the pixels 300.

[Pixel Operation Example]

Figure 7:
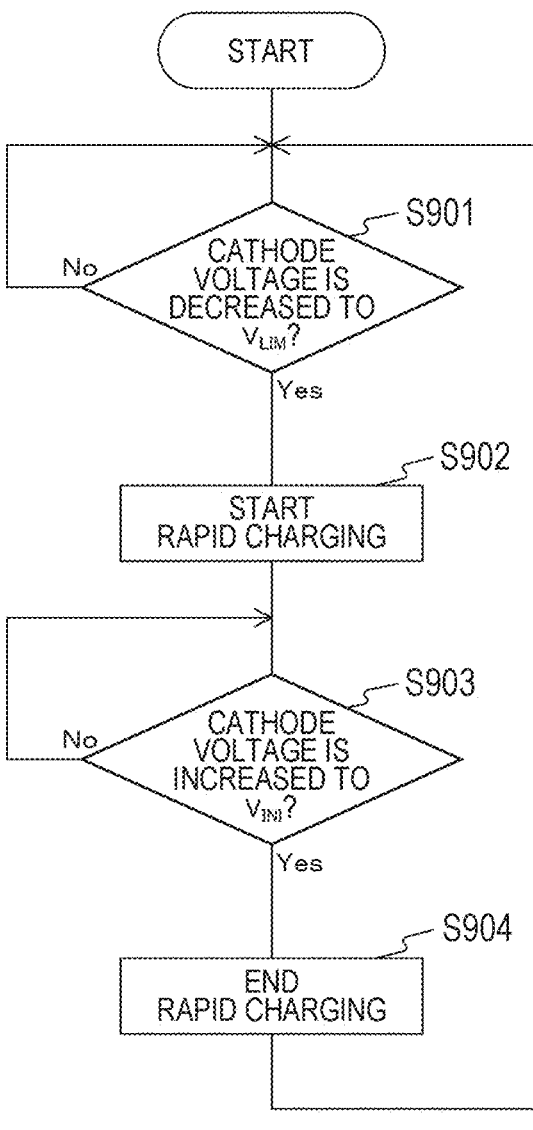
FIG. 7 is a flowchart illustrating an example of the operation of the pixel in the first embodiment of the present technology.

FIG. 7 is a flowchart illustrating an example of the operation of the pixel 300 in the first embodiment of the present technology. The operation is started when the distance measuring system 100 performs distance measurement. The pulse generation unit 313 in the pixel 300 determines whether or not the cathode voltage Vca is decreased to the lower limit value $V_{LIM}$ on the basis of the output signal OUT (step S901). For example, when the delay time dt1 elapses after the output signal OUT rises, it is determined that the cathode voltage Vca is decreased to the lower limit value $V_{LIM}$.

In a case where the cathode voltage Vca has not decreased to the lower limit value $V_{LIM}$ (step S901: No), the pulse generation unit 313 repeats step S901 and the subsequent steps. On the other hand, in a case where the cathode voltage Vca is decreased to the lower limit value $V_{LIM}$ (step S901: Yes), the pulse generation unit 313 turns on the rapid charging transistor 311 by a pulse signal, and the rapid charging transistor 311 starts rapid charging (step S902).

Then, the pulse generation unit 313 determines whether or not the cathode voltage Vca is increased (in other words, charging is completed) to the voltage $V_{INI}$ on the basis of the output signal OUT (step S903). For example, it is determined that the charging is completed when the delay time dt2 elapses after the output signal OUT falls.

In a case where the cathode voltage Vca is not increased to $V_{INI}$ (step S903: No), the pulse generation unit 313 repeats step S901 and the subsequent steps. On the other hand, in a case where the cathode voltage Vca is increased to $V_{INI}$ (step S903: Yes), the pulse generation unit 313 turns off the rapid charging transistor 311 by the pulse signal, and the rapid charging transistor 311 ends the rapid charging (step S904). After step S904, the pixel 300 repeats step S901 and the subsequent steps.

As described above, according to the first embodiment of the present technology, the pulse generation unit 313 generates the pulse signal PSW on the basis of the output signal OUT, and starts and ends the rapid charging. For this reason, as compared with the second comparative example in which the charging current always flows, the rate of drop of the cathode voltage Vca can be increased, and the amount of drop of the cathode voltage Vca can be increased. As a result, both the shortening of the dead time and the reduction of the distance measurement error can be achieved.

2. Second Embodiment

In the first embodiment described above, the pixel 300 detects incident light by avalanche multiplication, but it is difficult to suppress avalanche multiplication due to unnecessary light. A solid-state imaging element 200 of a second embodiment is different from that of the first embodiment in that avalanche multiplication is forcibly stopped (in other words, quenching is performed).

Figure 8:
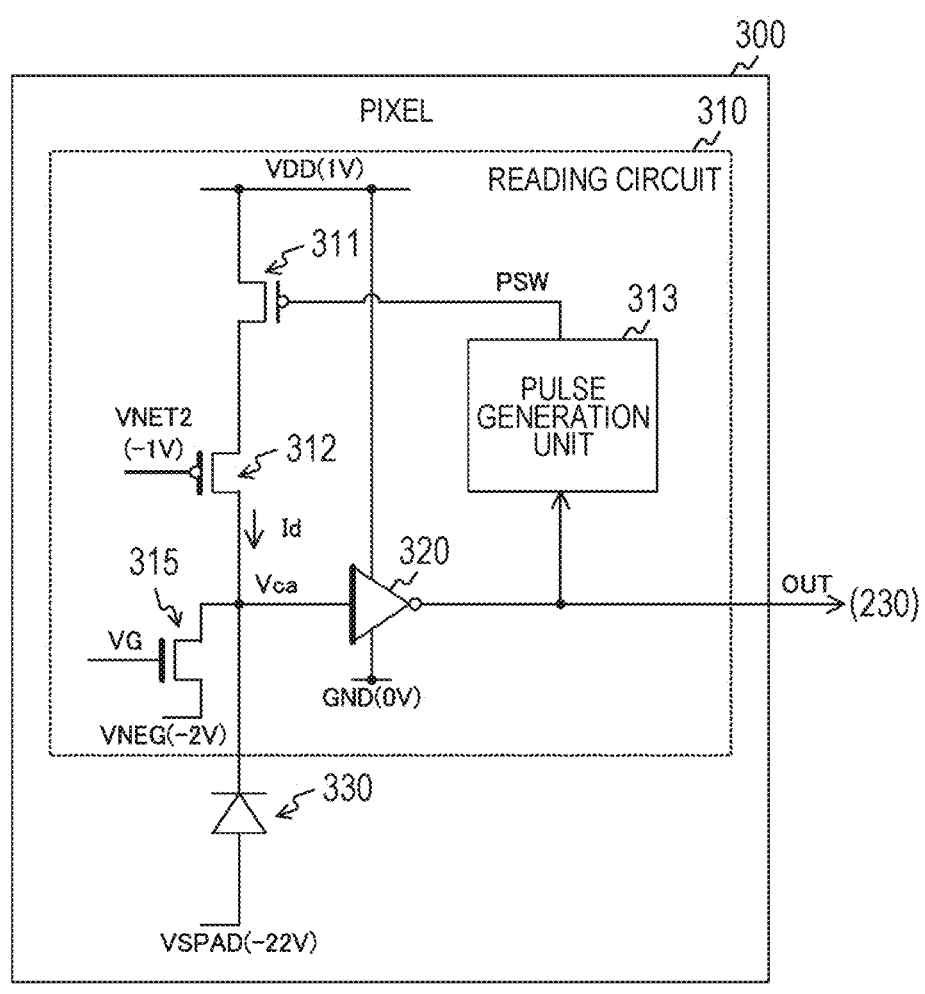
FIG. 8 is a circuit diagram illustrating a configuration example of a pixel in a second embodiment of the present technology.

FIG. 8 is a circuit diagram illustrating a configuration example of a pixel 300 in the second embodiment of the present technology. The pixel 300 of the second embodiment is different from that of the first embodiment in that a forced quenching transistor 315 is further provided in a reading circuit 310. As the forced quenching transistor 315, for example, an nMOS transistor having a gate oxide film thicker than that of the rapid charging transistor 311 is used.

The forced quenching transistor 315 stops avalanche multiplication of the SPAD 330 in accordance with a control signal VG. The drain of the forced quenching transistor 315 is connected to the input terminal of the inverter 320, and a bias voltage VNEG is applied to the source. Furthermore, the control signal VG is input to the gate of the forced quenching transistor 315. For example, −2 volt (V) is set for the bias voltage VNEG. The control signal VG is generated by, for example, the control circuit 210.

Figure 9:
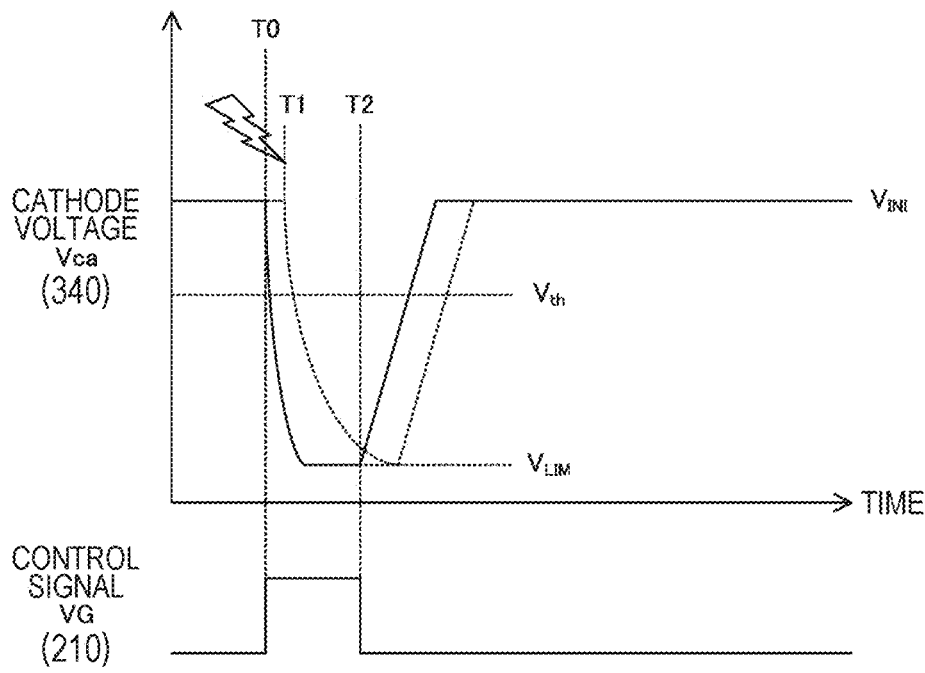
FIG. 9 is a timing chart illustrating an example of operation of the pixel in the second embodiment of the present technology.

FIG. 9 is a timing chart illustrating an example of operation of the pixel 300 in the second embodiment of the present technology.

For example, it is assumed that unnecessary light other than reflected light of a detection target, such as leakage light from the light emitting source 110, is generated within a period of timing T0 to T2. In this case, the control circuit 210 sets the control signal VG to the high level within the period. As a result, the cathode voltage Vca drops to the lower limit value $V_{LIM}$ regardless of the presence or absence of incidence of a photon, and avalanche multiplication stops. That is, quenching is forcibly performed.

On the other hand, in the first embodiment in which the forced quenching transistor 315 is not arranged, when unnecessary light is incident at timing T1 in the period of timing T0 to T2, the cathode voltage Vca drops due to avalanche multiplication caused by the unnecessary light. A dotted curve in the figure indicates a locus of the cathode voltage Vca of the first embodiment.

On the other hand, in a case where the forced quenching transistor 315 is provided, as illustrated in the figure, the pixel 300 is disabled at the time of incidence of unnecessary light by the control signal VG, and avalanche multiplication due to unnecessary light can be avoided. As a result, a light emission interval of the irradiation light from the light emitting source 110 can be shortened, and a shorter distance can be measured.

As described above, according to the second embodiment of the present technology, since the forced quenching transistor 315 forcibly performs quenching, avalanche multiplication due to unnecessary light can be avoided.

3. Third Embodiment

In the first embodiment described above, the rapid charging transistor 311 is shifted to the on state to perform the rapid charging, but when the rapid charging transistor 311 is turned off and the rapid charging is completed, the cathode of the SPAD 330 is in a high impedance state. When the cathode is in the high impedance state, the input terminal of the inverter 320 connected to the cathode becomes floating. As a result, even if avalanche multiplication does not occur, the cathode voltage Vca drops due to a leakage current of elements in the inverter 320 and erroneous detection may occur. A solid-state imaging element 200 of a third embodiment is different from that of the first embodiment in that the high impedance state is avoided by connection of a constant current source.

Figure 10:
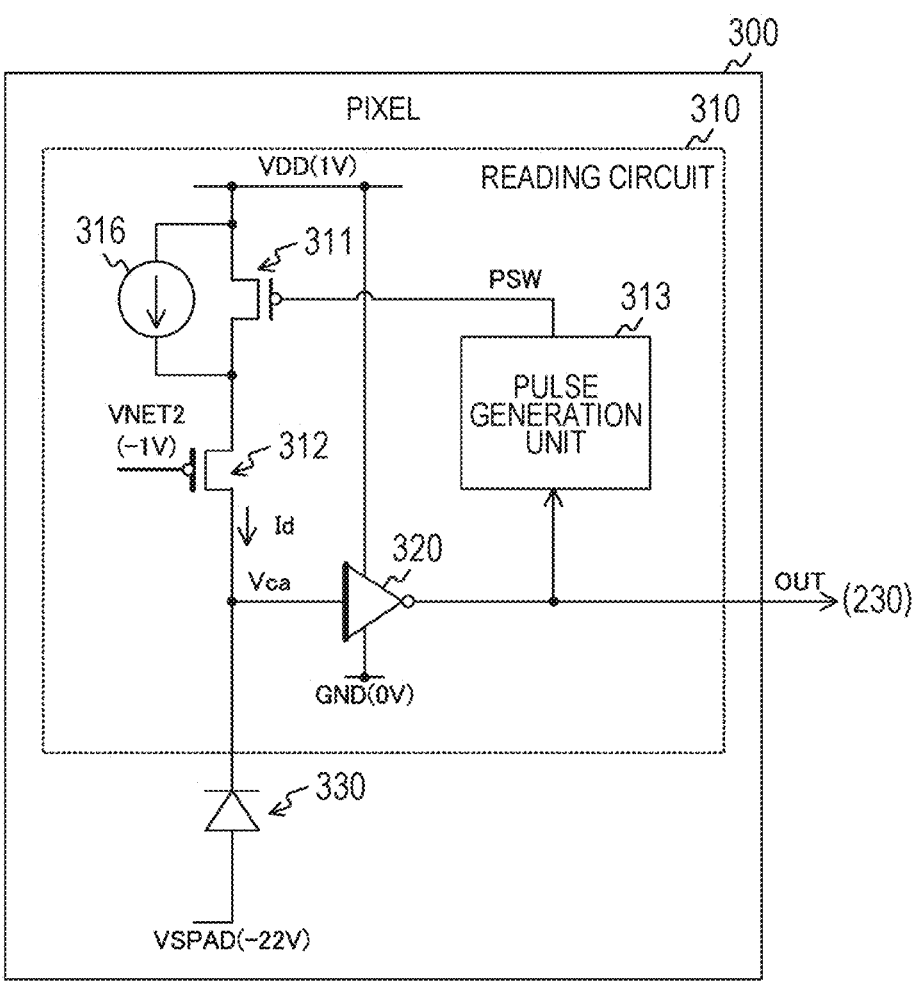
FIG. 10 is a circuit diagram illustrating a configuration example of a pixel in a third embodiment of the present technology.

FIG. 10 is a circuit diagram illustrating a configuration example of a pixel 300 in the third embodiment of the present technology. The pixel 300 of the third embodiment is different from that of the first embodiment in that a constant current source 316 is further provided in a reading circuit 310.

The constant current source 316 is connected in parallel with the rapid charging transistor 311 between the power supply voltage VDD and the voltage limiting transistor 312. With the constant current source 316, it is possible to avoid that the cathode of the SPAD 330 is in the high impedance state. Furthermore, a value of a constant current supplied by the constant current source 316 is set to a small value that does not inhibit quenching. As a result, it is possible to suppress a decrease in distance measurement accuracy due to influence of the constant current.

Note that, the second embodiment can be applied to the third embodiment.

As described above, according to the third embodiment of the present technology, since the constant current source 316 is connected in parallel with the rapid charging transistor 311, it is possible to avoid that the cathode of the SPAD 330 is in the high impedance state and to prevent erroneous detection.

4. Fourth Embodiment

In the first embodiment described above, when avalanche multiplication occurs, a current flowing through the cathode increases, and when the cathode voltage Vca reaches the lower limit value $V_{LIM}$, the rapid charging transistor 311 starts rapid charging. A charging time of the rapid charging is preferably short to shorten the dead time. A solid-state imaging element 200 of a fourth embodiment is different from that of the first embodiment in that the charging time is shortened by insertion of a resistance.

Figure 11:
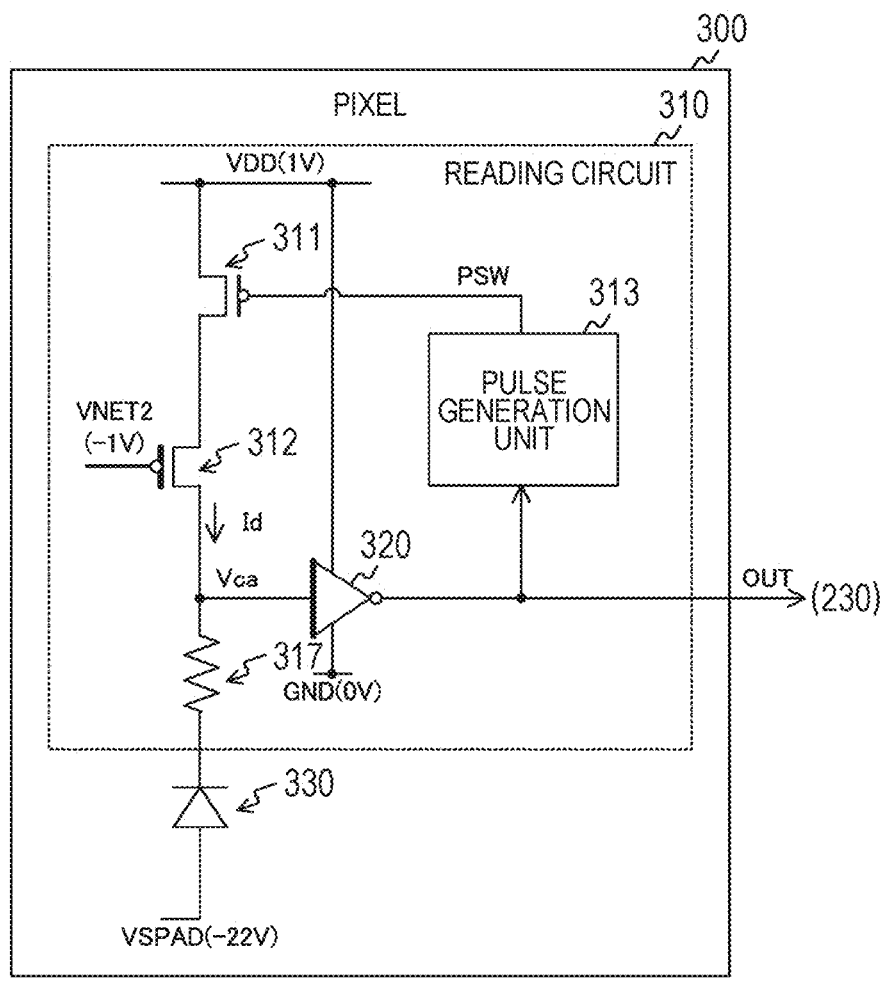
FIG. 11 is a circuit diagram illustrating a configuration example of a pixel in a fourth embodiment of the present technology.

FIG. 11 is a circuit diagram illustrating a configuration example of a pixel 300 in the fourth embodiment of the present technology. The pixel 300 of the fourth embodiment is different from that of the first embodiment in that a resistance 317 is further provided in a reading circuit 310.

The resistance 317 is inserted between the cathode of the SPAD 330 and the input terminal of the inverter 320. By insertion of the resistance 317, the input voltage of the inverter 320 at the start of rapid charging can be made higher than that in the first embodiment. As a result, the charging time can be shortened as compared with the first embodiment, and the dead time can be shortened accordingly.

Furthermore, a low-pass filter including the resistance 317 and a cathode capacitance is formed by insertion of the resistance 317. With the low-pass filter, even if a steep current flows at the time of avalanche multiplication, the amount of drop of the cathode voltage Vca is small, so that power required for charging can be suppressed.

As described above, according to the fourth embodiment of the present technology, since the resistance 317 is inserted between the cathode of the SPAD 330 and the input terminal of the inverter 320, the charging time can be shortened and the dead time can be shortened as compared with a case where the resistance 317 is not inserted.

5. Fifth Embodiment

In the first embodiment described above, the pulse generation unit 313 ends the rapid charging when the cathode voltage reaches the voltage $V_{INT}$. However, in this configuration, when avalanche multiplication occurs again during rapid charging, a discharging current and the charging current due to the avalanche multiplication may be balanced, and the cathode voltage Vca may not increase. A solid-state imaging element 200 of a fifth embodiment is different from that of the first embodiment in that an unintended equilibrium state is prevented by ending rapid charging also when a certain time elapses from the start of charging.

Figure 12:
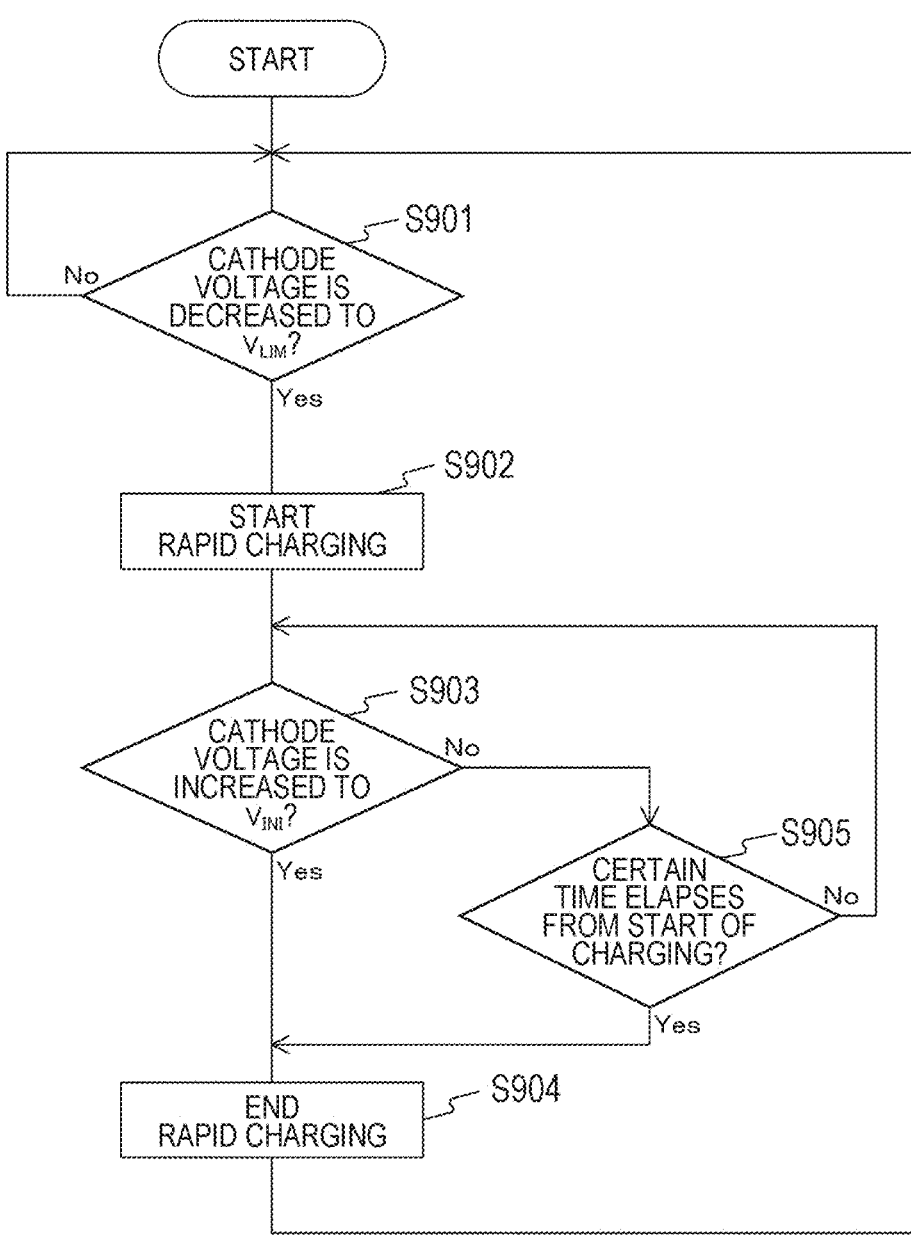
FIG. 12 is a flowchart illustrating an example of operation of a pixel in a fifth embodiment of the present technology.

FIG. 12 is a flowchart illustrating an example of operation of a pixel 300 in the fifth embodiment of the present technology. The operation of the pixel 300 of the fifth embodiment is different from that of the first embodiment in that the pulse generation unit 313 further executes step S905.

After starting the rapid charging (step S902), the pulse generation unit 313 determines whether or not the cathode voltage Vca is increased to the voltage $V_{INI}$ (charging is completed) (step S903).

In a case where charging is not completed (step S903: No), the pulse generation unit 313 determines whether or not a certain time dt3 elapses from the start of charging (step S905). In a case where the certain time dt3 does not elapses from the start of charging (step S905: No), the pulse generation unit 313 repeats step S903.

In a case where charging is completed (step S903: Yes) or in a case where the certain time dt3 elapses from the start of charging (step S905: Yes), the pulse generation unit 313, the pulse generation unit 313 turns off the rapid charging transistor 311 by the pulse signal. As a result, the rapid charging transistor 311 ends the rapid charging (step S904).

As illustrated in the figure, the pulse generation unit 313 of the fifth embodiment ends the supply of the charging current in a case where the cathode voltage Vca is increased to the voltage $V_{INI}$ (charging is completed) or in a case where the certain time dt3 elapses from the start of charging. As a result, even in a case where avalanche multiplication occurs again during rapid charging and the discharging current and the charging current are balanced, the charging current can be stopped after a lapse of a certain time and only the discharging current can be obtained. As a result, the discharging current is out of the equilibrium state and flows, and the quenching is performed again.

Note that, each of the second to fourth embodiments can be applied to the fifth embodiment.

As described above, according to the fifth embodiment of the present technology, since the pulse generation unit 313 ends the supply of the charging current also in a case where the certain time dt3 elapses from the start of charging, it is possible to prevent the equilibrium state between the discharging current and the charging current.

6. Sixth Embodiment

In the first embodiment described above, the gates of the pMOS transistor 321 and the nMOS transistor 322 having relatively thick gate oxide films are connected to the cathode of the SPAD 330, but in this configuration, it is difficult to reduce power consumption. A solid-state imaging element 200 of a sixth embodiment is different from that of the first embodiment in that a gate capacitance connected to the cathode is reduced.

Figure 13:
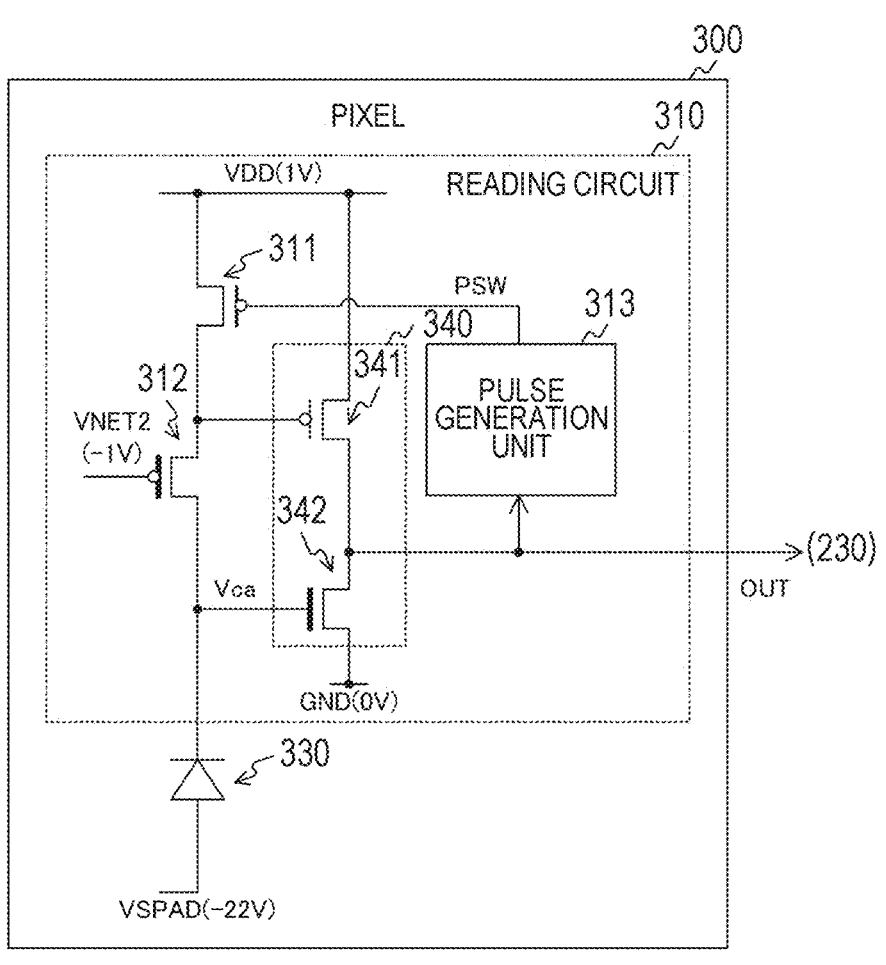
FIG. 13 is a circuit diagram illustrating a configuration example of a pixel in a sixth embodiment of the present technology.

FIG. 13 is a circuit diagram illustrating a configuration example of a pixel 300 in the sixth embodiment of the present technology. The pixel 300 of the sixth embodiment is different from that of the first embodiment in that an inverter 340 is provided instead of the inverter 320.

The inverter 340 includes a pMOS transistor 341 and an nMOS transistor 342 connected together in series between the power supply voltage VDD and the ground voltage GND. Furthermore, gate oxide films of the rapid charging transistor 311 and the pMOS transistor 341 are thinner than those of the voltage limiting transistor 312 and the nMOS transistor 342. Furthermore, the gate of the pMOS transistor 341 is connected to a connection node between the rapid charging transistor 311 and the voltage limiting transistor 312. The gate of the nMOS transistor 342 is connected to the cathode of the SPAD 330.

Similarly to the first embodiment, quenching is detected by the pMOS transistor 341, and completion of charging is detected by the nMOS transistor 342. Furthermore, since only the gate of the thick film nMOS transistor 342 is connected to the cathode, the gate capacitance connected to the cathode can be reduced as compared with the first embodiment. As a result, the power consumption can be reduced.

Note that, each of the second to fifth embodiments can be applied to the sixth embodiment.

As described above, according to the sixth embodiment of the present technology, since only the gate of the thick film nMOS transistor 342 is connected to the cathode, the gate capacitance connected to the cathode can be reduced, and the power consumption can be reduced.

7. Seventh Embodiment

In the first embodiment described above, the cathode of the SPAD 330 is connected to the input terminal of the inverter 320, but the anode can also be connected. A solid-state imaging element 200 of the seventh embodiment is different from that of the first embodiment in that the anode of the SPAD 330 is connected to the input terminal of the inverter 320.

Figure 14:
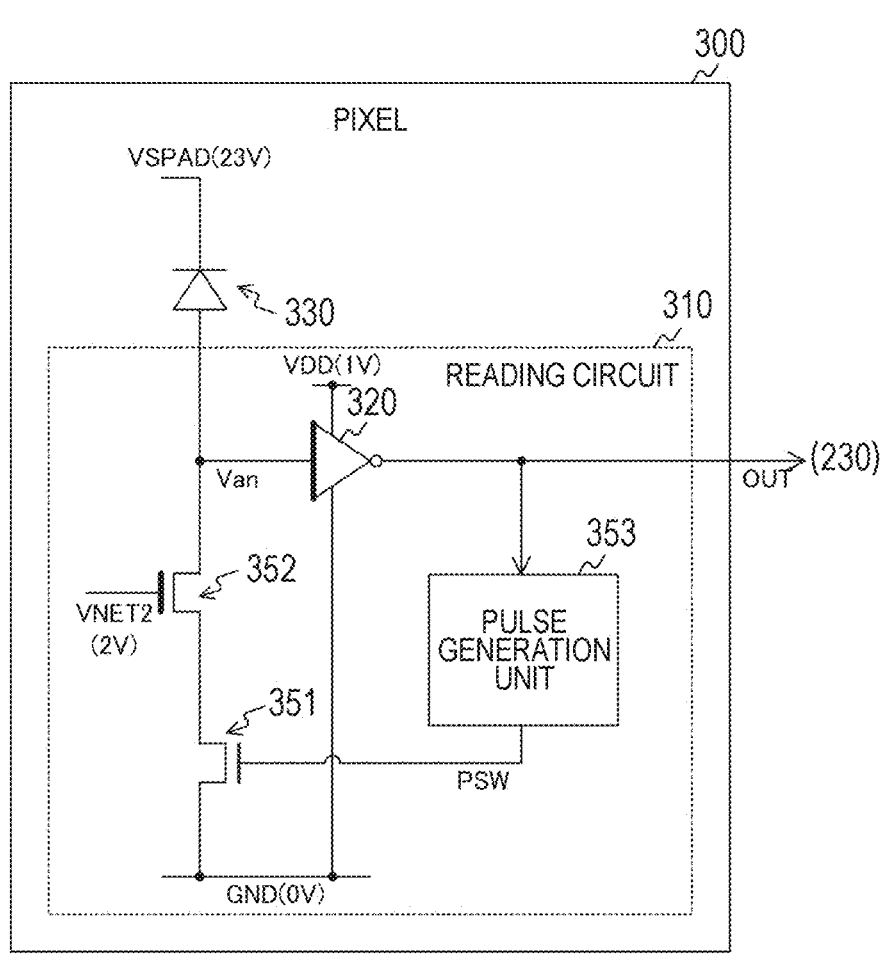
FIG. 14 is a circuit diagram illustrating a configuration example of a pixel in a seventh embodiment of the present technology.

FIG. 14 is a circuit diagram illustrating a configuration example of a pixel 300 in the seventh embodiment of the present technology. The pixel 300 of the seventh embodiment includes a rapid charging transistor 351, a voltage limiting transistor 352, and a pulse generation unit 353 instead of the rapid charging transistor 311, the voltage limiting transistor 312, and the pulse generation unit 313. As the rapid charging transistor 351 and the voltage limiting transistor 352, nMOS transistors are used.

The rapid charging transistor 351 and the voltage limiting transistor 352 are connected together in series between the ground voltage GND and the anode of the SPAD 330 with the rapid charging transistor 351 as a ground side. Furthermore, the reverse bias voltage VSPAD is applied to the cathode of the SPAD 330. A connection node between the voltage limiting transistor 352 and the SPAD 330 is connected to the input terminal of the inverter 320.

The pulse generation unit 353 changes the pulse signal PSW from the low level to the high level when the cathode voltage Vca is increased to an upper limit value, and changes the pulse signal PSW from the high level to the low level when an anode voltage Van drops to a voltage at the time of completion of charging after the start of charging.

Furthermore, for example, 1 volt (V) is set for the power supply voltage VDD, and 2 volt (V) is set for the bias voltage VNET2. Furthermore, 23 volt (V) is set for the reverse bias voltage VSPAD, and 0 volt (V) is set for the ground voltage GND. Note that, each of the second to sixth embodiments can be applied to the seventh embodiment.

As described above, according to the seventh embodiment of the present technology, since the anode of the SPAD 330 is connected to the input terminal of the inverter 320, a photon can be detected on the basis of an increase in anode voltage.

8. Eighth Embodiment

In the first embodiment described above, the circuits and elements in the solid-state imaging element 200 are arranged on, for example, a single semiconductor substrate, but in this configuration, there is a possibility that it is difficult to improve sensitivity of the SPAD. A solid-state imaging element 200 of an eighth embodiment is different from that of the first embodiment in that the circuits and elements are arranged on a plurality of stacked substrates.

Figure 15:
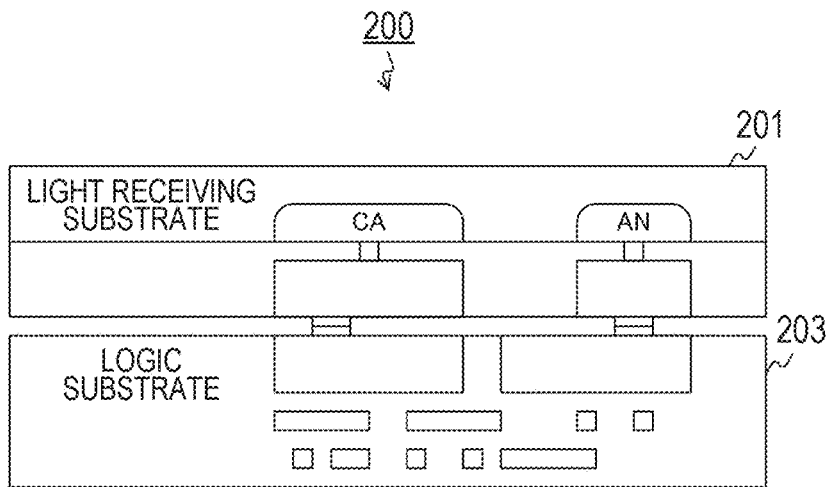
FIG. 15 is a diagram illustrating an example of a stacked structure of a solid-state imaging element in an eighth embodiment of the present technology.

FIG. 15 is a diagram illustrating an example of a stacked structure of the solid-state imaging element 200 in the eighth embodiment of the present technology. The solid-state imaging element 200 of the eighth embodiment includes a light receiving substrate 201 and a logic substrate 203 that are stacked.

The light receiving substrate 201 and the logic substrate 203 are electrically connected to each other by, for example, Cu—Cu connection. Note that the light receiving substrate 201 and the logic substrate 203 can also be connected to each other by a gold (Au) micro-bump.

Figure 16:
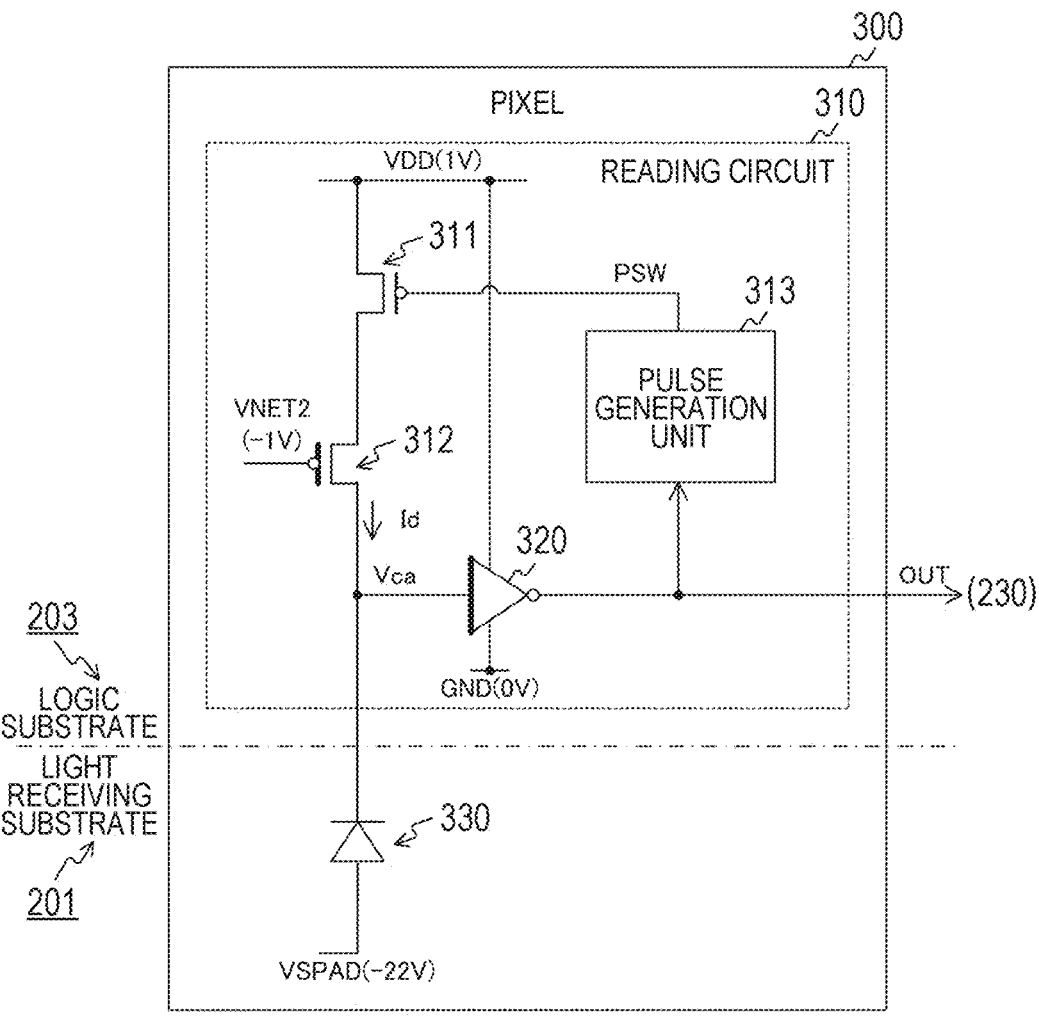
FIG. 16 is a circuit diagram illustrating a configuration example of a pixel in the eighth embodiment of the present technology.

FIG. 16 is a circuit diagram illustrating a configuration example of a pixel 300 in the eighth embodiment of the present technology. The SPAD 330 is arranged on the light receiving substrate 201, and the reading circuit 310 is arranged on the logic substrate 203. Furthermore, the control circuit 210 and the signal processing unit 230 are also arranged on the logic substrate 203. By arranging only the SPAD 330 on the light receiving substrate 201 as described above, it is possible to increase an aperture ratio of the SPAD 330 and improve the sensitivity as compared with the first embodiment. At this time, since a capacitance of the pixel 300 increases, need for rapid charging increases.

Note that, each of the second to seventh embodiments can be applied to the eighth embodiment.

As described above, according to the eighth embodiment of the present technology, since the SPAD 330 is arranged on the light receiving substrate 201 and the reading circuit 310 is arranged on the logic substrate 203, the sensitivity of the SPAD 330 can be improved.

9. Ninth Embodiment

In the eighth embodiment described above, the entire reading circuit 310 is arranged on the logic substrate 203, but in this configuration, there is a possibility that miniaturization of the pixel becomes difficult. A solid-state imaging element 200 of a ninth embodiment is different from that of the eighth embodiment in that the circuits and elements are arranged on three stacked substrates.

Figure 17:
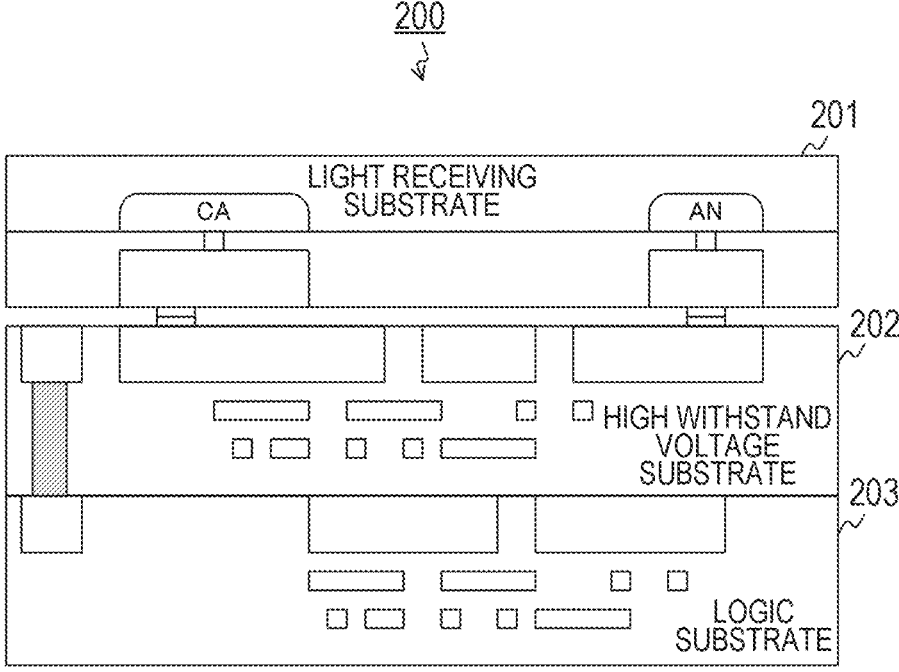
FIG. 17 is a diagram illustrating an example of a stacked structure of a solid-state imaging element in a ninth embodiment of the present technology.

FIG. 17 is a diagram illustrating an example of a stacked structure of the solid-state imaging element 200 in the ninth embodiment of the present technology. The solid-state imaging element 200 of the ninth embodiment is different from that of the eighth embodiment in that a high withstand voltage substrate 202 is further included.

The light receiving substrate 201 and the high withstand voltage substrate 202 are electrically connected to each other by Cu—Cu connection or an Au micro-bump. Furthermore, a through silicon via (TSV) is formed in the high withstand voltage substrate 202. A hatched portion in the figure indicates the TSV. Elements in the high withstand voltage substrate 202 and the logic substrate 203 are electrically connected to each other by the TSV.

Figure 18:
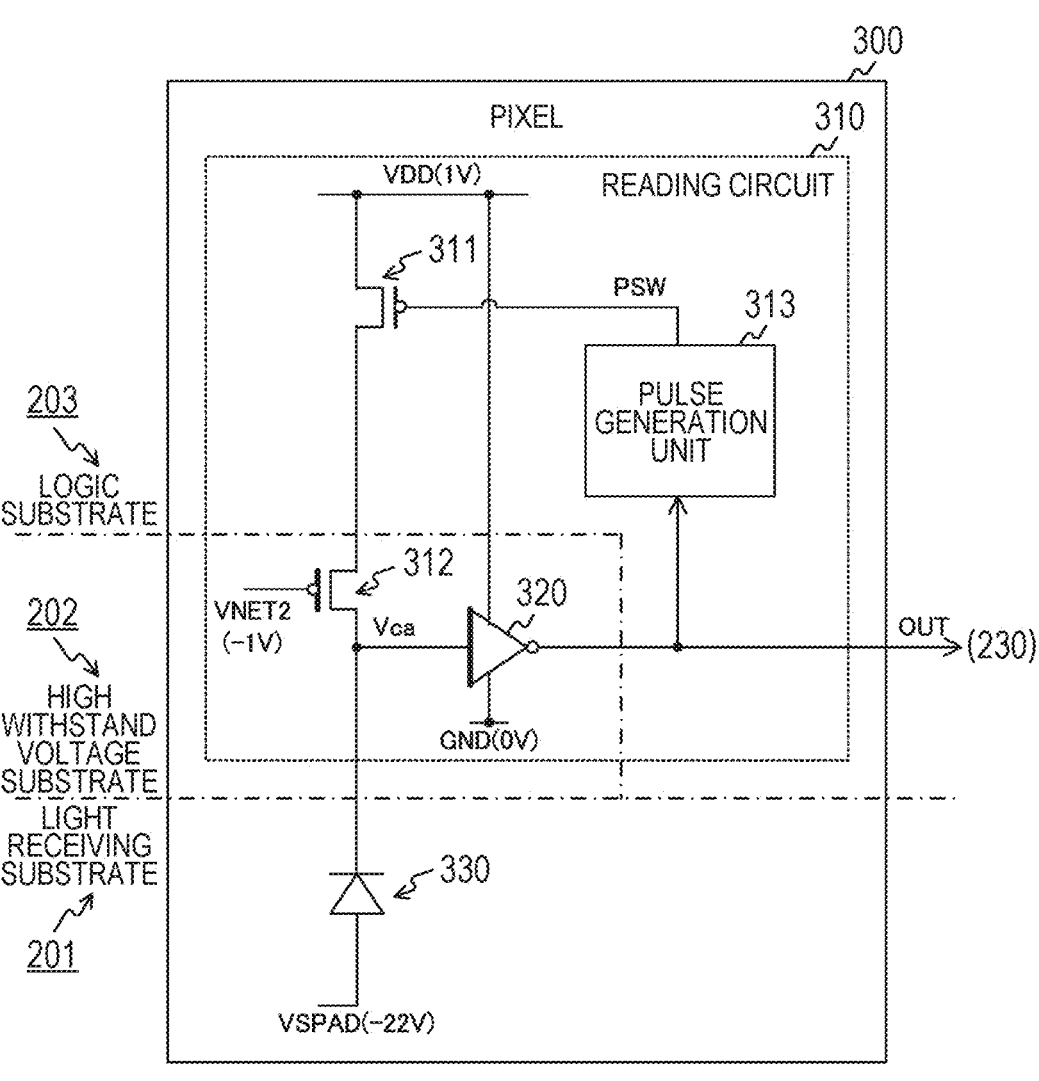
FIG. 18 is a circuit diagram illustrating a configuration example of a pixel in the ninth embodiment of the present technology.

FIG. 18 is a circuit diagram illustrating a configuration example of a pixel 300 in the ninth embodiment of the present technology. The SPAD 330 is arranged on the light receiving substrate 201, and among elements in the reading circuit 310, transistors having a relatively thick gate oxide film (the voltage limiting transistor 312 and the transistors in the inverter 320) are arranged in the high withstand voltage substrate 202. Other circuits and elements are arranged on the logic substrate 203.

By separating and arranging thick film transistors (the voltage limiting transistor 312 and the like) requiring a high withstand voltage on the high withstand voltage substrate 202, a process for forming a thin film transistor having a small size can be selected for the logic substrate 203. As a result, miniaturization of the pixel is facilitated.

Note that, each of the second to seventh embodiments can be applied to the ninth embodiment. Furthermore, although three substrates are stacked, four or more substrates can also be stacked. For example, a memory substrate can be further added, and a memory that holds distance data and the like can be arranged on the memory substrate.

As described above, according to the ninth embodiment of the present technology, since the thick film voltage limiting transistor 312 and the like are arranged on the high withstand voltage substrate 202 and the rest is arranged on the logic substrate 203, miniaturization of the pixel is facilitated.

10. Tenth Embodiment

In the third embodiment described above, the constant current source 316 is added, and a constant voltage is supplied to the gate of the voltage limiting transistor 312. However, in this configuration, there is a possibility that a mismatch occurs in a propagation delay time of the reading circuit 310 (in other words, a front end) due to process, voltage, and temperature (PVT) variations of the threshold voltage of the voltage limiting transistor. Here, the mismatch means that the propagation delay time varies due to the PVT variations of the threshold voltage under the condition that the distance to the object is the same. A solid-state imaging element 200 of a tenth embodiment is different from that of the third embodiment in that a clamp voltage depending on the power supply voltage is generated.

Figure 19:
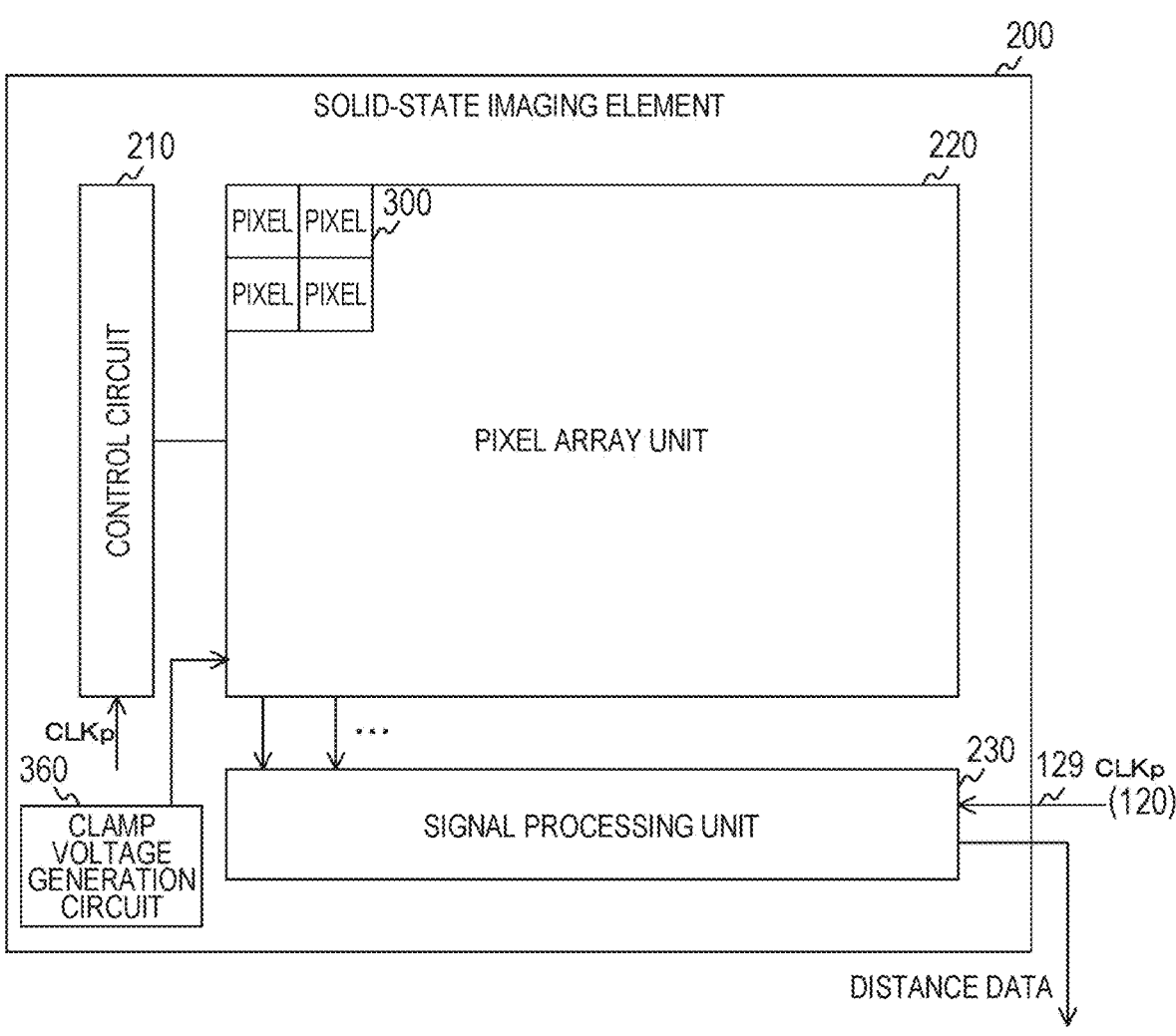
FIG. 19 is a block diagram illustrating a configuration example of a solid-state imaging element in a tenth embodiment of the present technology.

FIG. 19 is a block diagram illustrating a configuration example of the solid-state imaging element 200 in the tenth embodiment of the present technology. The solid-state imaging element 200 of the tenth embodiment is different from that of the third embodiment in that a clamp voltage generation circuit 360 is further included.

Figure 20:
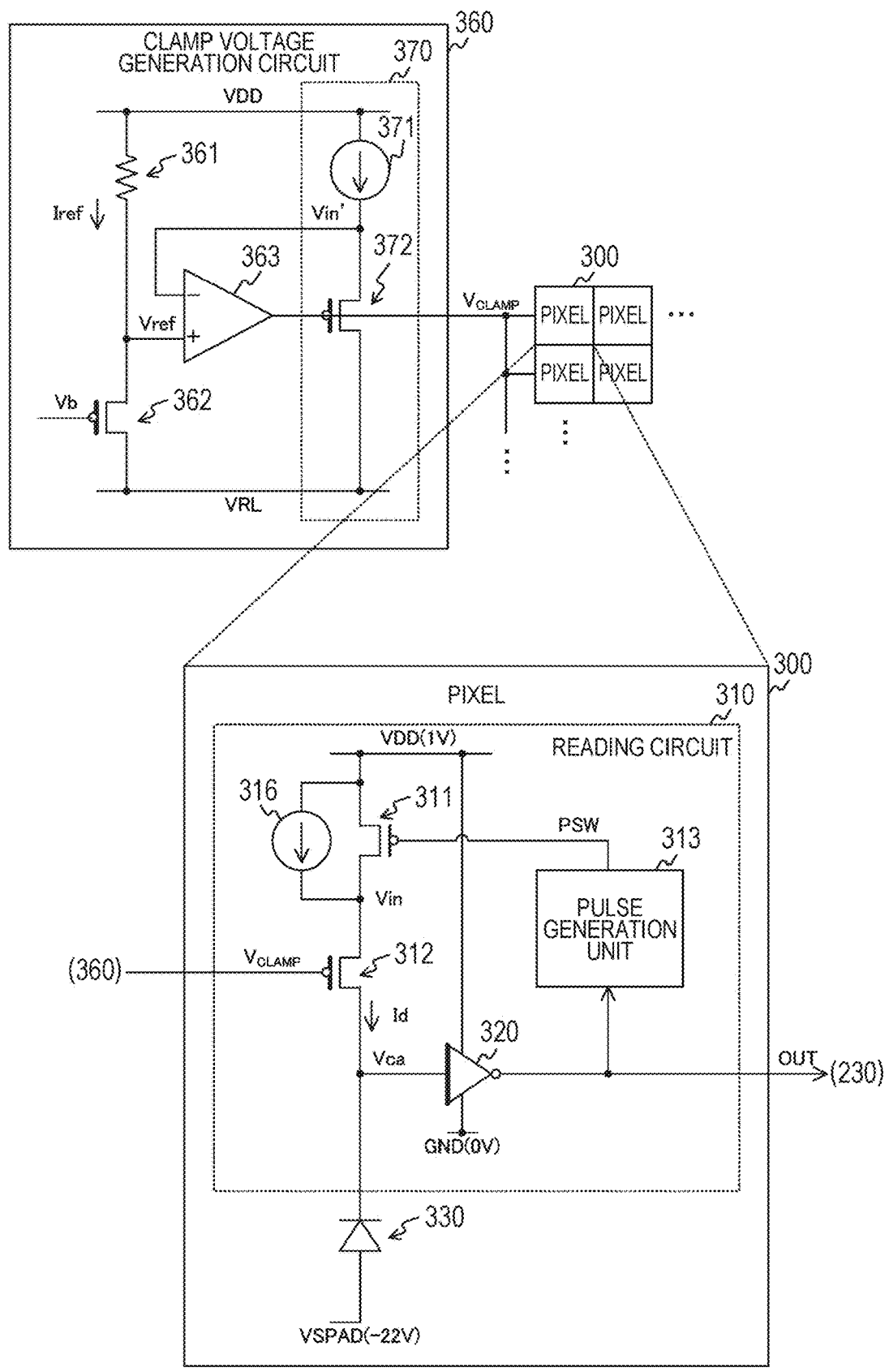
FIG. 20 is a circuit diagram illustrating a configuration example of a clamp voltage generation circuit and a pixel in the tenth embodiment of the present technology.

FIG. 20 is a circuit diagram illustrating a configuration example of the clamp voltage generation circuit 360 and a pixel 300 in the tenth embodiment of the present technology. A circuit configuration of the pixel 300 of the tenth embodiment is the same as that of the pixel 300 of the third embodiment illustrated in FIG. 10. A voltage of a connection node between the constant current source 316 and the voltage limiting transistor 312 in the pixel 300 is defined as an input voltage Vin.

Furthermore, the clamp voltage generation circuit 360 includes a resistance element 361, a current source transistor 362, an operational amplifier 363, and a feedback unit 370. The feedback unit 370 includes a constant current source 371 and a pMOS transistor 372.

The constant current source 371 and the pMOS transistor 372 are connected together in series between the power supply voltage VDD and a reference voltage VRL lower than a power supply voltage VDDL. The constant current source 371 is a current source having the same characteristics as the constant current source 316. The pMOS transistor 372 is a transistor having the same characteristics as the voltage limiting transistor 312. With this circuit configuration, a voltage of a connection node between the constant current source 371 and the pMOS transistor 372 is Vin' that is a fixed value of a lower limit of the input voltage Vin. The voltage (Vin') of the connection node is input to the inverting input terminal (−) of the operational amplifier 363.

The resistance element 361 and the current source transistor 362 are connected together in series between the power supply voltage VDD and the reference voltage VRL lower than the power supply voltage VDDL. A predetermined bias voltage Vb is applied to the gate of the current source transistor 362. A voltage of a connection node between the resistance element 361 and the current source transistor 362 is input to the non-inverting input terminal (+) of the operational amplifier 363 as a reference voltage Vref.

The current source transistor 362 generates a current Iref depending on the bias voltage Vb. Assuming that a resistance value of the resistance element 361 is R, the reference voltage Vref is expressed by the following formula.

$$Vref=VDD-R \times Iref \qquad \text{Formula 1}$$

In the above formula, the unit of the reference voltage Vref and the power supply voltage VDD is, for example, volt (V), and the unit of the resistance value R is ohm ($\Omega$). The unit of the current Iref is, for example, ampere (A).

The operational amplifier 363 outputs a voltage depending on a difference between the reference voltage Vref and the fixed value Vin' as a clamp voltage $V_{CLAMP}$. The clamp voltage $V_{CLAMP}$ is supplied to the gate of the pMOS transistor 372, and the gate of the voltage limiting transistor 312 of each of the pixels 300 in the pixel array unit 220. Furthermore, the following formula is established from a virtual ground of the operational amplifier 363 and Formula 1.

$$Vin'=Vref=VDD-R \times Iref \qquad \text{Formula 2}$$

The clamp voltage $V_{CLAMP}$ is expressed by the following formula.

$$V_{CLAMP}=Vin'-V_{thCLAMP} \qquad \text{Formula 3}$$

In the above formula, $V_{thCLAMP}$ is the threshold voltage of the voltage limiting transistor 312. The unit of the threshold voltage $V_{thCLAMP}$ is, for example, volt (V).

With the circuit configuration described above, the feedback unit 370 generates the fixed value Vin' from the clamp voltage $V_{CLAMP}$, and a negative feedback is performed of the fixed value Vin' to the operational amplifier 363. For this reason, the operational amplifier 363 and the feedback unit 370 constitute a negative feedback circuit. Formula 2 is established by the negative feedback, and the fixed value Vin' does not depend on the PVT variations of the threshold voltage of the voltage limiting transistor 312. Furthermore, since a threshold voltage of the pMOS transistor 372 in the negative feedback circuit is the same as that of the voltage limiting transistor 312, influence of PVT dependency of the threshold voltage is canceled.

The input voltage Vin decreases from the power supply voltage VDD depending on incidence of a photon. Then, when the input voltage Vin decreases to the fixed value Vin' (=VDD−R×Iref), the voltage limiting transistor 312 transitions to the off state and is clamped at the fixed value, from Formula 3. For this reason, an amplitude of the input voltage Vin becomes R×Iref, and a value of the amplitude becomes a constant value regardless of variation of the power supply voltage VDD.

Next, a background of the invention according to the tenth embodiment will be described.

Figure 21:
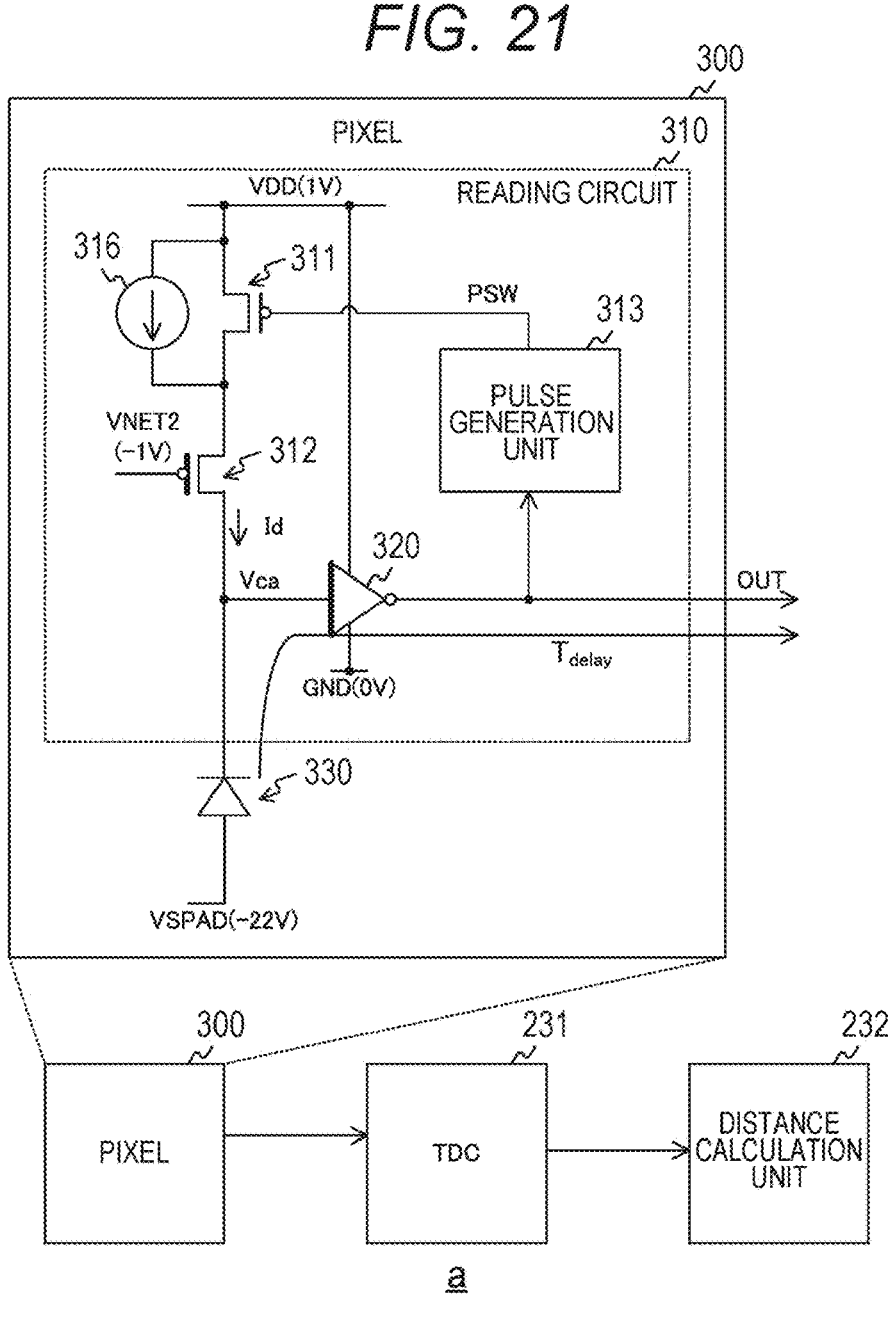
FIGS. 21A and 21B are diagrams for explaining a propagation delay time of a front end in the tenth embodiment of the present technology.
Figure 21:
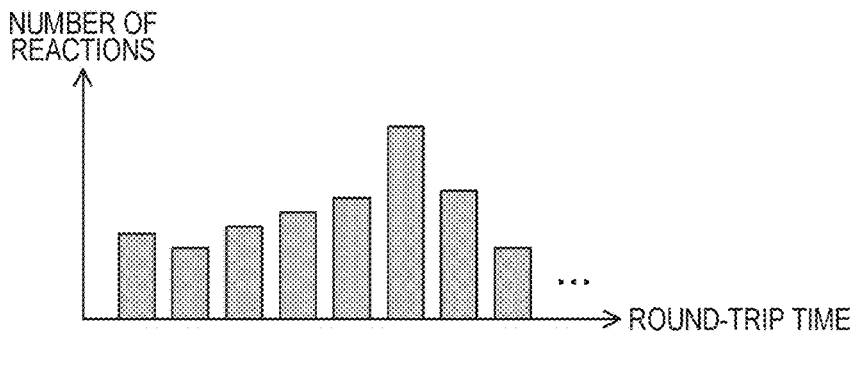

FIGS. 21A and 21B are diagrams for explaining a propagation delay time of the front end in the tenth embodiment of the present technology. When a photon is incident on the pixel 300, as illustrated in FIG. 21A, a pulse signal is supplied from the SPAD 330 to the TDC 231 via the reading circuit 310. A propagation delay time of this path (front end) is defined as Tdelay.

The TDC 231 measures a round-trip time from a light emission timing of the irradiation light to a light reception timing of the reflected light. Then, as illustrated in FIG. 21B, the distance calculation unit 232 generates a histogram in which the number of reactions for each round-trip time is plotted.

Since the TDC 231 obtains the round-trip time from the pulse signal having a propagation delay at the front end, it is necessary to minimize the mismatch of the propagation delay time for each front end, and its PVT dependency.

Figure 22:
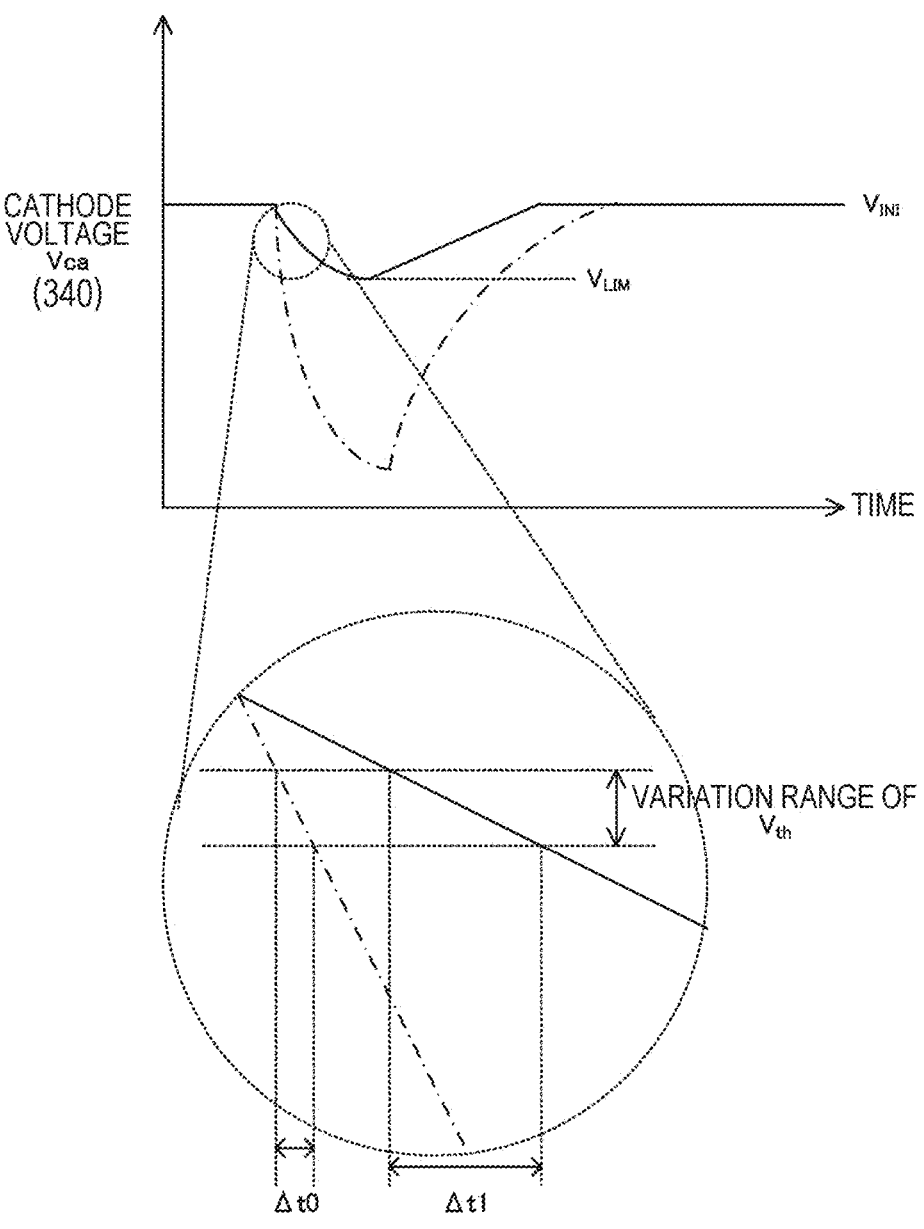
FIG. 22 is a diagram for explaining a mismatch in propagation delay time in the tenth embodiment of the present technology.

In particular, in a case where the voltage limiting transistor 312 clamps the cathode voltage Vca, as illustrated in FIG. 22, a slew rate of the cathode voltage Vca is smaller than that in a case where the cathode voltage Vca is not clamped. In the figure, the vertical axis represents the cathode voltage Vca, and the horizontal axis represents time. A solid line indicates a locus of the cathode voltage Vca in a case of being clamped, and an alternate long and short dash line indicates a locus of the cathode voltage Vca in a case of not being clamped.

When the input slew rate is decreased by the voltage limiting transistor 312, when the threshold voltage Vth of the inverter 320 varies, a variation range (mismatch) of a timing at which the output of the inverter 320 is inverted increases due to the variation. In the figure, Δt0 represents a mismatch in the case where the cathode voltage Vca is not clamped, and Δt1 represents a mismatch in the case where the cathode voltage Vca is clamped. As illustrated in the figure, when the cathode voltage Vca is clamped by the voltage limiting transistor 312, the mismatch is particularly large, and thus, a countermeasure therefor is required.

Figure 23:
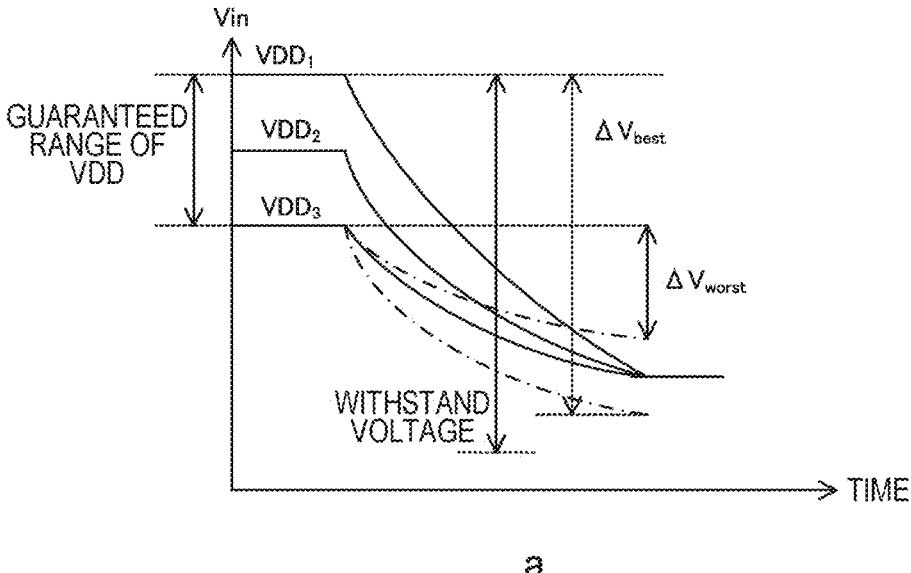
FIGS. 23A and 23B are graphs illustrating an example of variation of an input voltage of each of the third embodiment and the tenth embodiment of the present technology.
Figure 23:
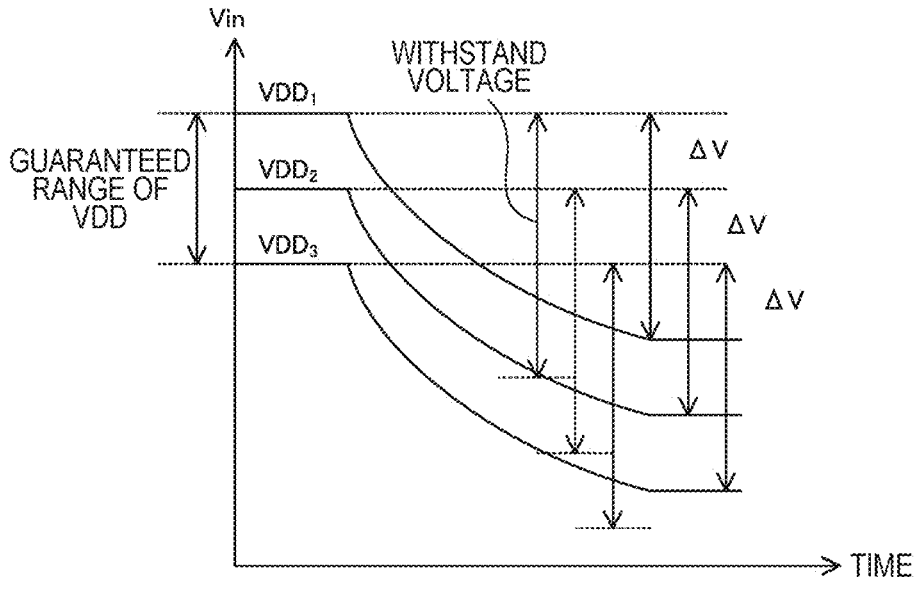

FIGS. 23A and 23B are graphs illustrating an example of variation of the input voltage Vin of each of the third embodiment and the tenth embodiment of the present technology. In FIGS. 23A and 23B, FIG. 23A is a graph illustrating an example of variation of the input voltage Vin in the third embodiment. In FIGS. 23A and 23B, FIG. 23B is a graph illustrating an example of variation of the input voltage Vin in the third embodiment. In the figure, the vertical axis represents the input voltage Vin, and the horizontal axis represents time.

As illustrated in FIG. 23A, in the third embodiment in which a fixed voltage is applied to the gate of the voltage limiting transistor 312, a lower limit value of the input voltage Vin is constant. For this reason, when the power supply voltage VDD varies within a predetermined guaranteed range, the amplitude of the input voltage Vin also varies. Furthermore, when a process or temperature varies, the threshold voltage of the voltage limiting transistor 312 varies, and the lower limit value varies. An alternate long and short dash line in the figure indicates a locus when the threshold voltage varies due to the process or the temperature. A maximum value of the amplitudes of the input voltage Vin varying due to the power supply voltage VDD, the process, or the temperature is defined as ΔVbest, and a minimum value is defined as ΔVworst.

Since the amplitude varies, in the third embodiment, a gate voltage needs to be set such that the amplitude is less than a withstand voltage of the inverter 320 under all PVT conditions, and in this case, the gate voltage needs to be set in accordance with $\Delta V_{best}$. In this setting, the mismatch of the propagation delay time is large at $\Delta V_{worst}$. Furthermore, since the amplitude of the input voltage Vin changes depending on the PVT conditions, the PVT dependency of the propagation delay time also increases.

On the other hand, in the tenth embodiment in which a variable clamp voltage depending on the power supply voltage VDD is applied to the gate of the voltage limiting transistor 312, the lower limit value of the input voltage Vin also changes depending on the power supply voltage VDD as illustrated in FIG. 23B. For this reason, even if the power supply voltage VDD varies within the guaranteed range, an amplitude ΔV of the input voltage Vin is constant. Thus, the amplitude ΔV can be maximized within a range less than the withstand voltage. By maximizing the amplitude ΔV, the mismatch of the propagation delay time and its PVT dependency can be minimized.

As described above, according to the tenth embodiment of the present technology, since the clamp voltage generation circuit 360 generates the clamp voltage depending on the power supply voltage VDD, the amplitude of the input voltage Vin can be made constant even if the power supply voltage VDD varies. As a result, the amplitude ΔV can be maximized to minimize the mismatch of the propagation delay time and its PVT dependency.

[First Modification]

In the tenth embodiment described above, the constant current source 316, the rapid charging transistor 311, and the pulse generation unit 313 are provided for each pixel, but in this configuration, a circuit scale of the pixel 300 increases, and miniaturization of the pixel 300 is difficult. A solid-state imaging element 200 in a first modification of the tenth embodiment is different from that of the tenth embodiment in that the number of elements in a pixel 300 is reduced.

Figure 24:
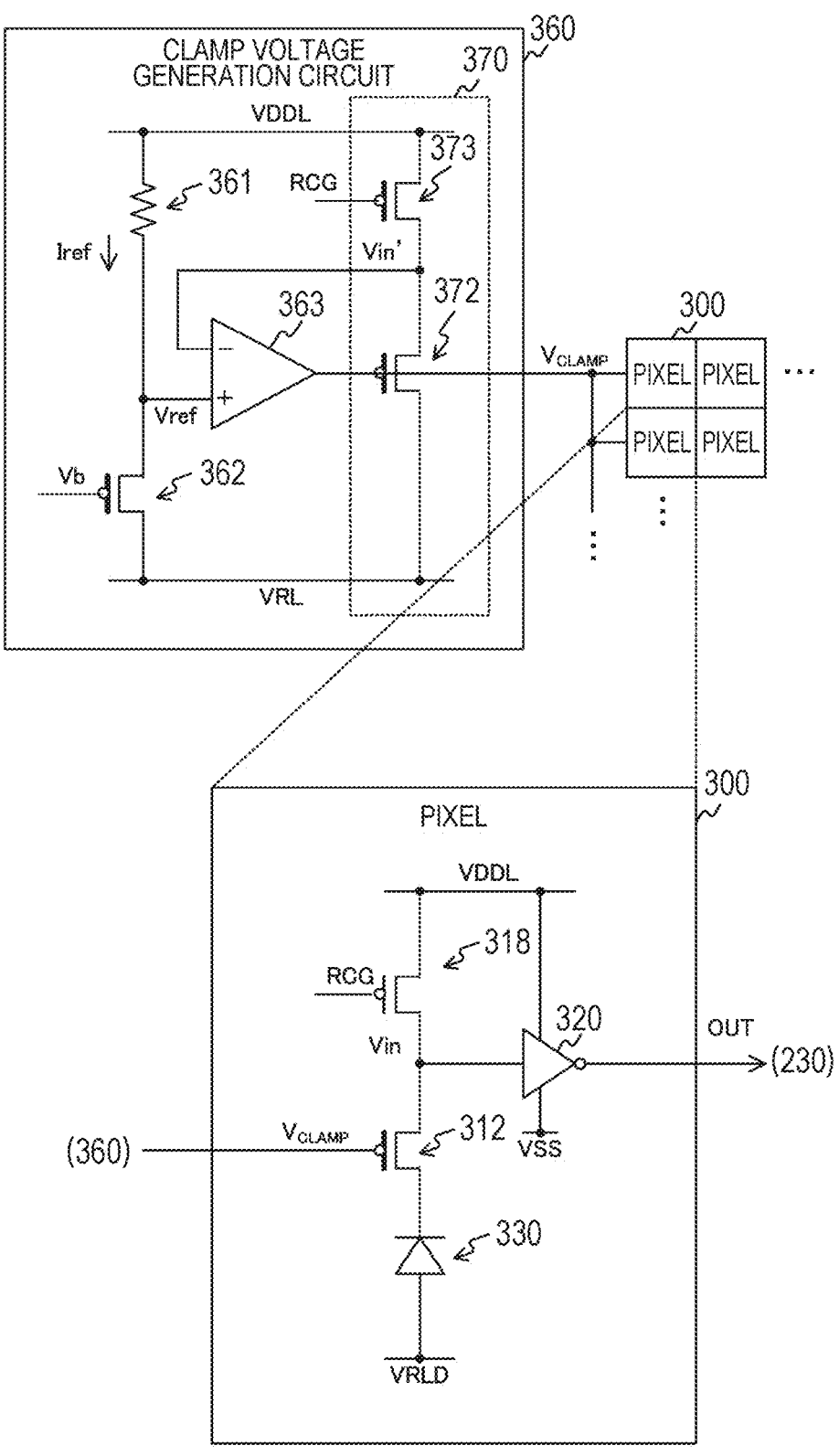
FIG. 24 is a circuit diagram illustrating a configuration example of a clamp voltage generation circuit and a pixel in a first modification of the tenth embodiment of the present technology.

FIG. 24 is a circuit diagram illustrating a configuration example of a clamp voltage generation circuit 360 and the pixel 300 in the first modification of the tenth embodiment of the present technology. The pixel 300 according to the first modification of the tenth embodiment is different from that of the tenth embodiment in that the constant current source 316, the rapid charging transistor 311, and the pulse generation unit 313 are not included, but instead, a pMOS transistor 318 is included.

The pMOS transistor 318 is inserted between a power supply voltage VDDL and the voltage limiting transistor 312. Furthermore, a bias voltage RCG from the control circuit 210 is input to the gate of the pMOS transistor 318. When driving the pixel 300, the control circuit 210 controls the bias voltage RCG to the pixel to a bias voltage at which a desired recharge current flows.

The clamp voltage generation circuit 360 of the first modification of the tenth embodiment includes a pMOS transistor 373 instead of the constant current source 371. The pMOS transistor 373 has the same characteristics as the pMOS transistor 318, and the bias voltage RCG is input to the gate thereof.

With the configuration illustrated in the figure, the constant current source 316 and the pulse generation unit 313 are unnecessary, so that the number of elements in the pixel 300 can be reduced.

As described above, according to the first modification of the tenth embodiment of the present technology, since the pMOS transistor 318 is provided instead of the constant current source 316, the rapid charging transistor 311, and the pulse generation unit 313, the number of elements in the pixel 300 can be reduced.

[Second Modification]

In the first modification of the tenth embodiment described above, one clamp voltage generation circuit 360 supplies the clamp voltage to all the pixels, but in this configuration, there is a possibility that the clamp voltage varies due to voltage variation generated in pixels in which the SPAD 330 reacts. A solid-state imaging element 200 in a second modification of the tenth embodiment is different from that of the first modification of the tenth embodiment in that the clamp voltage generation circuit 360 is arranged for each row.

Figure 25:
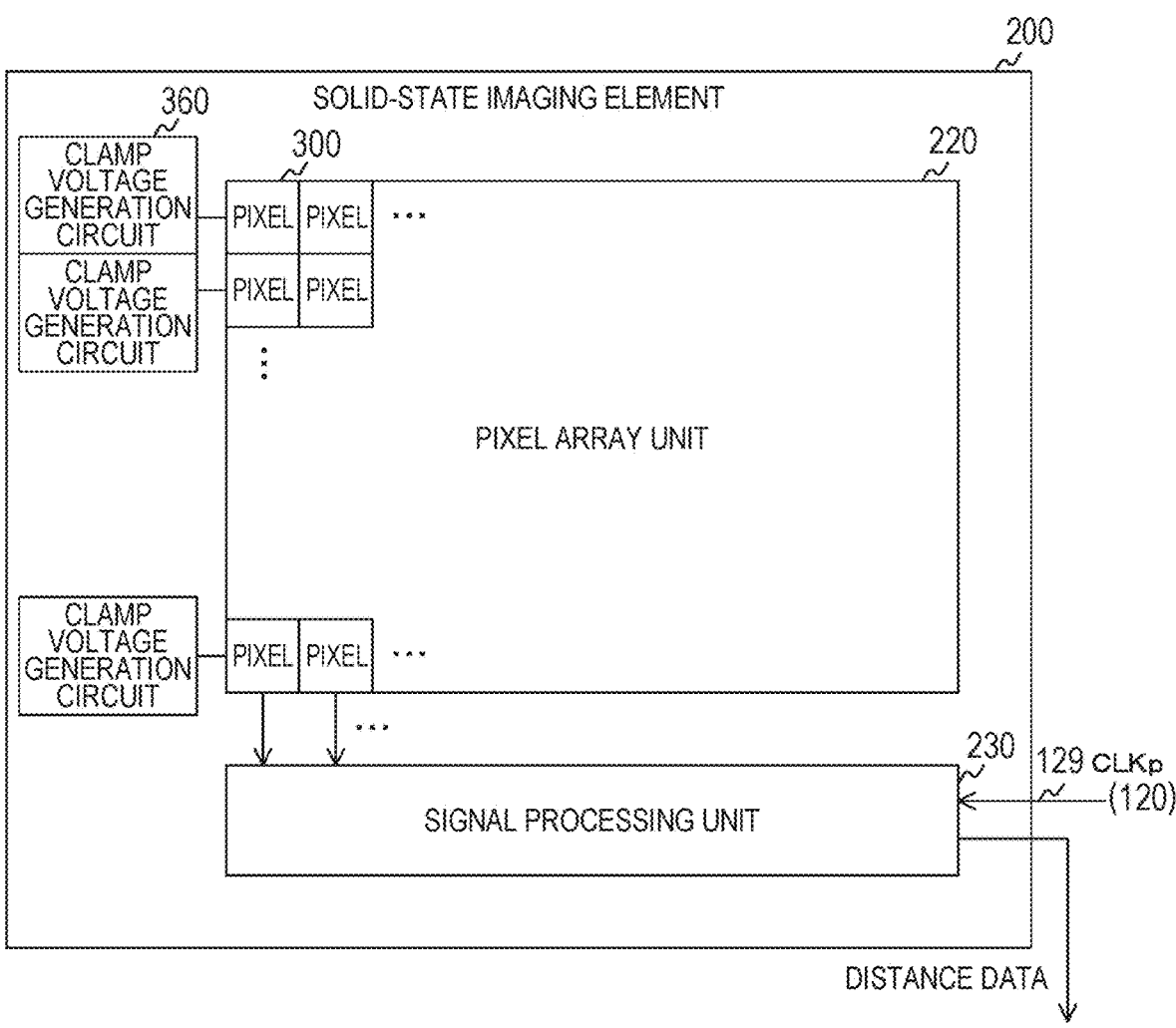
FIG. 25 is a block diagram illustrating a configuration example of a solid-state imaging element in a second modification of the tenth embodiment of the present technology.

FIG. 25 is a block diagram illustrating a configuration example of the solid-state imaging element 200 in the second modification of the tenth embodiment of the present technology. The solid-state imaging element 200 of the second modification of the tenth embodiment is different from that of the first modification of the tenth embodiment in that the clamp voltage generation circuit 360 is arranged for each row. Note that, in the figure, the control circuit 210 is omitted for convenience of description.

The clamp voltage generation circuit 360 in each row supplies the clamp voltage only to a corresponding row. By arranging the clamp voltage generation circuit 360 for each row, the number of front ends connected to wiring for supplying the clamp voltage is reduced, and influence of the voltage variation during the reaction of the SPAD 330 on the clamp voltage can be suppressed. Note that the clamp voltage generation circuit 360 can also be arranged for each column. Furthermore, instead of the clamp voltage generation circuit 360 illustrated in FIG. 24, the clamp voltage generation circuit 360 illustrated in FIG. 20 can also be arranged.

As described above, according to the second modification of the tenth embodiment of the present technology, since the clamp voltage generation circuit 360 is arranged for each row, it is possible to suppress the influence of the voltage variation during the reaction of the SPAD 330 on the clamp voltage.

[Third Modification]

In the first modification of the tenth embodiment described above, the amplitude of the input voltage Vin is controlled to R×Iref, but in this configuration, there is a possibility that the amplitude varies due to a temperature characteristic of the resistance value R. A solid-state imaging element 200 in a third modification of the tenth embodiment is different from that of the first modification of the tenth embodiment in that influence of the temperature characteristic of the resistance value R is canceled.

Figure 26:
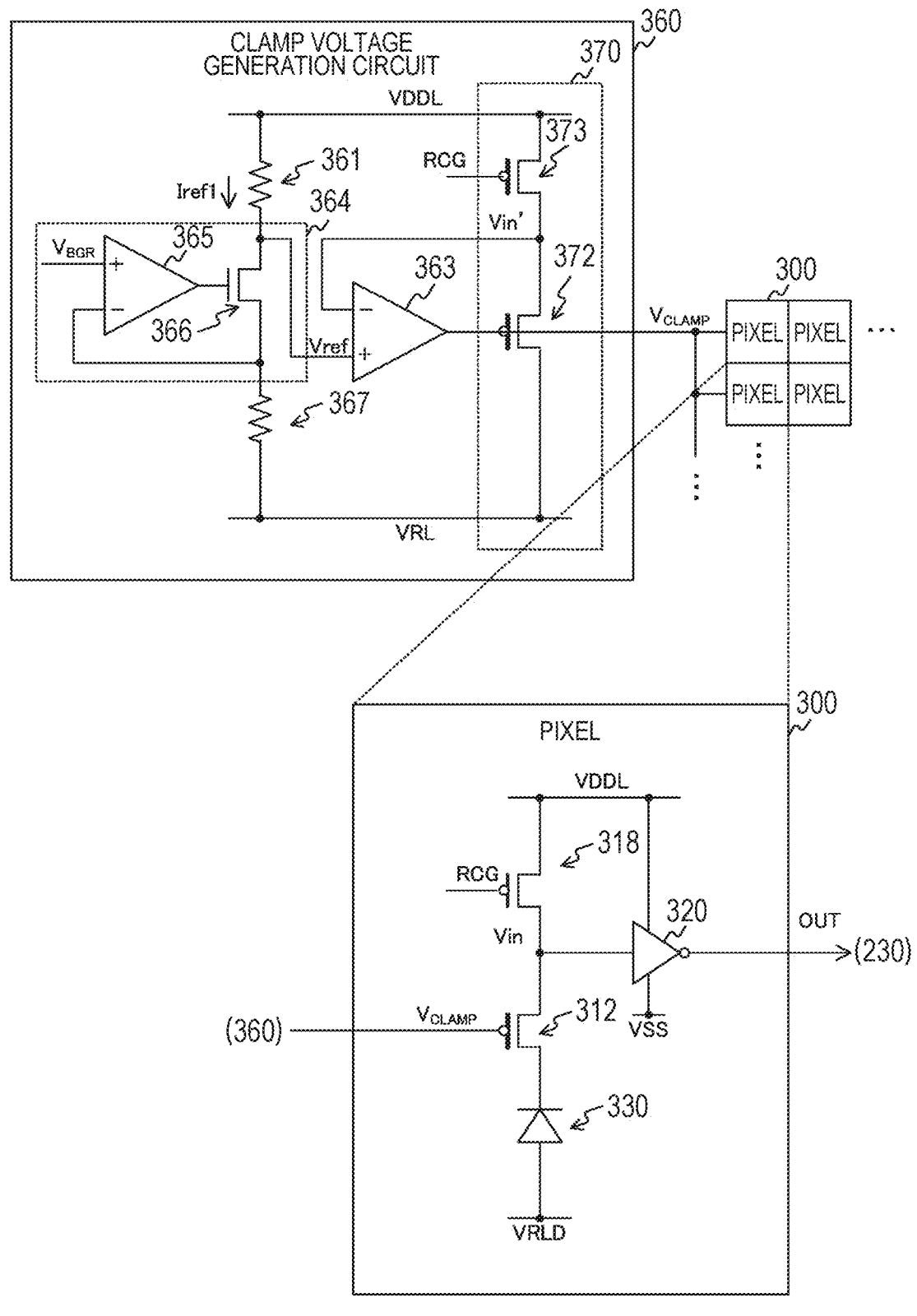
FIG. 26 is a circuit diagram illustrating a configuration example of a clamp voltage generation circuit and a pixel in a third modification of the tenth embodiment of the present technology.

FIG. 26 is a circuit diagram illustrating a configuration example of a clamp voltage generation circuit 360 and a pixel 300 in the third modification of the tenth embodiment of the present technology. The clamp voltage generation circuit 360 of the first modification of the tenth embodiment is different from that of the first modification of the tenth embodiment in that a reference voltage generation unit 364 and a resistance element 367 are included instead of the current source transistor 362. The reference voltage generation unit 364 includes an operational amplifier 365 and an nMOS transistor 366. A temperature characteristic of the resistance element 367 is assumed to be the same as a temperature characteristic of the resistance element 361.

The nMOS transistor 366 and the resistance element 367 are connected together in series between the resistance element 361 and the reference voltage VRL lower than the power supply voltage VDDL. A voltage $V_{BGR}$ having no temperature characteristic is input to the non-inverting input terminal (+) of the operational amplifier 365. The voltage $V_{BGR}$ is generated by, for example, a band gap reference (BGR) circuit. Furthermore, the inverting input terminal (−) of the operational amplifier 365 is connected to a connection node between the nMOS transistor 366 and the resistance element 367. The output terminal of the operational amplifier 365 is connected to the gate of the nMOS transistor 366. Furthermore, a voltage of a connection node between the resistance element 361 and the nMOS transistor 366 is input to the operational amplifier 363 as the reference voltage Vref.

With a circuit configuration illustrated in the figure, a current Iref1 expressed by the following formula is generated and flows through the resistance element 361 and the resistance element 367.

$$Iref1 = V_{BGR}/R1 \qquad \text{Formula 4}$$

In the above formula, R1 is a resistance value of the resistance element 367, and the unit is, for example, ohm (Ω). The unit of the current Iref1 is, for example, ampere (A), and the unit of the voltage $V_{BGR}$ is, for example, volt (V).

On the basis of Formula 1, the reference voltage Vref is expressed by the following formula.

$$Vref = VDDL - R2 \times Iref1 = VDDL - V_{BGR} \times (R2/R1) \qquad \text{Formula 5}$$

In the above formula, R2 is a resistance value of the resistance element 361, and the unit is, for example, ohm (Ω).

Since the temperature characteristics of the resistance element 367 and the resistance element 361 are the same, a ratio of the resistance values thereof is a constant value regardless of the temperature characteristics thereof. For this reason, as illustrated in Formula 5, the reference voltage generation unit 364 generates the reference voltage Vref depending on the ratio of the resistance values of the resistance element 367 and the resistance element 361, whereby the influence of the temperature characteristic of the resistance value can be canceled.

Note that the third modification can also be applied to the clamp voltage generation circuit 360 and the pixel 300 illustrated in FIG. 20. In this case, it is only required to arrange the constant current source 371 instead of the pMOS transistor 373.

As described above, according to the third modification of the tenth embodiment of the present technology, since the reference voltage generation unit 364 generates the reference voltage Vref illustrated in Formula 5, the influence of the temperature characteristic of the resistance value can be canceled.

[Fourth Modification]

In the first modification of the tenth embodiment described above, the clamp voltage generation circuit 360 supplies a node on a loop of the negative feedback as the clamp voltage as it is, but in this configuration, frequency characteristics of the loop deteriorates due to an output load of the clamp voltage generation circuit 360. Here, the loop represents a path from the output terminal of the operational amplifier 363 to the internal circuit via the non-inverting input terminal (−). A solid-state imaging element 200 in a fourth modification of the tenth embodiment is different from that of the first modification of the tenth embodiment in that a voltage buffer is inserted between the output terminal of the operational amplifier 363 and the gate of the voltage limiting transistor 312.

Figure 27:
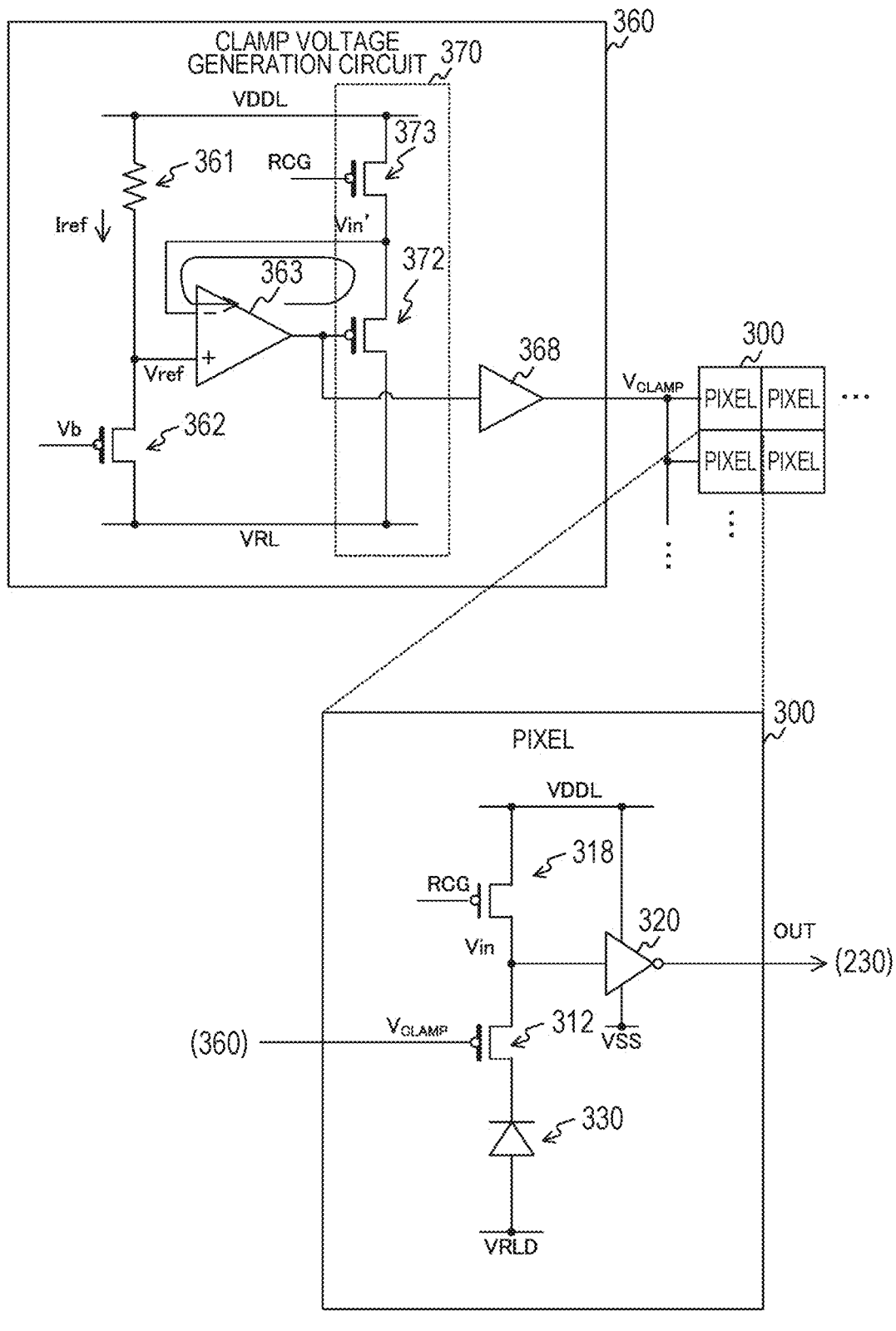
FIG. 27 is a circuit diagram illustrating a configuration example of a clamp voltage generation circuit and a pixel in a fourth modification of the tenth embodiment of the present technology.

FIG. 27 is a circuit diagram illustrating a configuration example of a clamp voltage generation circuit 360 and a pixel 300 in the fourth modification of the tenth embodiment of the present technology. The clamp voltage generation circuit 360 of the fourth modification of the tenth embodiment is different from that of the first modification of the tenth embodiment in that a voltage buffer 368 is further included.

The voltage buffer 368 is inserted between the output terminal of the operational amplifier 363 and the gate of the voltage limiting transistor 312 of each pixel. A gain of the voltage buffer 368 is preferably 0 decibel (That is, 1 time). Since the output load of the clamp voltage generation circuit 360 can be separated by insertion of the voltage buffer 368, deterioration of the frequency characteristics of the loop can be suppressed. Note that the voltage buffer 368 is an example of a first voltage buffer described in the claims.

Note that the fourth modification can also be applied to the clamp voltage generation circuit 360 and the pixel 300 illustrated in FIG. 20. The fourth modification can also be applied to the second modification and the third modification.

As described above, according to the fourth modification of the tenth embodiment of the present technology, since the voltage buffer 368 is inserted between the output terminal of the operational amplifier 363 and the gate of the voltage limiting transistor 312, it is possible to separate the output load and suppress deterioration of the frequency characteristics.

[Fifth Modification]

In the fourth modification of the tenth embodiment described above, the voltage buffer 368 is inserted, but the gain may deviate from 1 time due to product variation or the like. A solid-state imaging element 200 in a fifth modification of the tenth embodiment is different from that of the fourth modification of the tenth embodiment in that a voltage buffer is also inserted between the output terminal of the operational amplifier 363 and the gate of the pMOS transistor 372 to correct a gain error.

Figure 28:
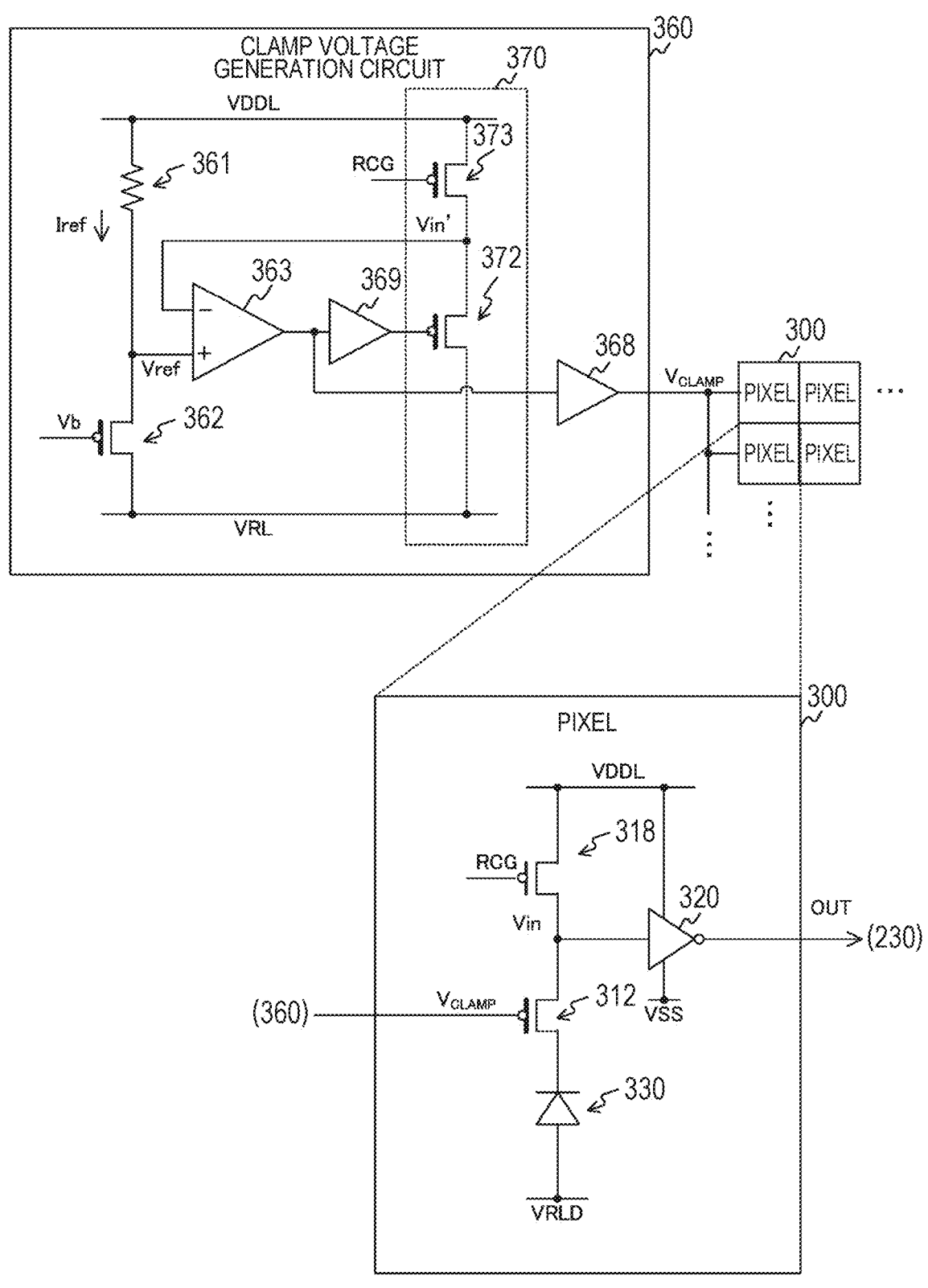
FIG. 28 is a circuit diagram illustrating a configuration example of a clamp voltage generation circuit and a pixel in a fifth modification of the tenth embodiment of the present technology.

FIG. 28 is a circuit diagram illustrating a configuration example of a clamp voltage generation circuit 360 and a pixel 300 in the fifth modification of the tenth embodiment of the present technology. The clamp voltage generation circuit 360 of the fifth modification of the tenth embodiment is different from that of the fourth modification of the tenth embodiment in that a voltage buffer 369 is further included.

The voltage buffer 369 is inserted between the output terminal of the operational amplifier 363 and the gate of the pMOS transistor 372 in the feedback unit 370. The voltage buffer 369 has the same characteristics as the voltage buffer 368. For this reason, in a case where there is an error in the gain of the voltage buffer 368, an equivalent error also occurs in a gain of the voltage buffer 369. With the insertion of the voltage buffer 369, variation of the clamp voltage due to the gain error of the voltage buffer 368 is corrected. Note that the voltage buffer 369 is an example of a second voltage buffer described in the claims.

Note that the fifth modification can also be applied to the clamp voltage generation circuit 360 and the pixel 300 illustrated in FIG. 20. The fifth modification can also be applied to the second modification and the third modification.

As described above, according to the fifth modification of the tenth embodiment of the present technology, since the voltage buffer 369 is inserted between the output terminal of the operational amplifier 363 and the feedback unit 370, it is possible to correct the variation of the clamp voltage due to the gain error of the voltage buffer 368.

[Sixth Modification]

In the fourth modification of the tenth embodiment described above, the voltage buffer 368 supplies the clamp voltage to all the pixels, but in this configuration, there is a possibility that the clamp voltage varies due to voltage variation generated in pixels in which the SPAD 330 reacts. A solid-state imaging element 200 in a sixth modification of the tenth embodiment is different from that of the fourth modification of the tenth embodiment in that the voltage buffer 368 is arranged for each row.

Figure 29:
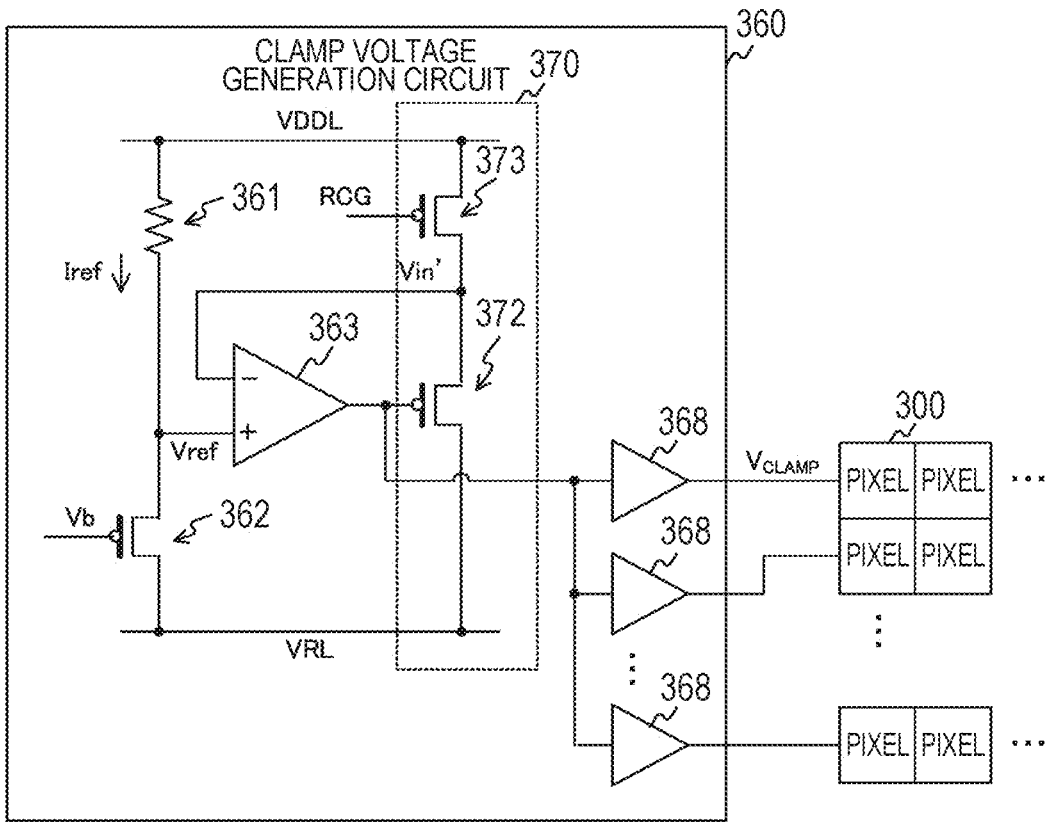
FIG. 29 is a circuit diagram illustrating a configuration example of a clamp voltage generation circuit in a sixth modification of the tenth embodiment of the present technology.

FIG. 29 is a circuit diagram illustrating a configuration example of a clamp voltage generation circuit 360 in the sixth modification of the tenth embodiment of the present technology. The clamp voltage generation circuit 360 of the sixth modification of the tenth embodiment is different from that of the fourth modification of the tenth embodiment in that the voltage buffer 368 is arranged for each row.

By arranging the voltage buffer 368 for each row, it is possible to suppress the influence of the voltage variation during the reaction of the SPAD 330 on the clamp voltage.

Note that the sixth modification can also be applied to the clamp voltage generation circuit 360 and the pixel 300 illustrated in FIG. 20. The sixth modification can also be applied to the third modification and the fifth modification.

As described above, according to the sixth modification of the tenth embodiment of the present technology, since the voltage buffer 368 is arranged for each row, it is possible to suppress the influence of the voltage variation during the reaction of the SPAD 330 on the clamp voltage.

[Seventh Modification]

In the first modification of the tenth embodiment described above, the circuits and elements in the solid-state imaging element 200 are arranged on a single semiconductor substrate, but in this configuration, there is a possibility that it is difficult to improve the sensitivity of the SPAD. A solid-state imaging element 200 according to a seventh modification of the tenth embodiment is different from that of the first modification of the tenth embodiment in that the circuits and elements are arranged on a plurality of stacked substrates.

Figure 30:
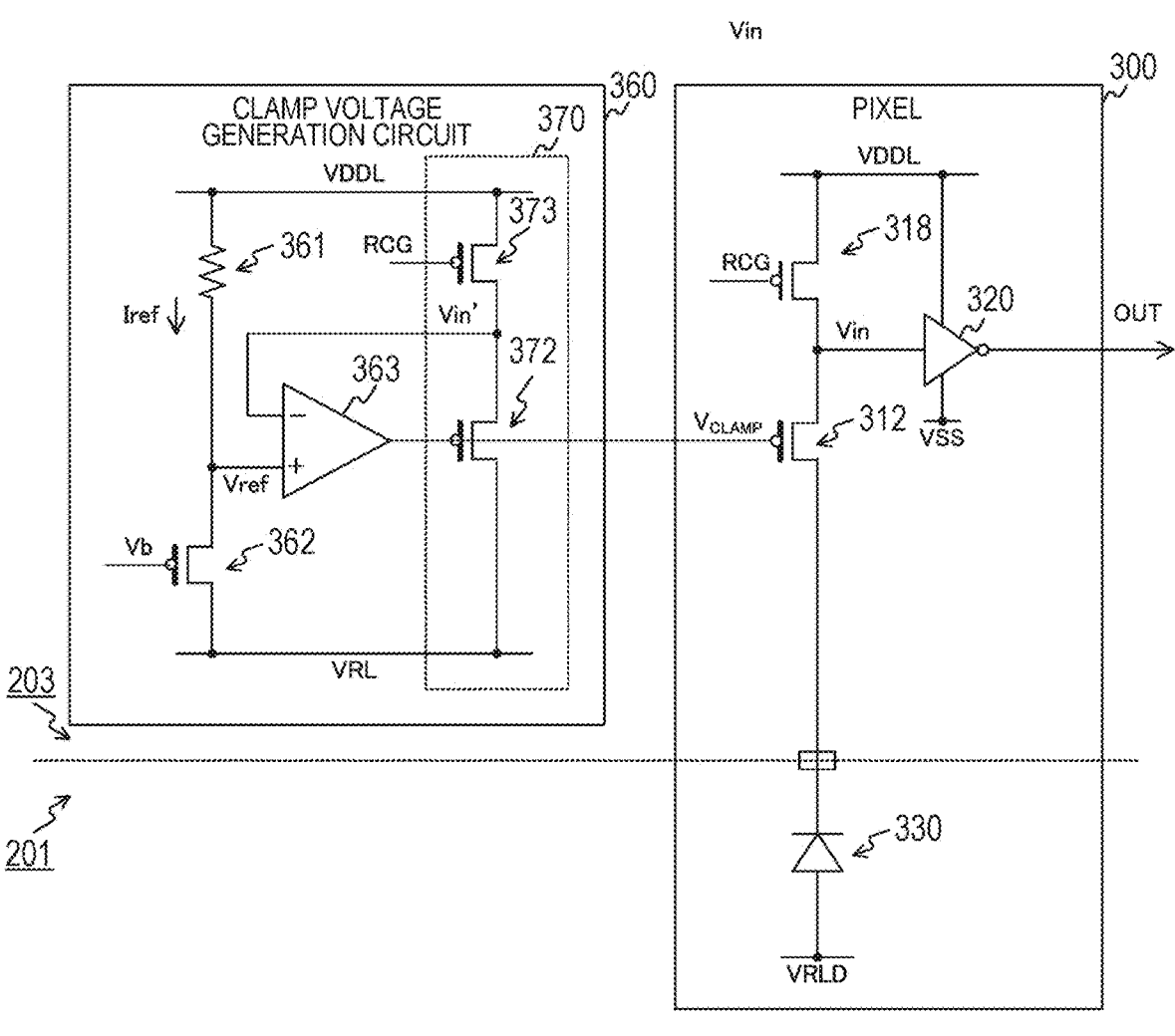
FIG. 30 is a circuit diagram illustrating a configuration example of a clamp voltage generation circuit and a pixel in a seventh modification of the tenth embodiment of the present technology.

FIG. 30 is a circuit diagram illustrating a configuration example of a clamp voltage generation circuit 360 and a pixel 300 in the seventh modification of the tenth embodiment of the present technology. The solid-state imaging element 200 of the seventh modification of the tenth embodiment includes the light receiving substrate 201 and the logic substrate 203 that are stacked, similarly to the eighth embodiment. The SPAD 330 is arranged on the light receiving substrate 201, and other circuits (the pMOS transistor 318, the clamp voltage generation circuit 360, and the like) are arranged on the logic substrate 203. By arranging only the SPAD 330 on the light receiving substrate 201 as described above, it is possible to increase the aperture ratio of the SPAD 330 and improve the sensitivity.

Note that the seventh modification can also be applied to the clamp voltage generation circuit 360 and the pixel 300 illustrated in FIG. 20. The seventh modification can also be applied to each of the second modification to the sixth modification.

As described above, according to the seventh modification of the tenth embodiment of the present technology, since the SPAD 330 is arranged on the light receiving substrate 201 and the other circuits are arranged on the logic substrate 203, the sensitivity of the SPAD 330 can be improved.

[Eighth Modification]

In the seventh modification of the tenth embodiment described above, only the SPAD 330 is arranged on the light receiving substrate 201, but it is also possible to further arrange a transistor on the light receiving substrate 201. A solid-state imaging element 200 in an eighth modification of the tenth embodiment is different from that of the seventh modification of the tenth embodiment in that a transistor is further arranged on the light receiving substrate 201.

Figure 31:
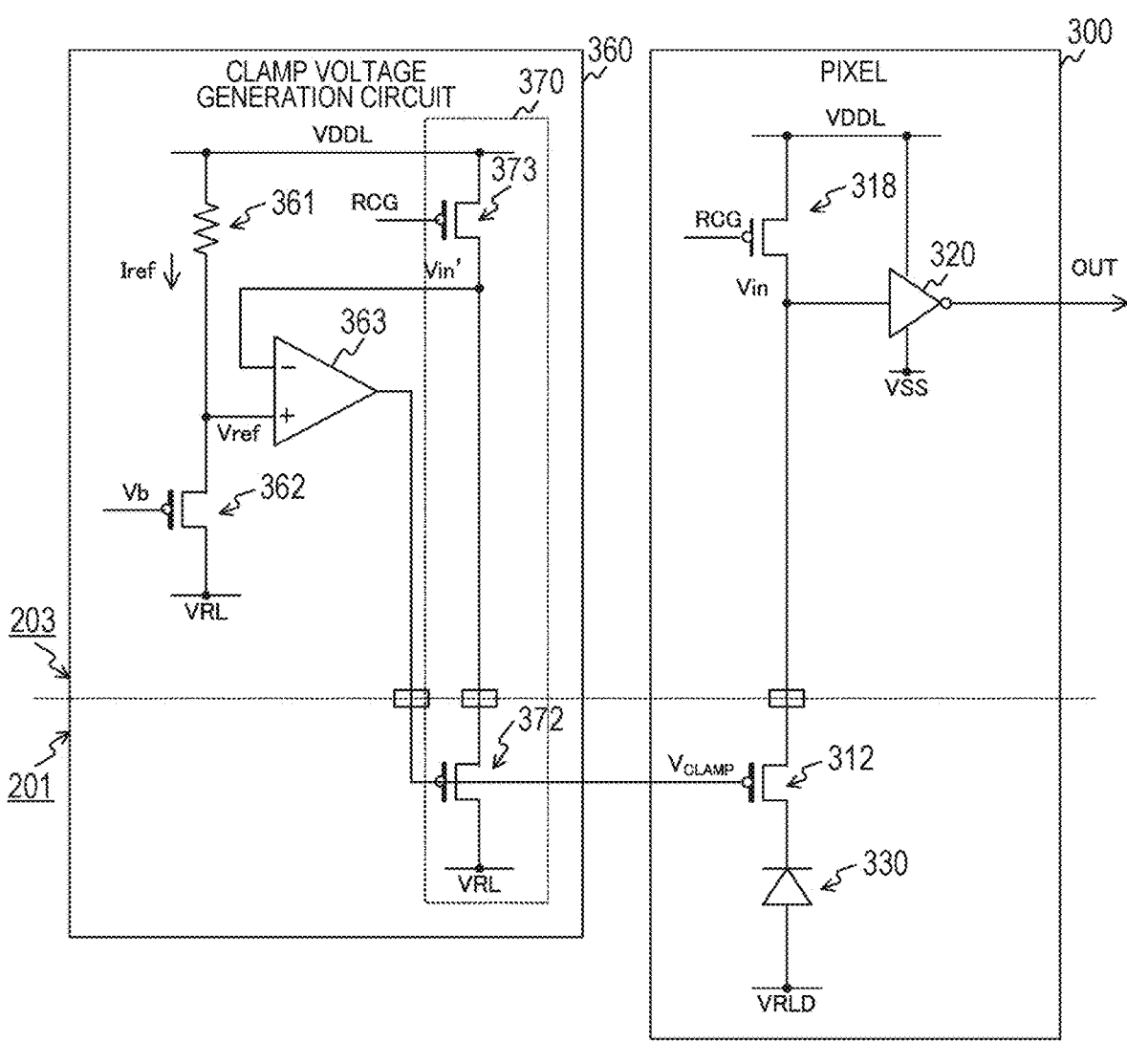
FIG. 31 is a circuit diagram illustrating a configuration example of a clamp voltage generation circuit and a pixel in an eighth modification of the tenth embodiment of the present technology.

FIG. 31 is a circuit diagram illustrating a configuration example of a clamp voltage generation circuit 360 and a pixel 300 in the eighth modification of the tenth embodiment of the present technology. In the eighth modification of the tenth embodiment, the voltage limiting transistor 312 in the pixel 300 and the pMOS transistor 372 in the clamp voltage generation circuit 360 are further arranged on the light receiving substrate 201. By further arranging the voltage limiting transistor 312 and the pMOS transistor 372 on the light receiving substrate 201, it is possible to reduce the number of elements of the logic substrate 203.

Note that the eighth modification can also be applied to the clamp voltage generation circuit 360 and the pixel 300 illustrated in FIG. 20. The eighth modification can also be applied to each of the second modification to the sixth modification.

As described above, according to the eighth modification of the tenth embodiment of the present technology, since the voltage limiting transistor 312 and the pMOS transistor 372 are further arranged on the light receiving substrate 201, the number of elements of the logic substrate 203 can be reduced.

[Ninth Modification]

In the tenth embodiment described above, an anode potential of the SPAD is constant, but in this configuration, there is a possibility that the excess bias vary due to an increase or decrease in an amount of light. A solid-state imaging element 200 in a ninth modification of the tenth embodiment is different from that of the tenth embodiment in that the anode potential is controlled depending on a potential sampled and held by a monitor pixel.

Figure 32:
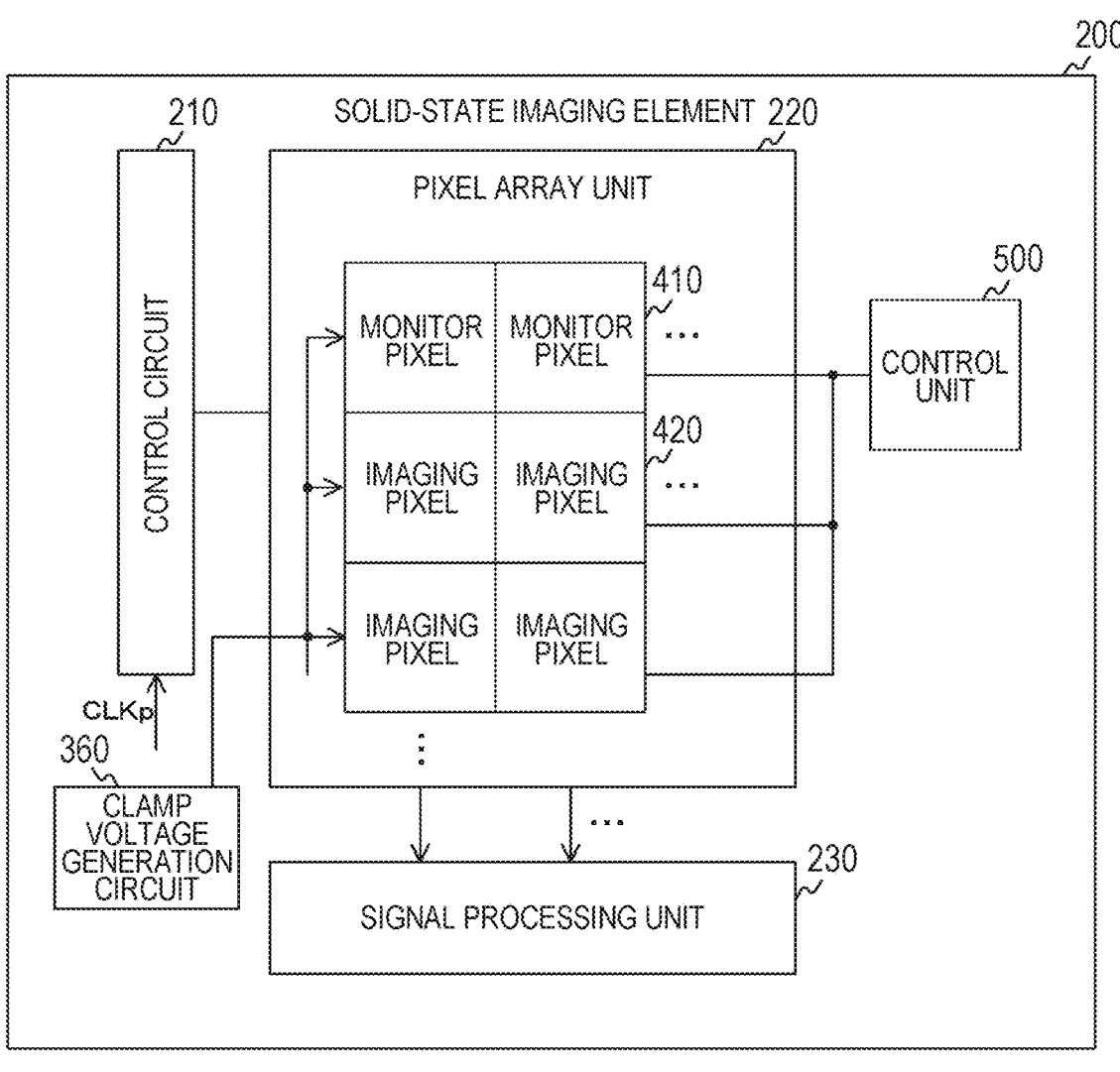
FIG. 32 is a block diagram illustrating a configuration example of a solid-state imaging element in a ninth modification of the tenth embodiment of the present technology.

FIG. 32 is a block diagram illustrating a configuration example of the solid-state imaging element 200 in the ninth modification of the tenth embodiment of the present technology. The solid-state imaging element 200 of the ninth modification of the tenth embodiment is different from that of the tenth embodiment in that a control unit 500 is further included and a plurality of monitor pixels 410 and a plurality of imaging pixels 420 are arranged in the pixel array unit 220.

Each monitor pixel 410 is a pixel for monitoring a potential of either the cathode or the anode (for example, the cathode) of the SPAD. Each imaging pixel 420 is a pixel that generates a pulse signal depending on input of a photon.

The control unit 500 controls a potential of either the cathode or the anode (for example, the anode) of the SPAD on the basis of the potential (cathode or the like) as a monitoring target of the monitor pixel.

Figure 33:
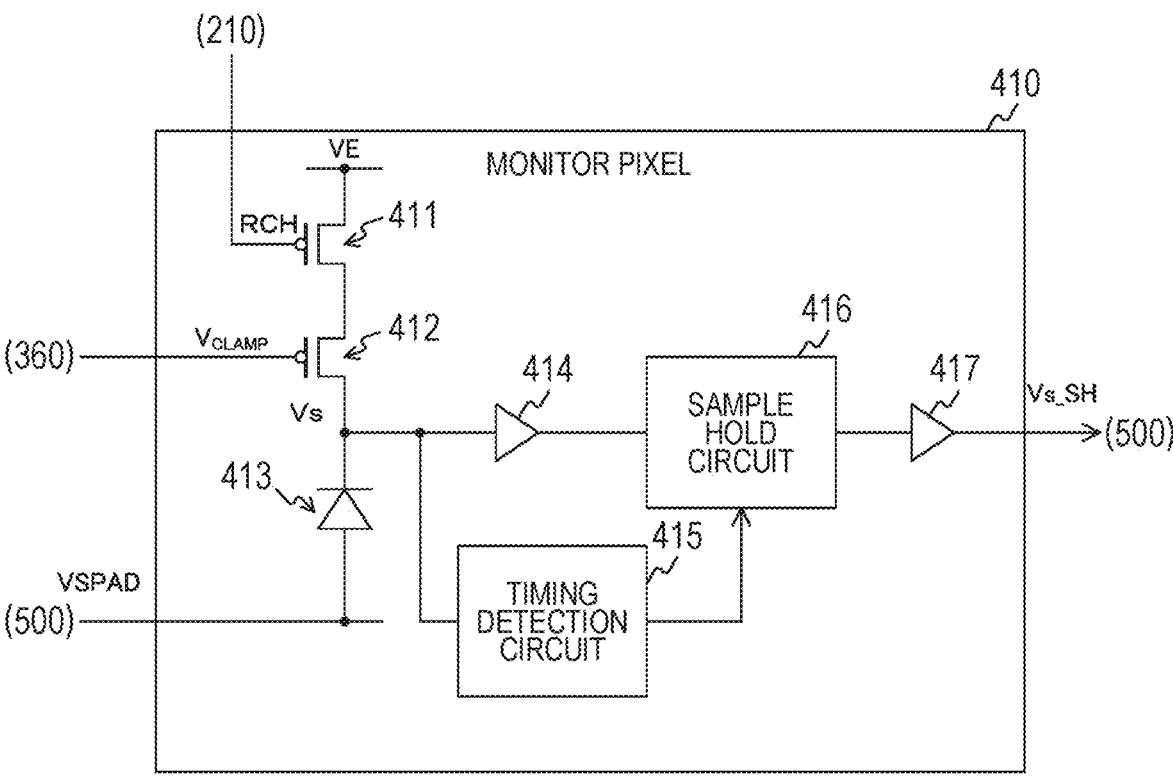
FIG. 33 is a circuit diagram illustrating a configuration example of a monitor pixel in the ninth modification of the tenth embodiment of the present technology.

FIG. 33 is a circuit diagram illustrating a configuration example of the monitor pixel 410 in the ninth modification of the tenth embodiment of the present technology. The monitor pixel 410 includes a pMOS transistor 411, a voltage limiting transistor 412, a SPAD 413, a timing detection circuit 415, a sample hold circuit 416, and voltage buffers 414 and 417.

The pMOS transistor 411, the voltage limiting transistor 412, and the SPAD 413 are connected together in series between a power supply potential VE and an anode potential VSPAD. Furthermore, a control signal RCH from the control circuit 210 is input to the gate of the pMOS transistor 411. When the control signal RCH at the low level is input, the pMOS transistor 411 supplies the power supply potential VE to a connection node between the voltage limiting transistor 312 and the SPAD 413.

The clamp voltage $V_{CLAMP}$ from the clamp voltage generation circuit 360 is applied to the gate of the voltage limiting transistor 412.

The SPAD 413 outputs a photocurrent by photoelectric conversion depending on incidence of a photon. A cathode potential Vs of the SPAD 413 corresponds to the potential as the monitoring target. On the other hand, the anode of the SPAD 413 is connected to the control unit 500, and the anode potential VSPAD is controlled by the control unit 500.

The voltage buffer 414 is inserted between a connection node between the SPAD 413 and the voltage limiting transistor 412 and the sample hold circuit 416.

The timing detection circuit 415 monitors the cathode potential Vs, and detects a timing at which a predetermined period elapses from when the potential Vs starts to drop with respect to the potential (that is, the power supply potential VE) supplied by the pMOS transistor 411. In a case where the cathode potential Vs is the monitoring target, the cathode potential Vs becomes lower than the power supply potential VE when a photocurrent flows depending on incidence of a photon. Note that the monitor pixel 410 can also monitor the anode potential. When the anode potential is monitored, a timing is detected at which a predetermined period elapses from when the anode potential starts to increase.

The sample hold circuit 416 takes in and holds the cathode potential Vs on the basis of the timing detected by the timing detection circuit 415. The sample hold circuit 416 outputs a held potential as a holding potential Vs_SH to the voltage buffer 417.

The voltage buffer 417 is inserted between the sample hold circuit 416 and the control unit 500. Note that the voltage buffer 417 is not necessarily required, it is also possible to have a configuration in which the voltage buffer 417 is not arranged. Furthermore, two or more voltage buffers 414 and 417 can also be arranged.

Figure 34:
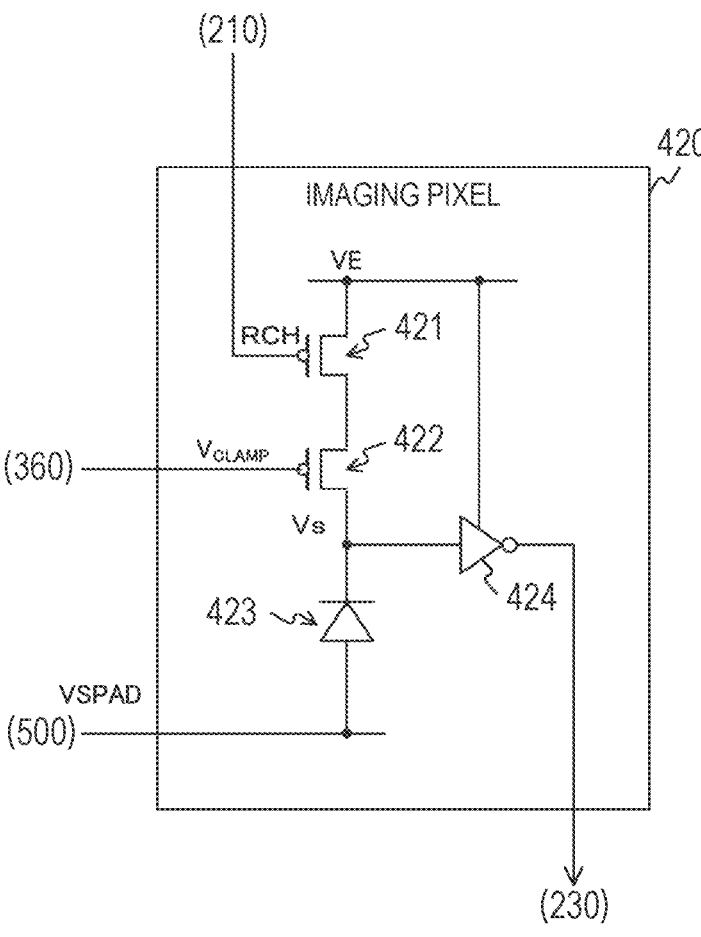
FIG. 34 is a circuit diagram illustrating a configuration example of an imaging pixel in the ninth modification of the tenth embodiment of the present technology.

FIG. 34 is a circuit diagram illustrating a configuration example of the imaging pixel 420 in the ninth modification of the tenth embodiment of the present technology. The imaging pixel 420 includes a pMOS transistor 421, a voltage limiting transistor 422, a SPAD 423, and an inverter 424.

A connection configuration of the pMOS transistor 421, the voltage limiting transistor 422, and the SPAD 423 is similar to that of the pMOS transistor 411, the voltage limiting transistor 412, and the SPAD 413 of the monitor pixel 410.

The inverter 424 inverts a signal of a cathode potential of the SPAD 423 and supplies the signal to the signal processing unit 230 as a pulse signal of the imaging pixel 420.

Figure 35:
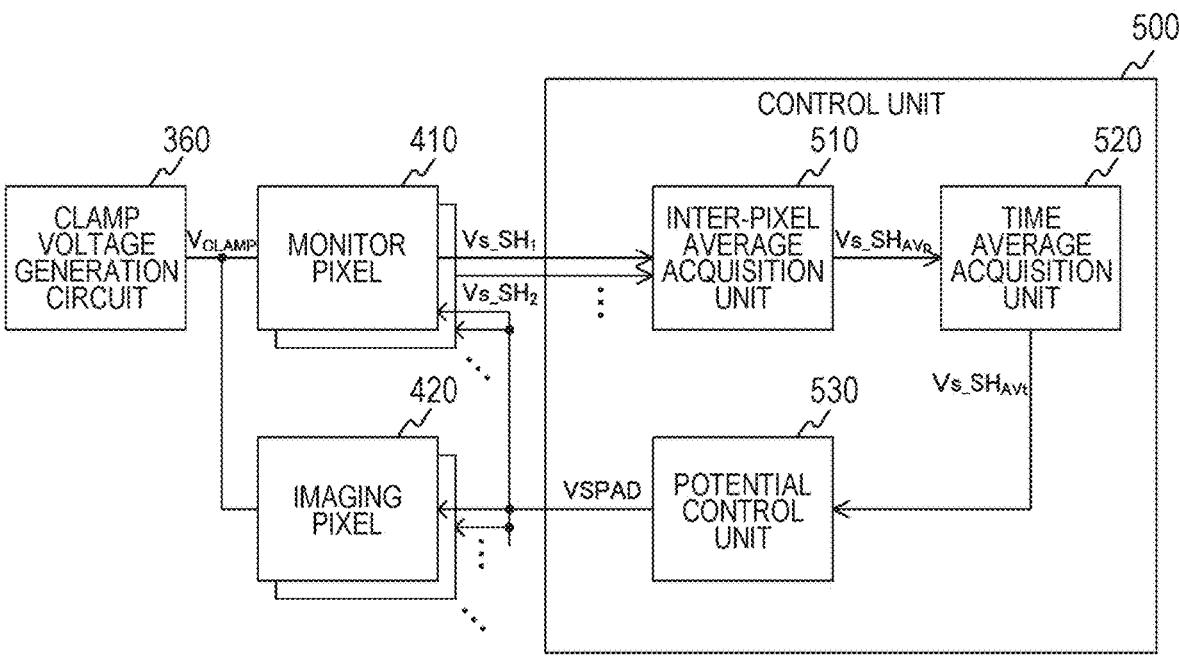
FIG. 35 is a circuit diagram illustrating a configuration example of a control unit in the ninth modification of the tenth embodiment of the present technology.

FIG. 35 is a circuit diagram illustrating a configuration example of the control unit 500 in the ninth modification of the tenth embodiment of the present technology. The control unit 500 includes an inter-pixel average acquisition unit 510, a time average acquisition unit 520, and a potential control unit 530.

Each of the plurality of monitor pixels 410 supplies the holding potential Vs_SH to the inter-pixel average acquisition unit 510. A holding potential of the m-th (m is an integer) monitor pixel 410 is defined as $Vs\_SH_m$.

The inter-pixel average acquisition unit 510 obtains an average of holding potentials $Vs\_SH_m$ of the respective plurality of monitor pixels 410 as an inter-pixel average $Vs\_SH_{AVp}$. The inter-pixel average acquisition unit 510 supplies the inter-pixel average $Vs\_SH_{AVp}$ to the time average acquisition unit 520. The time average acquisition unit 520 obtains a time average $Vs\_SH_{AVt}$ of the inter-pixel average $Vs\_SH_{AVp}$. The time average acquisition unit 520 supplies the time average $Vs\_SH_{AVt}$ to the potential control unit 530.

The potential control unit 530 controls the anode potential VSPAD to a lower potential as the time average $Vs\_SH_{AVt}$ of cathode potentials held is higher. All the anodes of the plurality of monitor pixels 410 and the plurality of imaging pixels 420 are commonly connected to the potential control unit 530, and the potential control unit 530 controls the potentials of these anodes. Note that, when the monitor pixel 410 monitors the anode potential, the cathode potential is controlled by the potential control unit 530.

Details of the circuits in the ninth modification of the tenth embodiment described above are described in, for example, Japanese Patent Application Laid-Open No. 2021-56016.

Note that the ninth modification can also be applied to the seventh modification and the eighth modification with the stacked structure.

As described above, according to the ninth modification of the tenth embodiment of the present technology, the control unit 500 controls the anode potential depending on the holding potential of the monitor pixel 410, whereby it is possible to suppress variation of the bias voltage caused by the increase or decrease in the amount of light.

[Tenth Modification]

In the first modification of the tenth embodiment described above, a pulse signal due to variation of the cathode potential of the SPAD is read, but a pulse signal due to variation of the anode potential of the SPAD can also be read. A solid-state imaging element 200 in a tenth modification of the tenth embodiment is different from that of the first modification of the tenth embodiment in that a pulse signal due to variation of the anode potential is read.

Figure 36:
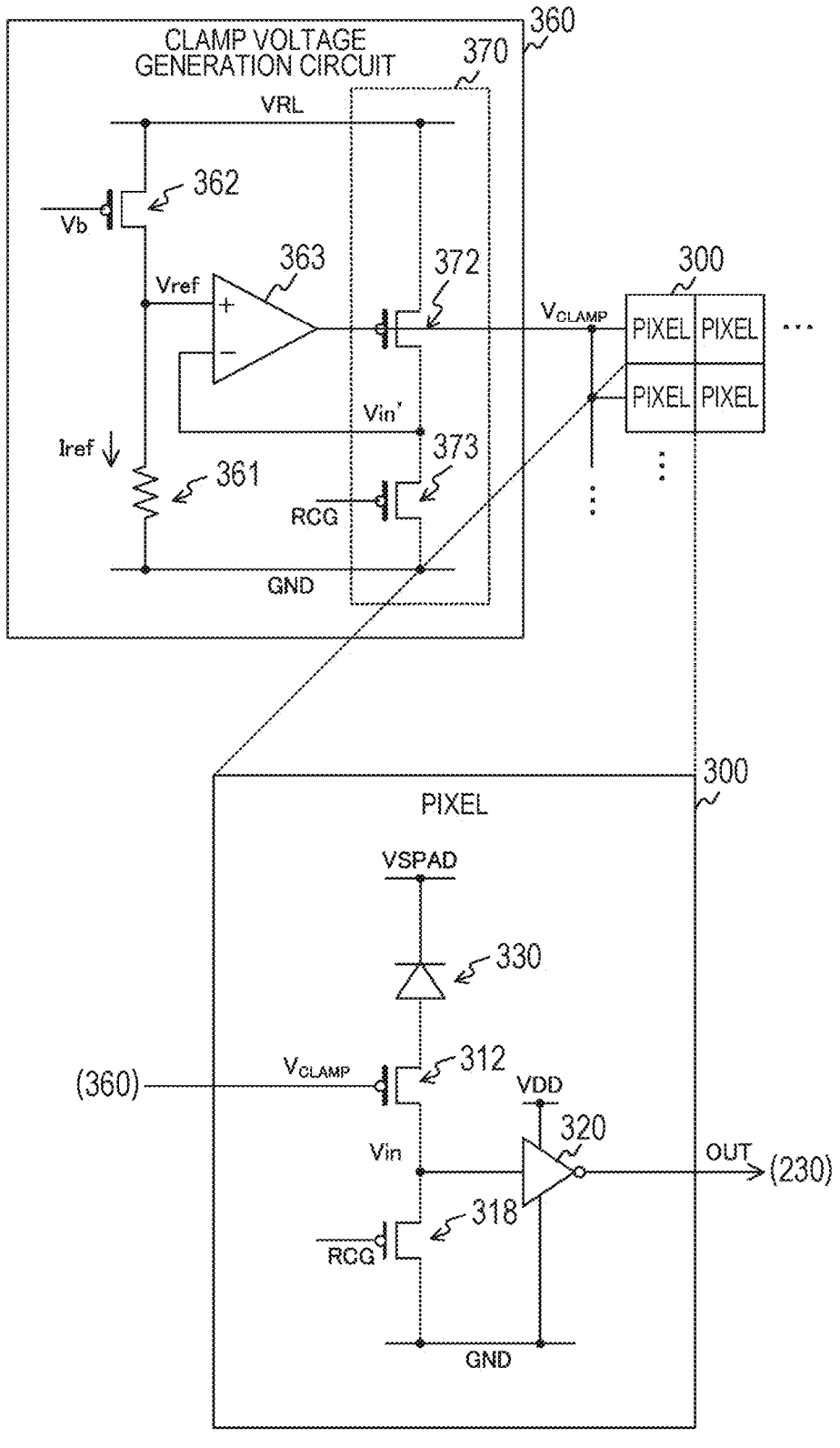
FIG. 36 is a circuit diagram illustrating a configuration example of a clamp voltage generation circuit and a pixel in a tenth modification of the tenth embodiment of the present technology.

FIG. 36 is a circuit diagram illustrating a configuration example of a clamp voltage generation circuit 360 and a pixel 300 in the tenth modification of the tenth embodiment of the present technology. In the tenth modification of the tenth embodiment, the pixel 300 outputs a pulse signal due to variation of the anode potential of the SPAD 330. Furthermore, in the clamp voltage generation circuit 360, the following formula is established instead of Formulas 1 and 2.

$$Vref = R \times Iref \qquad \text{Formula 6}$$

$$Vin' = Vref = R \times Iref \qquad \text{Formula 7}$$

In the above formula, Vin' represents a fixed value of an upper limit of the input voltage Vin.

From Formulas 7 and 3, the clamp voltage $V_{CLAMP}$ has a value depending on the ground voltage GND of approximately 0 volts. The input voltage Vin is increased from the ground voltage GND to the fixed value Vin'(=R×Iref) depending on incidence of a photon, and its amplitude is R×Iref regardless of variation of the ground voltage GND.

Note that the tenth modification can also be applied to the clamp voltage generation circuit 360 and the pixel 300 illustrated in FIG. 20. The tenth modification can also be applied to each of the second modification to the ninth modification.

As described above, according to the tenth modification of the tenth embodiment of the present technology, since the clamp voltage generation circuit 360 generates the clamp voltage depending on the ground voltage GND, the amplitude of the input voltage Vin can be made constant even if the ground voltage GND varies.

11. Application Example to Mobile Body

The technology according to the present disclosure (the present technology) can be applied to various products. The technology according to the present disclosure may be implemented as a device mounted on any type of mobile body, for example, a car, an electric car, a hybrid electric car, a motorcycle, a bicycle, a personal mobility, an airplane, a drone, a ship, a robot, or the like.

Figure 37:
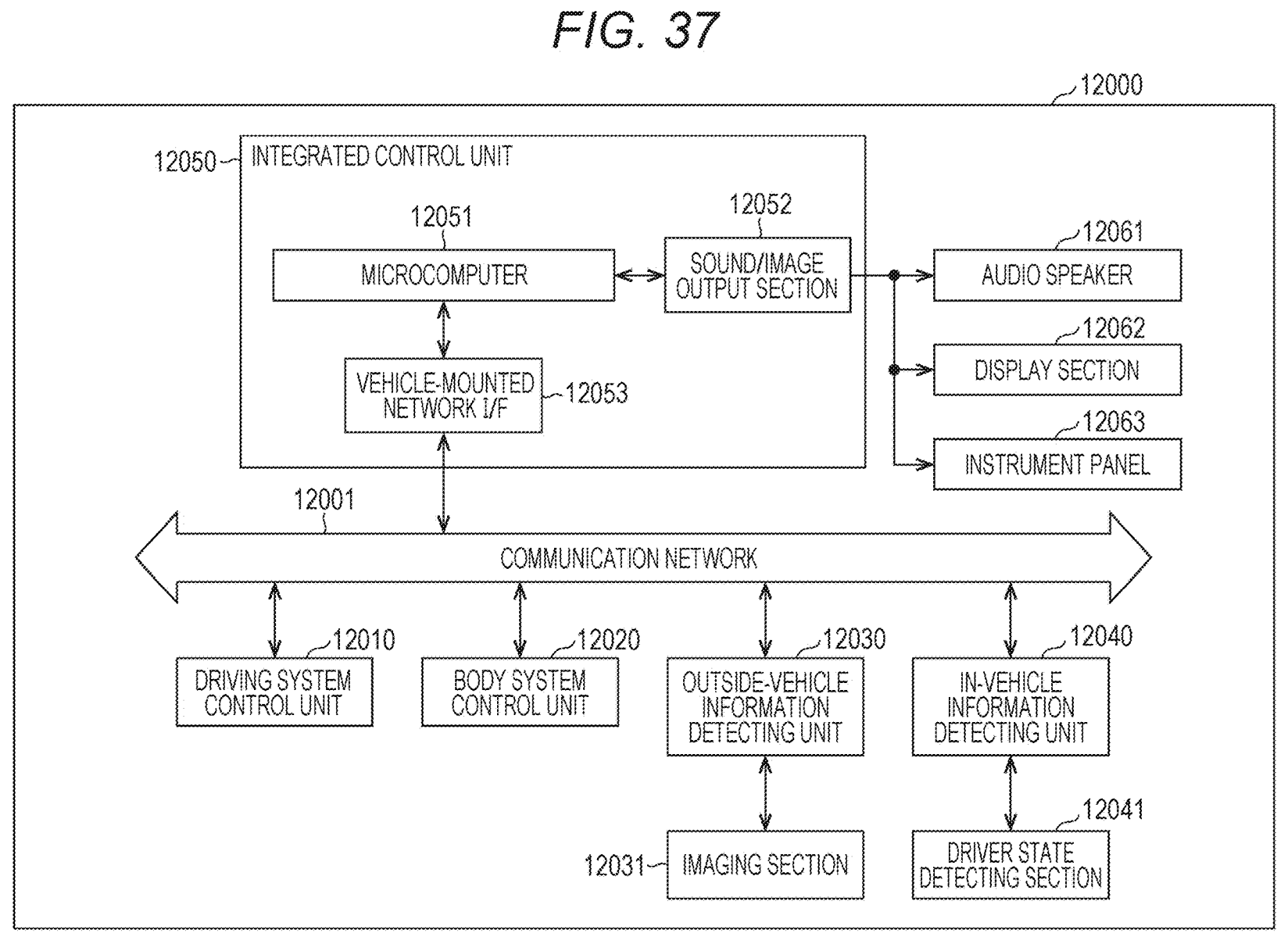

FIG. 37 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 37, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 37, an audio speaker 12061, a display section 12062, and an instrument panel 12063 are illustrated as output devices. The display section 12062 may, for example, include at least one of an on-board display and a head-up display.

Figure 38:
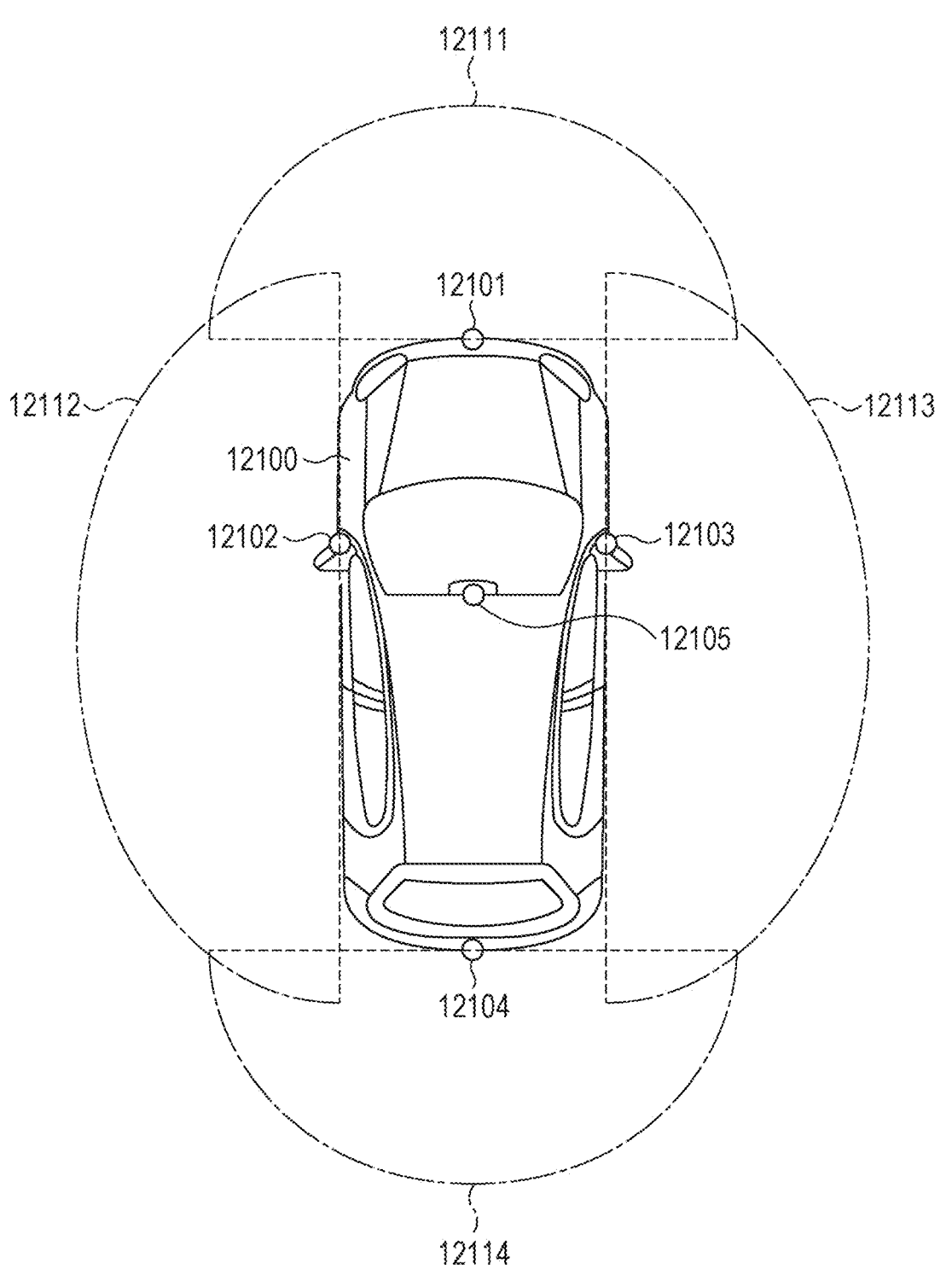
FIG. 38 is an explanatory diagram illustrating an example of installation positions of an imaging section.

FIG. 38 is a diagram illustrating an example of installation positions of the imaging section 12031.

In FIG. 38, as the imaging section 12031, imaging sections 12101, 12102, 12103, 12104, and 12105 are included.

The imaging sections 12101, 12102, 12103, 12104, and 12105 are provided at positions, for example, a front nose, sideview mirrors, a rear bumper, and a back door of the vehicle 12100, an upper portion of a windshield within the interior of the vehicle, and the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the sideview mirrors mainly obtain images of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 20 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the above, an example has been described of the vehicle control system to which the technology according to the present disclosure can be applied. The technology according to the present disclosure can be applied to, for example, the outside-vehicle information detecting unit 12030 among the components described above. Specifically, specifically, the distance measuring system 100 in FIG. 1 can be applied to the outside-vehicle information detecting unit 12030. By applying the technology according to the present disclosure to the outside-vehicle information detecting unit 12030, it is possible to improve distance measurement accuracy and enhance safety of the vehicle control system.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that, the present technology can also be configured as described below.

(1) A light detection device including:

an avalanche photodiode;

a logic gate that outputs an output signal on the basis of a result of comparison between an input voltage depending on a voltage of one terminal of a cathode or an anode of the avalanche photodiode and a predetermined threshold voltage;

a voltage limiting transistor that limits the input voltage;

a rapid charging transistor in which a film thickness of a gate oxide film is less than that of the voltage limiting transistor and that supplies a charging current to the avalanche photodiode in accordance with a predetermined pulse signal; and a pulse generation unit that generates the pulse signal on the basis of the output signal and supplies the pulse signal to the rapid charging transistor.

(2) The light detection device according to (1), in which the logic gate includes a pMOS transistor and an nMOS transistor connected together in series.

(3) The light detection device according to (2), in which in the rapid charging transistor, the film thickness of the gate oxide film is less than those of the pMOS transistor and the nMOS transistor.

(4) The light detection device according to (2), in which in the rapid charging transistor and the pMOS transistor, the film thickness of the gate oxide film is less than that of the nMOS transistor, the rapid charging transistor and the voltage limiting transistor are connected together in series between a predetermined power supply voltage and an input terminal of the logic gate, a gate of the pMOS transistor is connected to a connection node between the rapid charging transistor and the voltage limiting transistor, and a gate of the nMOS transistor is connected to a node of the input voltage.

(5) The light detection device according to any of (1) to (4), further including a forced quenching transistor that stops avalanche multiplication in the avalanche photodiode in accordance with a predetermined control signal.

(6) The light detection device according to any of (1) to (5), further including a constant current source, in which the rapid charging transistor and the voltage limiting transistor are connected together in series between a predetermined power supply voltage and an input terminal of the logic gate, and the constant current source is connected in parallel with the rapid charging transistor between the power supply voltage and the voltage limiting transistor.

(7) The light detection device according to any of (1) to (6), further including a resistance inserted between the one terminal and an input terminal of the logic gate.

(8) The light detection device according to any of (1) to (7), in which the one terminal is a cathode, and polarities of both the rapid charging transistor and the voltage limiting transistor are P-type.

(9) The light detection device according to any of (1) to (7), in which the one terminal is an anode, and polarities of both the rapid charging transistor and the voltage limiting transistor are N-type.

(10) The light detection device according to any of (1) to (9), in which the avalanche photodiode, the logic gate, the voltage limiting transistor, the rapid charging transistor, and the pulse generation unit are arranged in each of a plurality of pixels arranged in a two-dimensional lattice.

(11) The light detection device according to any of (1) to (10), in which the avalanche photodiode is arranged on a predetermined light receiving substrate, and the logic gate, the voltage limiting transistor, the rapid charging transistor, and the pulse generation unit are arranged on a predetermined logic substrate.

(12) The light detection device according to any of (1) to (9), in which the avalanche photodiode is arranged on a predetermined light receiving substrate, a transistor is arranged on a predetermined high withstand voltage substrate, the transistor having the gate oxide film thicker than that of the rapid charging transistor of a reading circuit in which the logic gate, the voltage limiting transistor, the rapid charging transistor, and the pulse generation unit are arranged, and the rest of the reading circuit is arranged on a predetermined logic substrate.

(13) The light detection device according to (1), further including:

a constant current source; and a clamp voltage generation circuit that supplies a clamp voltage depending on a predetermined voltage to a gate of the voltage limiting transistor, in which the rapid charging transistor and the voltage limiting transistor are connected together in series between the predetermined voltage and an input terminal of the logic gate, and the constant current source is connected in parallel with the rapid charging transistor between the predetermined voltage and the voltage limiting transistor.

(14) The light detection device according to (13), in which the clamp voltage generation circuit includes:

an operational amplifier that outputs, as the clamp voltage, a voltage depending on a difference between a predetermined reference voltage and a fixed value of a voltage of a connection node between the constant current source and the voltage limiting transistor; and a feedback unit that generates the fixed value from the output clamp voltage and feeds back the fixed value to the operational amplifier.

(15) The light detection device according to (14), in which the clamp voltage generation circuit further includes:

a current source transistor; and a resistance element inserted between the current source transistor and the predetermined voltage, and a voltage of a connection node between the resistance element and the current source transistor is input to the operational amplifier as the reference voltage.

(16) The light detection device according to (14), in which the clamp voltage generation circuit further includes:

a pair of resistance elements; and a reference voltage generation unit that generates, as the reference voltage, a voltage depending on a ratio between resistivities of the respective pair of resistance elements.

(17) The light detection device according to any of (13) to (16), in which the clamp voltage generation circuit further includes:

an operational amplifier that outputs an output voltage depending on a difference between a predetermined reference voltage and a fixed value of a voltage of a connection node between the constant current source and the voltage limiting transistor;

a feedback unit that generates the fixed value from the output voltage and feeds back the fixed value to the operational amplifier; and a first voltage buffer inserted between an output terminal of the operational amplifier and the gate of the voltage limiting transistor.

(18) The light detection device according to (17), in which the clamp voltage generation circuit further includes a second buffer inserted between the output terminal of the operational amplifier and the feedback unit.

(19) A distance measuring system including:

an avalanche photodiode;

a logic gate that outputs an output signal on the basis of a result of comparison between an input voltage depending on a voltage of one terminal of a cathode or an anode of the avalanche photodiode and a predetermined threshold voltage;

a voltage limiting transistor that limits the input voltage;

a rapid charging transistor in which a film thickness of a gate oxide film is less than that of the voltage limiting transistor and that supplies a charging current to the avalanche photodiode in accordance with a predetermined pulse signal;

a pulse generation unit that generates the pulse signal on the basis of the output signal and supplies the pulse signal to the rapid charging transistor; and a signal processing unit that processes the output signal.

(20) A light detection device including:

an avalanche photodiode;

a logic gate that is connected to a first terminal that is one terminal of a cathode or an anode of the avalanche photodiode and outputs an output signal;

a pulse generation unit that generates a predetermined pulse signal on the basis of the output signal;

a first transistor connected to the first terminal; and a second transistor in which a film thickness of a gate oxide film is less than that of the first transistor and a gate receives the pulse signal, in which the first transistor and the second transistor are connected together in series between the first terminal and a predetermined fixed potential.

REFERENCE SIGNS LIST

100 Distance measuring system
110 Light emitting source
120 Timing generation unit
200 Solid-state imaging element
201 Light receiving substrate
202 High withstand voltage substrate
203 Logic substrate
210 Control circuit
220 Pixel array unit
230 Signal processing unit
231 TDC
232 Distance calculation unit
300 Pixel
310 Reading circuit
311, 351 Rapid charging transistor
312, 352, 412, 422 Voltage limiting transistor
313, 353 Pulse generation unit
314 Standby switch
315 Forced quenching transistor
316, 371 Constant current source
317 Resistance
318 pMOS transistor 320, 340, 424 Inverter
321, 341, 372, 373, 411, 421 pMOS transistor
322, 342, 366 nMOS transistor
330, 413, 423 SPAD
360 Clamp voltage generation circuit
361, 367 Resistance element
362 Current source transistor
363, 365 Operational amplifier
364 Reference voltage generation unit
368, 369, 414, 417 Voltage buffer
370 Feedback unit
410 Monitor pixel
415 Timing detection circuit
416 Sample hold circuit
420 Imaging pixel
500 Control unit
510 Inter-pixel average acquisition unit
520 Time average acquisition unit
530 Potential control unit
12030 Outside-vehicle information detecting unit

The invention claimed is:

1. A light detection device, comprising:

an avalanche photodiode;

a logic gate configured to output an output signal on a basis of a result of comparison between an input voltage depending on a voltage of one terminal of a cathode or an anode of the avalanche photodiode and a predetermined threshold voltage;

a voltage limiting transistor configured to limit the input voltage;

a rapid charging transistor in which a film thickness of a gate oxide film is less than that of the voltage limiting transistor, wherein the rapid charging transistor is configured to supply a charging current to the avalanche photodiode in accordance with a predetermined pulse signal; and a pulse generation unit configured to:

generate the predetermined pulse signal on a basis of the output signal; and supply the predetermined pulse signal to the rapid charging transistor.

2. The light detection device according to claim 1, wherein the logic gate includes a pMOS transistor and an nMOS transistor connected together in series.

3. The light detection device according to claim 2, wherein in the rapid charging transistor, the film thickness of the gate oxide film is less than those of the pMOS transistor and the nMOS transistor.

4. The light detection device according to claim 2, wherein in the rapid charging transistor and the pMOS transistor, the film thickness of the gate oxide film is less than that of the nMOS transistor, the rapid charging transistor and the voltage limiting transistor are connected together in series between a predetermined power supply voltage and an input terminal of the logic gate, a gate of the pMOS transistor is connected to a connection node between the rapid charging transistor and the voltage limiting transistor, and a gate of the nMOS transistor is connected to a node of the input voltage.

5. The light detection device according to claim 1, further comprising a forced quenching transistor configured to stop avalanche multiplication in the avalanche photodiode in accordance with a predetermined control signal.

6. The light detection device according to claim 1, further comprising a constant current source, wherein the rapid charging transistor and the voltage limiting transistor are connected together in series between a predetermined power supply voltage and an input terminal of the logic gate, and the constant current source is connected in parallel with the rapid charging transistor between the predetermined power supply voltage and the voltage limiting transistor.

7. The light detection device according to claim 1, further comprising a resistance inserted between the one terminal and an input terminal of the logic gate.

8. The light detection device according to claim 1, wherein the one terminal is the cathode, and polarities of both the rapid charging transistor and the voltage limiting transistor are P-type.

9. The light detection device according to claim 1, wherein the one terminal is the anode, and polarities of both the rapid charging transistor and the voltage limiting transistor are N-type.

10. The light detection device according to claim 1, wherein the avalanche photodiode, the logic gate, the voltage limiting transistor, the rapid charging transistor, and the pulse generation unit are arranged in each of a plurality of pixels arranged in a two-dimensional lattice.

11. The light detection device according to claim 1, wherein the avalanche photodiode is arranged on a predetermined light receiving substrate, and the logic gate, the voltage limiting transistor, the rapid charging transistor, and the pulse generation unit are arranged on a predetermined logic substrate.

12. The light detection device according to claim 1, wherein the avalanche photodiode is arranged on a predetermined light receiving substrate, a transistor is arranged on a predetermined high withstand voltage substrate, the transistor having the gate oxide film thicker than that of the rapid charging transistor of a reading circuit in which the logic gate, the voltage limiting transistor, the rapid charging transistor, and the pulse generation unit are arranged, and rest of the reading circuit is arranged on a predetermined logic substrate.

13. The light detection device according to claim 1, further comprising:

a constant current source; and a clamp voltage generation circuit configured to supply a clamp voltage depending on a predetermined voltage to a gate of the voltage limiting transistor, wherein the rapid charging transistor and the voltage limiting transistor are connected together in series between the predetermined voltage and an input terminal of the logic gate, and the constant current source is connected in parallel with the rapid charging transistor between the predetermined voltage and the voltage limiting transistor.

14. The light detection device according to claim 13, wherein the clamp voltage generation circuit includes:

an operational amplifier configured to output, as the clamp voltage, a voltage depending on a difference between a predetermined reference voltage and a fixed value of a voltage of a connection node between the constant current source and the voltage limiting transistor; and a feedback unit configured to generate the fixed value from the output clamp voltage; and feed back the fixed value to the operational amplifier.

15. The light detection device according to claim 14, wherein the clamp voltage generation circuit further includes:

a current source transistor; and a resistance element inserted between the current source transistor and the predetermined voltage, and a voltage of a connection node between the resistance element and the current source transistor is input to the operational amplifier as the predetermined reference voltage.

16. The light detection device according to claim 14, wherein the clamp voltage generation circuit further includes:

a pair of resistance elements; and a reference voltage generation unit configured to generate, as the predetermined reference voltage, a voltage depending on a ratio between resistivities of the respective pair of resistance elements.

17. The light detection device according to claim 13, wherein the clamp voltage generation circuit further includes:

an operational amplifier configured to output an output voltage depending on a difference between a predetermined reference voltage and a fixed value of a voltage of a connection node between the constant current source and the voltage limiting transistor;

a feedback unit configured to:

generate the fixed value from the output voltage; and feed back the fixed value to the operational amplifier; and a first voltage buffer inserted between an output terminal of the operational amplifier and the gate of the voltage limiting transistor.

18. The light detection device according to claim 17, wherein the clamp voltage generation circuit further includes a second buffer inserted between the output terminal of the operational amplifier and the feedback unit.

19. A distance measuring system, comprising:

an avalanche photodiode;

a logic gate configured to output an output signal on a basis of a result of comparison between an input voltage depending on a voltage of one terminal of a cathode or an anode of the avalanche photodiode and a predetermined threshold voltage;

a voltage limiting transistor configured to limit the input voltage;

a rapid charging transistor in which a film thickness of a gate oxide film is less than that of the voltage limiting transistor, wherein the rapid charging transistor is conifgured to supply a charging current to the avalanche photodiode in accordance with a predetermined pulse signal;

a pulse generation unit configured to:

generate the predetermined pulse signal on a basis of the output signal; and supply the predetermined pulse signal to the rapid charging transistor; and a signal processing unit configured to process the output signal.

20. A light detection device, comprising:

an avalanche photodiode;

a logic gate that is connected to a first terminal that is one terminal of a cathode or an anode of the avalanche photodiode, wherein the logic gate is configured to output an output signal;

a pulse generation unit configured to generate a predetermined pulse signal on a basis of the output signal;

a first transistor connected to the first terminal; and a second transistor in which a film thickness of a gate oxide film is less than that of the first transistor and a gate receives the predetermined pulse signal, wherein the first transistor and the second transistor are connected together in series between the first terminal and a predetermined fixed potential.

\* \* \* \* \*